United States Patent [19]
Shen et al.

(10) Patent No.: US 7,657,822 B2
(45) Date of Patent: Feb. 2, 2010

(54) TRUE BIT LEVEL DECODING OF TTCM (TURBO TRELLIS CODE MODULATION) OF VARIABLE RATES AND SIGNAL CONSTELLATIONS

(75) Inventors: Ba-Zhong Shen, Irvine, CA (US); Kelly Brian Cameron, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 766 days.

(21) Appl. No.: 10/429,362

(22) Filed: May 1, 2003

(65) Prior Publication Data

US 2003/0226096 A1   Dec. 4, 2003

Related U.S. Application Data

(60) Provisional application No. 60/384,698, filed on May 31, 2002, provisional application No. 60/427,979, filed on Nov. 20, 2002, provisional application No. 60/459,132, filed on Mar. 31, 2003.

(51) Int. Cl.
 *H03M 13/25* (2006.01)
 *H03M 13/29* (2006.01)
(52) U.S. Cl. ............... 714/776; 714/780; 714/792; 375/265
(58) Field of Classification Search ............... 714/776, 714/780, 792, 796; 375/262, 264, 265
 See application file for complete search history.

(56) References Cited

U.S. PATENT DOCUMENTS

| 4,807,253 | A | * | 2/1989 | Hagenauer et al. ......... 375/284 |
| 5,406,570 | A | | 4/1995 | Berrou et al. |
| 5,446,747 | A | | 8/1995 | Berrou |
| 5,563,897 | A | | 10/1996 | Pyndiah et al. |

(Continued)

FOREIGN PATENT DOCUMENTS

EP   0 735 696 A2   10/1996

(Continued)

OTHER PUBLICATIONS

Le Goff et al., "Turbo-Codes and High Spectral Efficiency Modulation", IEEE SUPERCOM/ICC '94, May 1984, pp. 645-649.*

(Continued)

*Primary Examiner*—Stephen M Baker
(74) *Attorney, Agent, or Firm*—Garlick Harrison & Markison; Shayne X. Short

(57) ABSTRACT

True bit level decoding of TTCM (Turbo Trellis Coded Modulation) of variable rates and signal constellations. A decoding approach is presented that allows for decoding on a bit level basis that allows for discrimination of the individual bits of a symbol. Whereas prior art approaches typically perform decoding on a symbol level basis, this decoding approach allows for an improved approach in which the hard decisions/best estimates may be made individually for each of the individual bits of an information symbol. In addition, the decoding approach allows for a reduction in the total number of calculations that need to be performed as well as the total number of values that need to be stored during the iterative decoding. The bit level decoding approach is also able to decode a signal whose code rate and/or signal constellation type (and mapping) may vary on a symbol by symbol basis.

105 Claims, 31 Drawing Sheets alternative TTCM decoder system that recycles single SISO (shown as receiving I,Q inputs)

U.S. PATENT DOCUMENTS

| | | | | |
|---|---|---|---|---|
| 5,577,068 | A * | 11/1996 | Bottomley et al. | 375/232 |
| 5,790,595 | A * | 8/1998 | Benthin et al. | 375/224 |
| 5,867,538 | A * | 2/1999 | Liu | 375/341 |
| 6,065,147 | A | 5/2000 | Pyndiah et al. | |
| 6,119,264 | A | 9/2000 | Berrou et al. | |
| 6,122,763 | A * | 9/2000 | Pyndiah et al. | 714/755 |
| 6,131,180 | A * | 10/2000 | Ramesh | 714/790 |
| 6,138,260 | A * | 10/2000 | Ketseoglou | 714/751 |
| 6,324,224 | B1 * | 11/2001 | Ikeda | 375/341 |
| 6,381,727 | B1 * | 4/2002 | Ikeda | 714/780 |
| 6,396,871 | B1 * | 5/2002 | Gelblum et al. | 375/222 |
| 6,480,552 | B1 * | 11/2002 | Tonello | 375/341 |
| 6,484,283 | B2 * | 11/2002 | Stephen et al. | 714/786 |
| 6,516,437 | B1 * | 2/2003 | Van Stralen et al. | 714/755 |
| 6,529,559 | B2 * | 3/2003 | Reshef | 375/262 |
| 6,567,481 | B1 * | 5/2003 | Molnar | 375/341 |
| 6,594,318 | B1 * | 7/2003 | Sindhushayana | 375/262 |
| 6,625,236 | B1 * | 9/2003 | Dent et al. | 375/341 |
| 6,658,071 | B1 * | 12/2003 | Cheng | 375/341 |
| 6,697,441 | B1 * | 2/2004 | Bottomley et al. | 375/340 |
| 6,731,696 | B1 * | 5/2004 | Gelblum et al. | 375/322 |
| 6,760,390 | B1 * | 7/2004 | Desai et al. | 375/341 |
| 6,785,861 | B2 * | 8/2004 | Scalise et al. | 714/786 |
| 6,798,852 | B2 * | 9/2004 | Khayrallah et al. | 375/341 |
| 6,807,238 | B1 * | 10/2004 | Rhee et al. | 375/340 |
| 6,885,711 | B2 * | 4/2005 | Shiu et al. | 375/340 |
| 6,903,665 | B2 * | 6/2005 | Akhter et al. | 341/50 |
| 6,904,097 | B2 * | 6/2005 | Agami et al. | 375/261 |
| 6,907,084 | B2 * | 6/2005 | Jeong | 375/261 |
| 6,922,438 | B1 * | 7/2005 | Eidson | 375/224 |
| 6,934,317 | B1 * | 8/2005 | Dent | 375/140 |
| 6,961,388 | B2 * | 11/2005 | Ling et al. | 375/267 |
| 6,973,615 | B1 * | 12/2005 | Arad et al. | 714/792 |
| 7,032,164 | B2 * | 4/2006 | Cameron et al. | 714/792 |
| 2002/0131515 | A1 * | 9/2002 | Rodriguez | 375/262 |
| 2002/0136318 | A1 * | 9/2002 | Gorokhov et al. | 375/261 |

FOREIGN PATENT DOCUMENTS

| | | |
|---|---|---|
| EP | 0 735 696 A3 | 1/1999 |
| FR | 91 05278 A1 | 10/1992 |

OTHER PUBLICATIONS

Pyndiah et al., "Performance of Block Turbo Coded 16-QAM and 64-QAM Modulations", IEEE GLOBECOM '95, Nov. 1995, pp. 1039-1043.*

Fagervik et al., "Low Complexity Bit by Bit Soft Output Demodulator", Electronics Letters, May 23, 1996, pp. 985-987.*

Lauer et al., "Turbo Coding for Discrete Multitone Transmission Systems", IEEE GLOBECOM'98, Nov. 1998, pp. 3256-3260.*

Li et al., "Trellis-Coded Modulation with Bit Interleaving and Iterative Decoding", IEEE Journal on Selected Areas in Communications, vol. 17, No. 4, Apr. 1999, pp. 715-724.*

Zhang et al., "Turbo Coding for Transmission over ADSL", WCC-ICCT 2000, Aug. 2000, pp. 124-131.*

Ormecci et al., "Adaptive Bit-Interleaved Coded Modulation", IEEE Transactions on Communications, vol. 49, No. 9, Sep. 2001.*

Onggosanusi et al., Turbo Trellis-Coded Modulation with Time Varying Mixed Mapping, IEEE VTC 2001, Oct. 2001, pp. 2409-2413.*

Olivieri et al., "Dynamic Bit-Interleaved Turbo-Coded Modulation for Unequal Error Protection", GLOBECOM '01, Nov. 2001, pp. 3267-3271.*

Li et al., "A New Turbo Coded QAM Scheme with Very Low Decoding Complexity for ADSL System", GLOBECOM '01, Nov. 2001, pp. 349-353.*

Aik Chindapol and James A. Ritcey, "Design, Analysis, and Performance Evaluations for BICM-ID with Square QAM Constellations in Rayleigh Fading Channels," IEEE Journal on Selected Areas in Communications, vol. 19, No. 5, May 2001, pp. 944-957.

Xiaodong Li and James A. Ritcey, "Trellis-Coded Modulation with Bit Interleaving and Iterative Decoding," IEEE Journal on Selected Areas in Communications, vol. 17, No. 4, Apr. 1999, pp. 715-724.

Sergio Benedetto and Dariush Divsalar, "Turbo Codes: Performance Analysis, Design and Iterative Decoding," Globecom '97, Nov. 4, Phoenix, AZ, cover page and pp. 43-53(12 pages total).

A. Raghupathy, K. J. Ray Liu, "A transformation for computational latency reduction in turbo-Map decoding," Circuits and Systems, 1999. ISCAS apos;99. Proceedings of the 1999 IEEE International Symposium on, vol. 4, Jul. 1999 pp. 402-405 vol. 4.

Patrick Robertson, Emmanuelle Villebrun, and Peter Hoeher, "A Comparison of Optimal and Sub-Optimal Map Decoding Algorithms Operating in the Log Domain," 1995 IEEE International Conference on Communications, Gateway to Globalization, Seattle 1995, Proceedings of the International Conference on Communications (ICC), vol. 2, Jun. 18-22, 1995, pp. 1009-1013.

J. Chen, A. Dholakia, E. Eleftheriou, M. Fossorier, X.-Y. Hu, "Near Optimal Reduced-Complexity Decoding Algorithms for LDPC Codes," 2002 IEEE International Symposium on Information Theory (ISIT 2002), Lausanne, Switzerland, Jun. 30-Jul. 5, 2002, p. 455.

* cited by examiner

HDTV (High Definition Television) communication system uni-directional cellular communication system uni-directional cellular communication system bi-directional cellular communication system uni-directional microwave communication system bi-directional microwave communication system

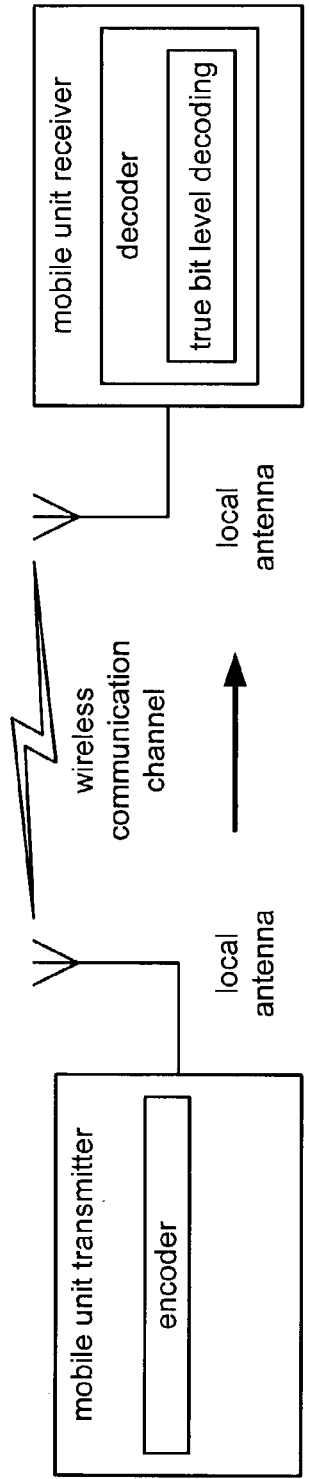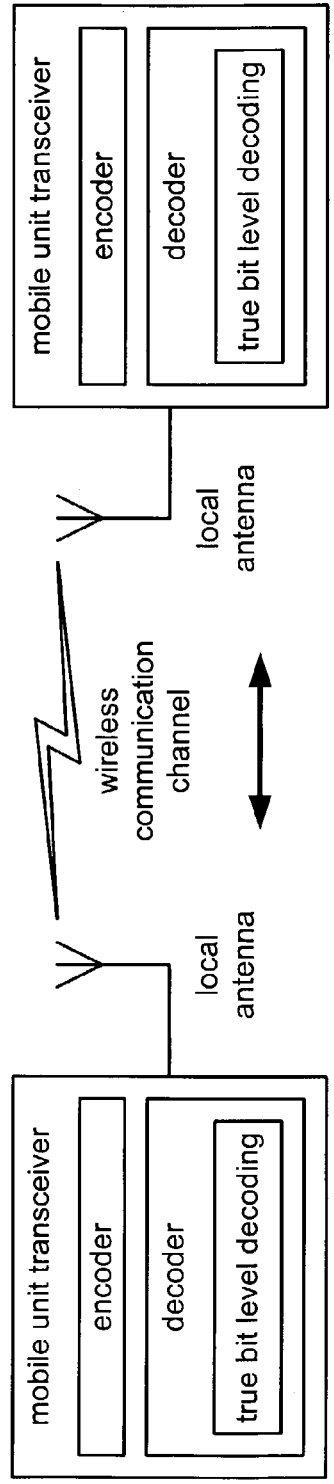

fiber-optic communication system satellite receiver STB (Set Top Box) system

TTCM (Turbo Trellis Coded Modulation) communication system overview of functionality of communication system rate 1/2 encoder that employs puncturing rate 1/2 (3,13) encoder rate 1/k encoder

| Feedforward Polynomial (octal) | Feedback polynomial (octal) | $d_2$ | $N_2$ | Other weights with 2 bit input (# sequence) |
|---|---|---|---|---|
| 5 | 16 | 4 | 3 | |
| 11 | 13 | 4 | 1 | |
| 17 | 15 | 4 | 1 | |
| 2 | 15 | 3 | 1 | 5(1) |
| 2 | 13 | 3 | 1 | 5(1) |
| 7 | 12 | 3 | 1 | 4(10),5(1) |
| 13 | 16 | 3 | 1 | 4(2),5(1) |
| 13 | 11 | 3 | 2 | 4(2),5(5) |
| 15 | 12 | 3 | 1 | 4(11) |
| 15 | 17 | 3 | 3 | 4(8),5(2) |
| 2 | 11 | 2 | 1 | 3(4),4(5),5(3) | list of possible encoders that satisfy Ungerboeck's rule and minimum distance $d_2 \geq 3$

Fig. 11

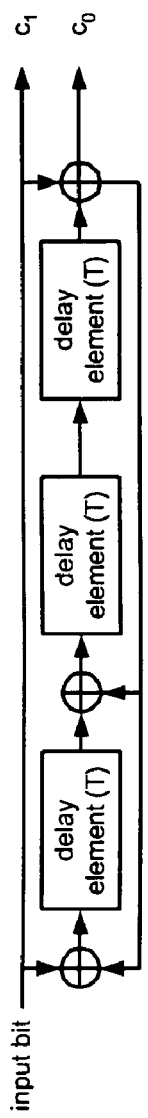
Fig. 12A rate 1/2 (11,13) encoder
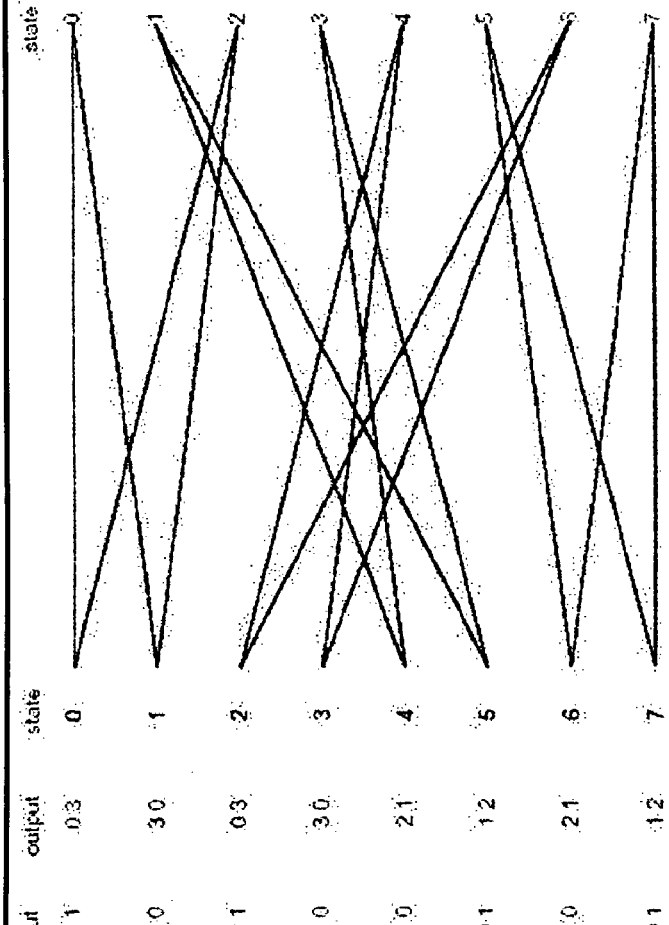
Fig. 12B trellis of rate 1/2 (11,13) encoder TTCM (Turbo Trellis Coded Modulation) decoder system alternative TTCM decoder system that recycles single SISO (shown as receiving I,Q inputs)

true bit level decoding functionality

Fig. 17 performance of TTCM (Turbo Trellis Coded Modulation)

modification of symbols of rate 2/3 TTCM based on RCs (Rate Controls)

M(a) calculation for RCs: 0,2,6,8 and RCs: 5,7 modification of symbols of rate 2/3 TTCM based on RCs (Rate Controls)

M(a) calculation for RCs: 1,4 using m(x) calculation

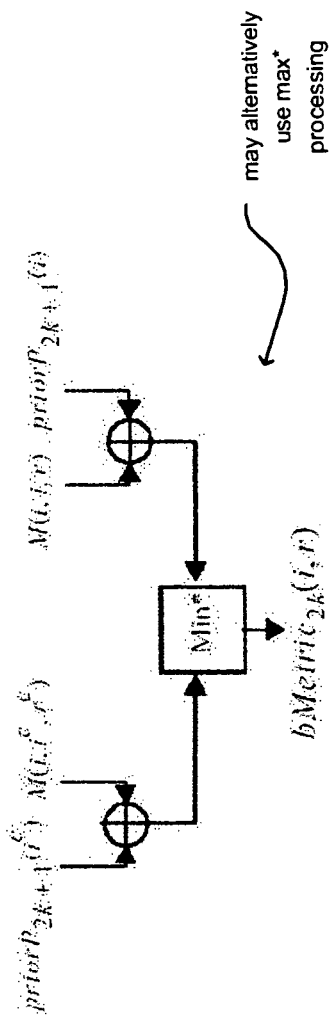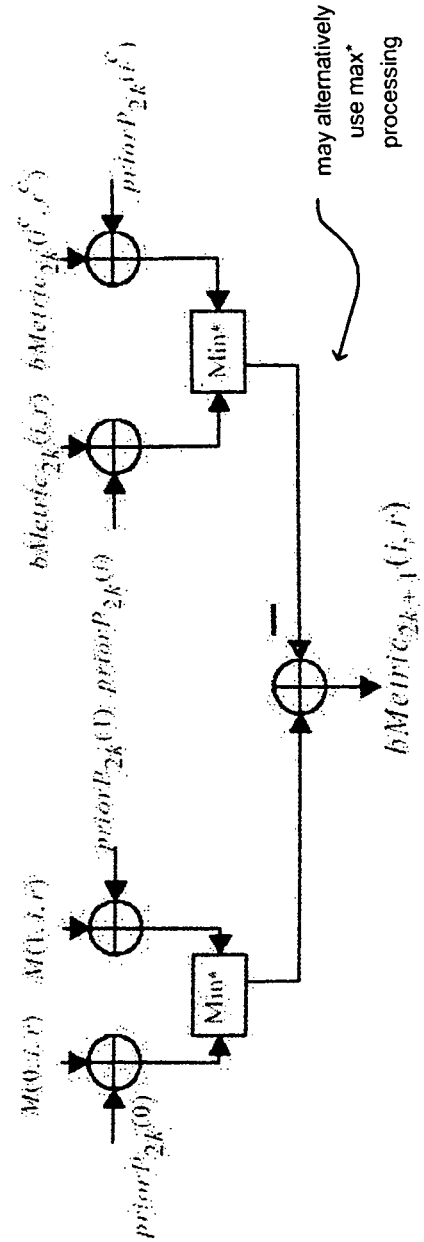
Fig. 23A — calculation of natural log (ln) bit metric for MSB (Most Significant Bit)
Fig. 23B — calculation of natural log (ln) bit metric for LSB (Least Significant Bit)

state transitions for rate 1/2 trellis encoder bit level calculation of natural log (ln) of alpha for MSB (Most Significant Bit)

bit level calculation of natural log (ln) of alpha for LSB (Least Significant Bit)

bit level calculation of natural log (ln) of beta for MSB (Most Significant Bit)

bit level calculation of natural log (ln) of beta for LSB (Least Significant Bit)

bit level calculation of natural log (ln) of extrinsic value for MSB (Most Significant Bit)

bit level calculation of natural log (ln) of extrinsic value for LSB (Least Significant Bit)

bit level decoding method bit level decoding method bit level decoding method

TRUE BIT LEVEL DECODING OF TTCM (TURBO TRELLIS CODE MODULATION) OF VARIABLE RATES AND SIGNAL CONSTELLATIONS

CROSS REFERENCE TO RELATED PATENTS/PATENT APPLICATIONS

The following U.S. Patent Applications are hereby incorporated herein by reference in their entirety and made part of the present U.S. Patent Application for all purposes:

1. U.S. application Ser. No. 10/264,486, entitled "Variable code rate and signal constellation turbo trellis coded modulation codec," filed Oct. 4, 2002, now U.S. Pat. No. 7,093,187 B2, issued on Aug. 15, 2006, which claims priority pursuant to 35 U.S.C. 119(e) to the following U.S. Provisional Patent Application: U.S. Provisional Patent Application Ser. No. 60/384,698, entitled "Variable code rate and signal constellation turbo trellis coded modulation codec," filed May 31, 2002.

2. U.S. Provisional Application Ser. No. 60/427,979, "Single stage implementation of min*, max*, min and/or max to perform state metric calculation in SISO decoder," filed Nov. 20, 2002.

3. U.S. Provisional Patent Application Ser. No. 60/459,132, entitled "True bit level decoding of TTCM (Turbo Trellis Coded Modulation) of variable rates and signal constellations," filed Mar. 31, 2003.

The present U.S. Patent Application also claims priority pursuant to 35 U.S.C. § 120 to the following U.S. Patent Application which are hereby incorporated herein by reference in their entirety and made part of the present U.S. Patent Application for all purposes:

1. U.S. application Ser. No. 10/264,486, entitled "Variable code rate and signal constellation turbo trellis coded modulation codec," filed Oct. 4, 2002, pending, which claims priority pursuant to 35 U.S.C. § 119(e) to the following U.S. Provisional Patent Application: U.S. Provisional Patent Application Ser. No. 60/384,698, entitled "Variable code rate and signal constellation turbo trellis coded modulation codec," filed May 31, 2002.

2. U.S. application Ser. No. 10/335,702, "Single stage implementation of min*, max*, min and/or max to perform state metric calculation in SISO decoder," filed Jan. 2, 2003, now U.S. Pat. No. 7,137,059 B2, issued on Nov. 14, 2006, which claims priority pursuant to 35 U.S.C. 119(e) to the following U.S. Provisional Patent Application: U.S. Provisional Application Ser. No. 60/427,979, "Single stage implementation of min*, max*, min and/or max to perform state metric calculation in SISO decoder," filed Nov. 20, 2002.

BACKGROUND OF THE INVENTION

1. Technical Field of the Invention

The invention relates generally to communication systems; and, more particularly, it relates to decoding of signals received within such communication systems.

2. Description of Related Art

Data communication systems have been under continual development for many years. One particular type of communication system has received particular attention is a communication system that operates using turbo code.

When performing decoding within such turbo code systems, it is necessary to perform updating of two real sequences during every iteration of the iterative decoding. These two sequences may be viewed as being be viewed as being forward metrics (alphas) and backward metrics (betas) within the context of TCM (Trellis Coded Modulation) decoding as well as TTCM (Turbo Trellis Coded Modulation) decoding. These alphas and betas may be represented as follows: $(\alpha_0(m), \alpha_1(m), \ldots, \alpha_{n-1}(m))$ and $(\beta_0(m), \beta_1(m), \ldots, \beta_{n-1}(m))$. The updating performed within this iterative decoding is performed using the a posteriori probability and the branch metrics. When performing TTCM decoding, a symbol metric will typically involve more than one information bit (e.g., a plurality of information bits). Therefore, the calculation of the forward metric $\alpha(m)$ and the backward metric $\beta(m)$ involves more than one computing cycle to calculate all of the possible values of these various information bits of the symbol; this may be characterized as a symbol level decoding approach. However, using the prior art approaches of purely symbol level decoding, such decoding approaches are typically implemented in a manner that costs a lot of transistors (which may be viewed as occupying a great deal of real estate within an integrated circuit that performs the decoding). In addition, a relatively large amount of memory must also typically be dedicated to store all of the calculated values before making final best estimates of the information contained within a received signal. It is also noted that the prior art approaches to performing this purely symbol level decoding is typically performing using the same symbol metric in every iteration of the iterative decoding.

As such, given the relatively large amount of calculations required to perform the prior art symbol level decoding, as well as the relatively large amount of information that must be stored using such symbol level decoding, it would be advantageous to have a decoding approach that could provide for comparable (if not better) performance than symbol level decoding, while also allowing fewer computational steps and a lesser amount of information to be stored before making final best estimates of the information contained within a received signal.

BRIEF SUMMARY OF THE INVENTION

Various aspects of the invention can be found in a bit level decoding method. The method involves receiving a signal that includes a symbol having a plurality of bits. The method also involves extracting I,Q (In-phase, Quadrature) components of the symbol and calculating a plurality of symbol metrics for the symbol using the I,Q components. The method then involves decomposing the symbol metrics of the plurality of symbol metrics into a plurality of bit metrics. These bit metrics are representative of the individual bits of the plurality of bits of the symbol. The method also involves performing iterative decoding using the plurality of bit metrics. The plurality of bit metrics is updated during each iteration of the iterative decoding. The method then involves making soft bit decisions that correspond to the individual bits of the plurality of bits of the symbol and also making hard bit decisions, based on the soft bit decisions, that correspond to best estimates of bit values of the individual bits of the plurality of bits of the symbol.

In certain embodiments, the iterative decoding of the method also involves calculating a plurality of forward metrics (alphas) and a plurality of backward metrics (betas) using the plurality of bit metrics. Each alpha and each beta corresponds to one individual bit of the plurality of bits of the symbol. The iterative decoding of the method may also involve calculating a plurality of extrinsic values using the plurality of bit metrics, the plurality of forward metrics (alphas), and the plurality of backward metrics (betas). In such embodiments, each extrinsic value corresponds to one individual bit of the plurality of bits of the symbol. Within the iterative decoding, the extrinsic values that are calculated during a first iteration are employed as APP (a priori probability) during a second iteration of the iterative decoding. The signal for which bit level decoding is performed may include a variety of types of signals including a TCM (Trellis Coded Modulation) coded signal or a TTCM (Turbo Trellis Coded Modulation) coded signal.

In other embodiments, when the signal is coded using TTCM, the iterative decoding of the invention, that involves using the bit metrics, is performed using a top SISO (Soft-In Soft-Out decoder), a bottom SISO, an interleaver, and a de-interleaver. Alternatively, the iterative decoding, that involves using the bit metrics, may be performed using only one SISO (Soft-In Soft-Out decoder) and an interleaver/de-interleaver device that performs the functionality of both an interleaver and a de-interleaver (depending on which SISO operation of an iterative decoding iteration is currently being performed).

The iterative decoding may also be implemented to perform MAP (maximum a posteriori probability) decoding. However, it is again noted that the iterative decoding may be directly adapted to perform TCM or TTCM decoding.

The decomposing of the symbol metrics into the bit metrics may be implemented as involving calculating a pseudo bit metric for an LSB (Least Significant Bit), calculating a bit metric for the LSB, and also calculating a bit metric for an MSB (Most Significant Bit) of the symbol.

The bit metrics may be initially calculated as being state dependent bit metrics. Thereafter, the decomposing of the symbol metrics into the bit metrics may then involve converting the state dependent bit metrics to state independent bit metrics.

The signal for which bit level decoding is performed may be received from a communication channel. Such a communication channel may, in some embodiments, be viewed as being an AWGN (Additive White Gaussian Noise) communication channel. The signal may include a plurality of symbols arranged in a frame, and the signal may also be a variable code rate signal whose code rate varies on a symbol by symbol basis within the frame. A first symbol within the signal may be encoded according to a first RC (Rate Control), and a second symbol within the signal is encoded according to a second RC.

The method may also involve mapping the bit metrics to trellis metrics according to the first RC and the second RC. In one embodiment, the trellis metrics are mapped according to an 8 state trellis of a rate 1/2 encoder. The rate 1/2 encoder is a convolutional encoder.

For a variable code rate signal, the first RC may include a first modulation having a first constellation and a first mapping, and the second RC may include a second modulation having a second constellation and a second mapping. The first modulation and the second modulation may be a variety of types of modulations including a BPSK (Binary Phase Shift Key) modulation, a QPSK (Quadrature Phase Shift Key) modulation, an 8 PSK (8 Phase Shift Key) modulation, a 16 QAM (Quadrature Amplitude Modulation) modulation, or a 16 APSK (Asymmetric Phase Shift Keying) modulation among other modulation types. According to the RCs, the first modulation and the second modulation may employ a similarly shaped constellations that each have different mappings (as directed by their respective RC). For example, the first modulation may be a QPSK (Quadrature Phase Shift Key) modulation having a QPSK constellation and the first mapping, and the second modulation may be a QPSK modulation having a QPSK constellation and the second mapping.

This method may be performed within a decoder. Such a decoder may be implemented within a variety of types of communication systems including a satellite communication system, an HDTV (High Definition Television) communication system, a cellular communication system, a microwave communication system, a point-to-point communication system, or a TTCM (Turbo Trellis Coded Modulation) communication system.

Other variations and embodiments of bit level decoding are also included within the scope and spirit of the invention. Various devices, including decoders (and decoders implemented within communication receivers) may support the functionality of the invention described within this specification.

BRIEF DESCRIPTION OF THE SEVERAL VIEWS OF THE DRAWINGS

FIG. 5A is a system diagram illustrating an embodiment of a uni-directional point-to-point radio communication system that is built according to the invention.

FIG. 5B is a system diagram illustrating an embodiment of a bi-directional point-to-point radio communication system that is built according to the invention.

FIG. 11 is a diagram illustrating a list of possible encoders that satisfy Ungerboeck's rule and a minimum distance of $d_2>=3$ according to the invention.

FIG. 12A is a diagram illustrating an embodiment of a rate 1/2 encoder (11,13) that is built according to the invention.

FIG. 12B is a diagram illustrating an embodiment of a trellis of the rate 1/2 encoder (11,13), shown in the FIG. 12A, according to the invention.

FIG. 23A is a diagram illustrating an embodiment of calculation of the natural log (ln) bit metric for an MSB (Most Significant Bit) according to the invention.

FIG. 23B is a diagram illustrating an embodiment of calculation of the natural log (ln) bit metric for an LSB (Least Significant Bit) according to the invention.

DETAILED DESCRIPTION OF THE INVENTION

The invention presents a solution that is able to decompose the various metrics employed within iterative decoding into metrics that may be processed at the bit level. This is in contradistinction to the prior art approach to deal with these metrics on a symbol basis. The forward metrics (alphas), the backward metrics (betas), and the extrinsic values may all be processed on a bit level basis according to the invention. This can result in a great deal of memory when performing this decoding processing on a bit level basis. The various calculation when doing this decoding processing may be performed using min* or max* processing.

Figure 1:
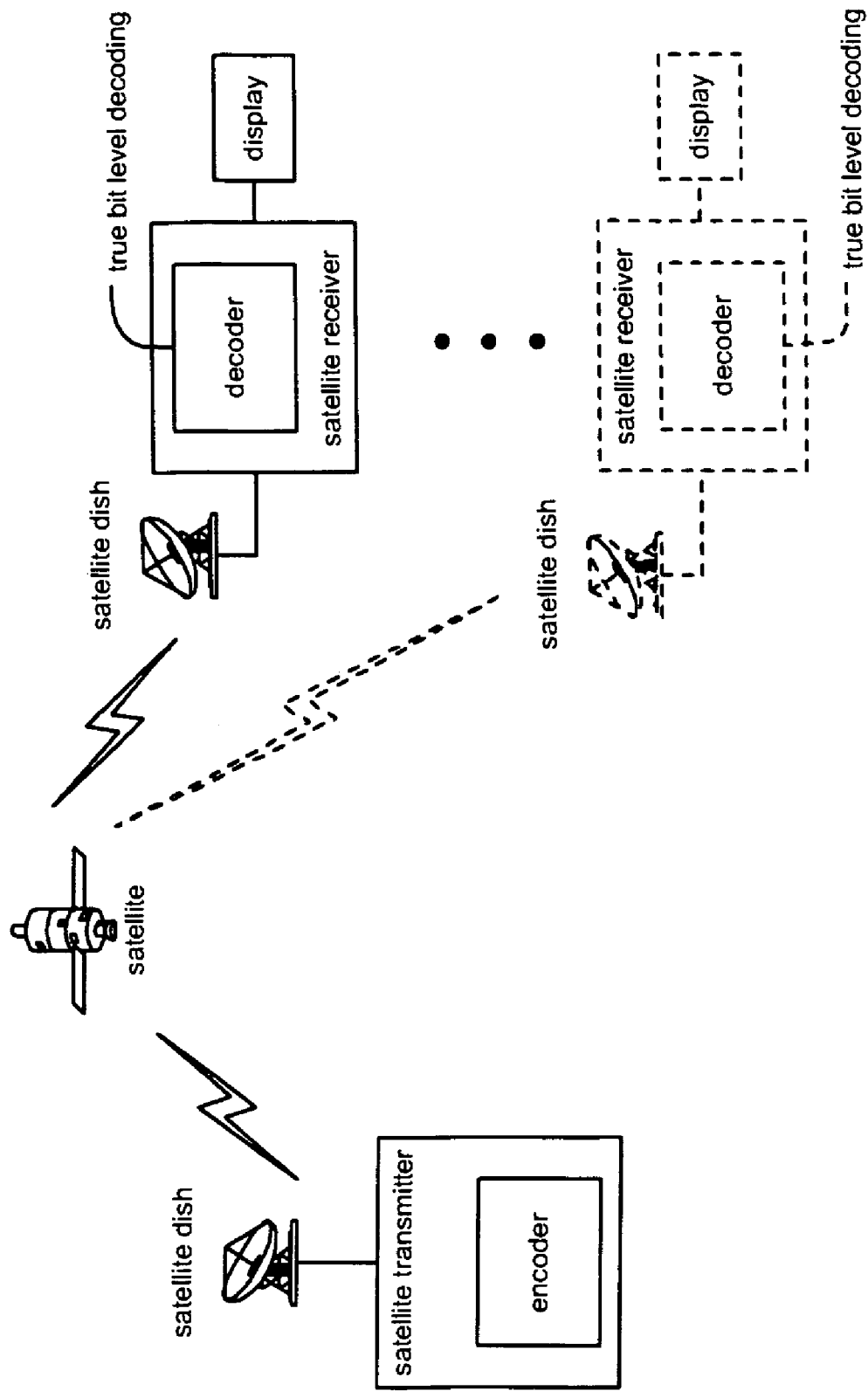
FIG. 1 is a system diagram illustrating an embodiment of a satellite communication system that is built according to the invention.

FIG. 1 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, and/or other wired networks. The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) that is to be transmitted to the satellite receiver; the satellite receiver is operable to decode the transmitted signal (using a decoder). The decoder is operable to perform decoding on a true bit level basis according to the invention. The FIG. 1 shows just one of the many embodiments where true bit level decoding may be performed according to the invention.

Figure 2:
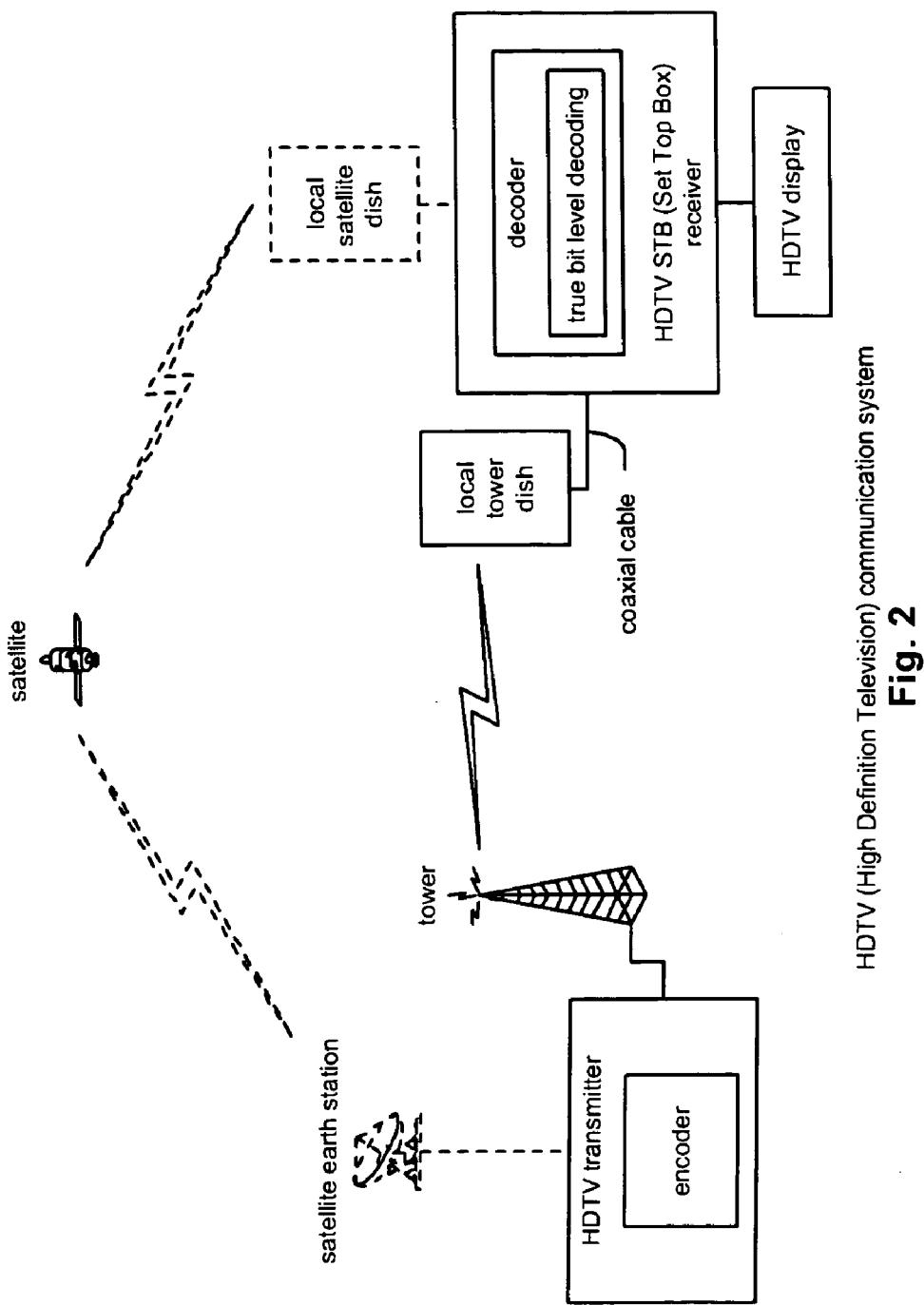
FIG. 2 is a system diagram illustrating an embodiment of a HDTV (High Definition Television) communication system that is built according to the invention.

FIG. 2 is a system diagram illustrating an embodiment of a HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV set top box receiver via a coaxial cable. The HDTV set top box receiver includes the functionality to receive the wireless transmitted signal that has been received by the local tower dish; this may include any transformation and/or down-converting that may be needed to accommodate any up-converting that may have been performed before and during transmission of the signal from the HDTV transmitter and its tower.

The HDTV set top box receiver is also communicatively coupled to an HDTV display that is able to display the demodulated and decoded wireless transmitted signals received by the HDTV set top box receiver and its local tower dish. The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is destined for the HDTV set top box receiver. For example, another satellite earth station may first transmit a signal to the satellite from another location, and the satellite may relay this signal to the satellite earth station that is communicatively coupled to the HDTV transmitter. The HDTV transmitter performs receiver functionality and then transmits its received signal to the local tower dish.

In even other embodiments, the HDTV transmitter employs its satellite earth station to communicate to the satellite via a wireless communication channel. The satellite is able to communicate with a local satellite dish; the local satellite dish communicatively couples to the HDTV set top box receiver via a coaxial cable. This path of transmission shows yet another communication path where the HDTV set top box receiver may communicate with the HDTV transmitter.

In whichever embodiment and whichever signal path the HDTV transmitter employs to communicate with the HDTV set top box receiver, the HDTV set top box receiver is operable to receive communication transmissions from the HDTV transmitter.

The HDTV transmitter is operable to encode information (using an encoder) that is to be transmitted to the HDTV set top box receiver; the HDTV set top box receiver is operable to decode the transmitted signal (using a decoder). The decoder is operable to perform decoding on a true bit level basis according to the invention. The FIG. 2 shows yet another of the many embodiments where true bit level decoding may be performed according to the invention.

Figure 3A:
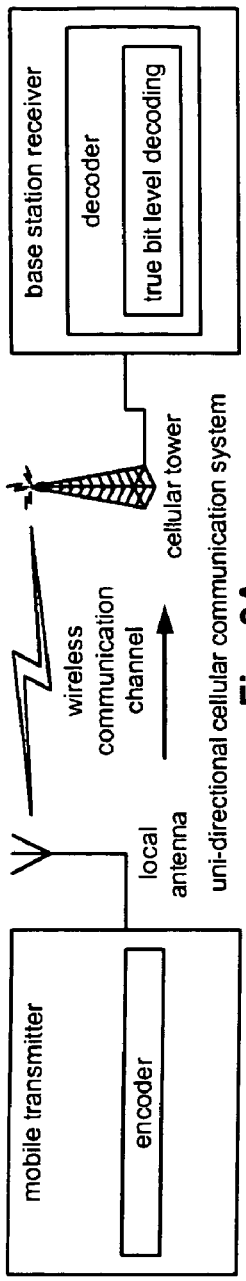
FIG. 3A and FIG. 3B are system diagrams illustrating embodiments of uni-directional cellular communication systems that are built according to the invention.
Figure 3B:
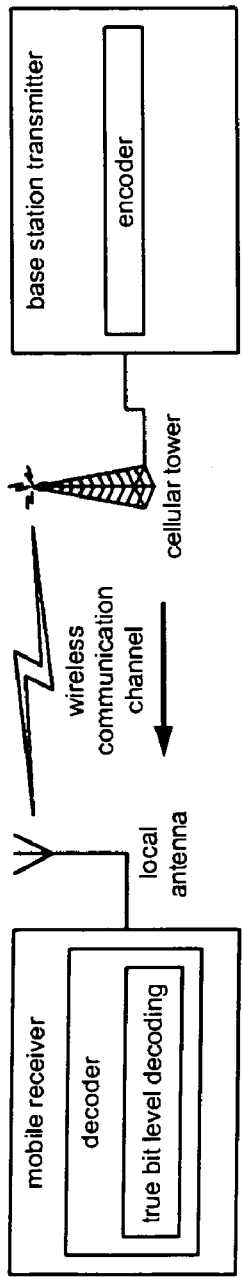

FIG. 3A and FIG. 3B are system diagrams illustrating embodiments of uni-directional cellular communication systems that are built according to the invention.

Referring to the FIG. 3A, a mobile transmitter includes a local antenna communicatively coupled thereto. The mobile transmitter may be any number of types of transmitters including a one way cellular telephone, a wireless pager unit, a mobile computer having transmit functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) that is to be transmitted to the base station receiver; the base station receiver is operable to decode the transmitted signal (using a decoder).

The decoder is operable to perform decoding on a true bit level basis according to the invention. The FIG. 3A shows yet another of the many embodiments where true bit level decoding may be performed according to the invention. The FIG. 3A shows a uni-directional cellular communication system where the communication goes from the mobile transmitter to the base station receiver via the wireless communication channel.

Referring to the FIG. 3B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) that is to be transmitted to the mobile receiver; the mobile receiver is operable to decode the transmitted signal (using a decoder).

The decoder is operable to perform decoding on a true bit level basis according to the invention. The FIG. 3B shows yet another of the many embodiments where true bit level decoding may be performed according to the invention. The FIG. 3B shows a uni-directional cellular communication system where the communication goes from the base station transmitter to the mobile receiver via the wireless communication channel.

Figure 3C:
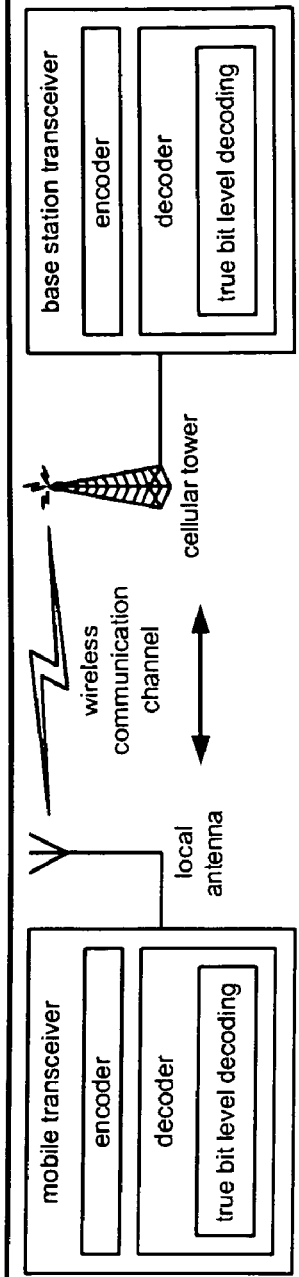
FIG. 3C is a system diagram illustrating an embodiment of a bi-directional cellular communication system that is built according to the invention.

FIG. 3C is a system diagram illustrating an embodiment of a bi-directional cellular communication system that is built according to the invention. The communication within this embodiment may go to and from the base station transceiver and to and from the mobile transceiver via the wireless communication channel.

Referring to the FIG. 3C, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceiver including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using its encoder) that is to be transmitted to the mobile transceiver; the mobile transceiver is operable to decode the transmitted signal (using its decoder).

In addition, the mobile transceiver is operable to encode information (using its encoder) that is to be transmitted to the base station transceiver; the base station transceiver is operable to decode the transmitted signal (using its decoder).

The decoders within either of the mobile transceiver and the base station may be implemented to perform decoding on a true bit level basis according to the invention. The FIG. 3C shows yet another of the many embodiments where true bit level decoding may be performed according to the invention.

Figure 4A:
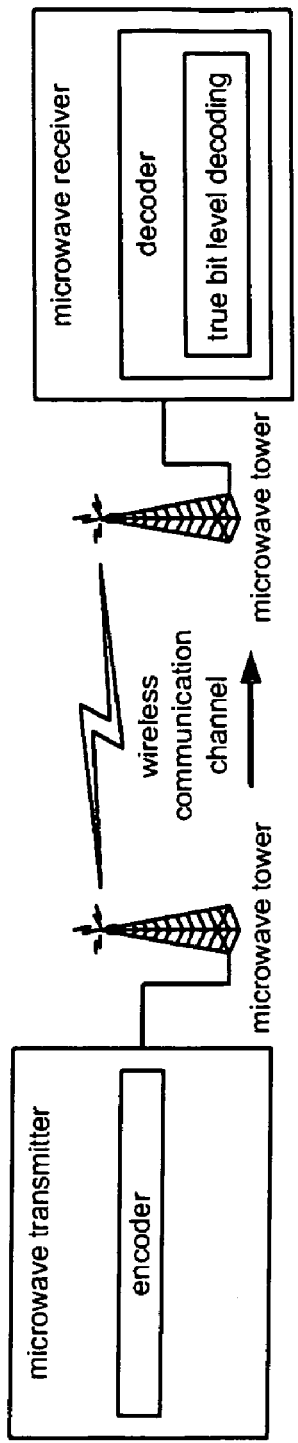
FIG. 4A is a system diagram illustrating an embodiment of a uni-directional microwave communication system that is built according to the invention.

FIG. 4A is a system diagram illustrating an embodiment of a uni-directional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) that is to be transmitted to the microwave receiver; the microwave receiver is operable to decode the transmitted signal (using a decoder).

The decoder is operable to perform decoding on a true bit level basis according to the invention. The FIG. 4A shows yet another of the many embodiments where true bit level decoding may be performed according to the invention. The FIG. 4A shows a uni-directional microwave communication system where the communication goes from the microwave transmitter to the microwave receiver via the wireless communication channel.

Figure 4B:
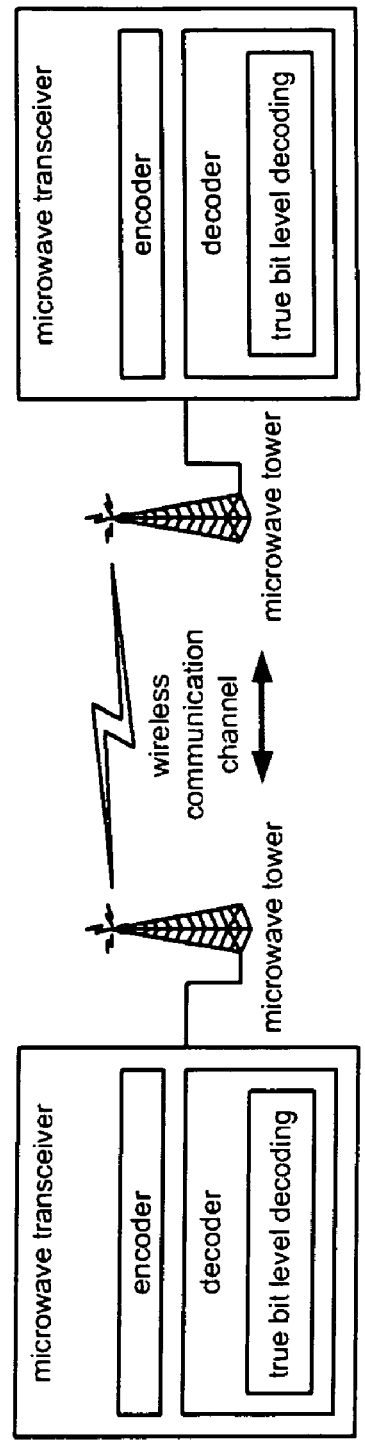
FIG. 4B is a system diagram illustrating an embodiment of a bi-directional microwave communication system that is built according to the invention.

FIG. 4B is a system diagram illustrating an embodiment of a bi-directional microwave communication system that is built according to the invention. Within the FIG. 4B, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using an encoder) that is to be transmitted to the other microwave transceiver; each microwave transceiver is operable to decode the transmitted signal (using a decoder) that it receives. Each of the microwave transceivers includes an encoder and a decoder.

The decoder of either of the microwave transceivers may be implemented to perform decoding on a true bit level basis according to the invention. The FIG. 4B shows yet another of the many embodiments where true bit level decoding may be performed according to the invention.

FIG. 5A is a system diagram illustrating an embodiment of a uni-directional point-to-point radio communication system that is built according to the invention. A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) that is to be transmitted to the mobile unit receiver; the mobile unit receiver is operable to decode the transmitted signal (using a decoder).

The decoder is operable to perform decoding on a true bit level basis according to the invention. The FIG. 5A shows yet another of the many embodiments where true bit level decoding may be performed according to the invention. The FIG. 5A shows a uni-directional communication system where the communication goes from the mobile unit transmitter to the mobile unit receiver via the wireless communication channel.

FIG. 5B is a system diagram illustrating an embodiment of a bi-directional point-to-point radio communication system that is built according to the invention. Within the FIG. 5B, a first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each mobile unit transceiver is operable to encode information (using an encoder) that is to be transmitted to the other mobile unit transceiver; each mobile unit transceiver is operable to decode the transmitted signal (using a decoder) that it receives.

The decoder of either of the mobile unit transceivers may be implemented to perform decoding on a true bit level basis according to the invention. The FIG. 5B shows yet another of the many embodiments where true bit level decoding may be performed according to the invention.

Figure 6A:
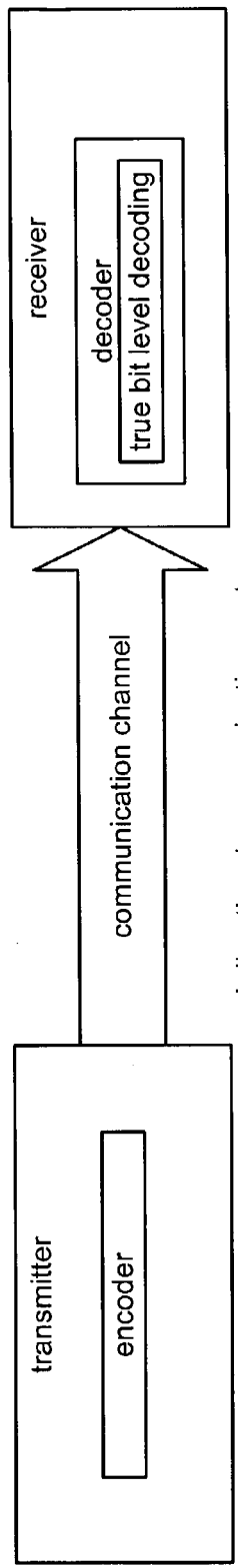
FIG. 6A is a system diagram illustrating an embodiment of a uni-directional communication system that is built according to the invention.

FIG. 6A is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) that is to be transmitted to the receiver; the receiver is operable to decode the transmitted signal (using a decoder).

The decoder is operable to perform decoding on a true bit level basis according to the invention. The FIG. 6A shows yet another of the many embodiments where true bit level decoding may be performed according to the invention.

Figure 6B:
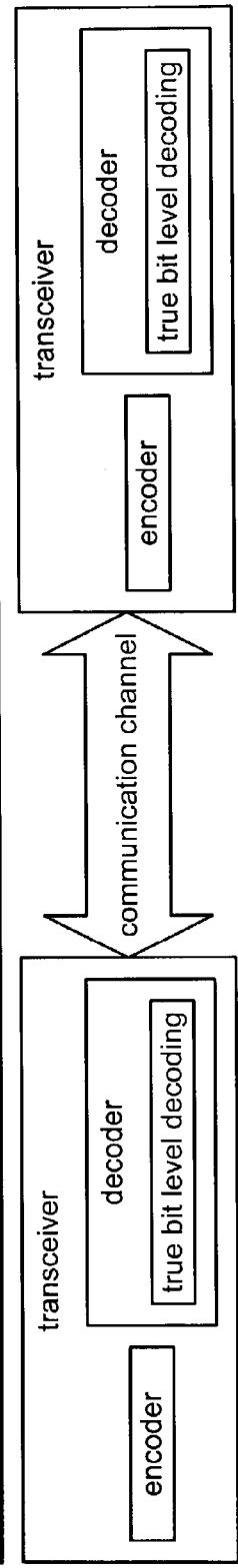
FIG. 6B is a system diagram illustrating an embodiment of a bi-directional communication system that is built according to the invention.

FIG. 6B is a system diagram illustrating an embodiment of a bi-directional communication system that is built according to the invention. Within the FIG. 6B, a first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using an encoder) that is to be transmitted to the other transceiver; each transceiver is operable to decode the transmitted signal (using a decoder) that it receives.

The decoder of either of the transceivers may be implemented to perform decoding on a true bit level basis according to the invention. The FIG. 6B shows yet another of the many embodiments where true bit level decoding may be performed according to the invention.

Figure 6C:
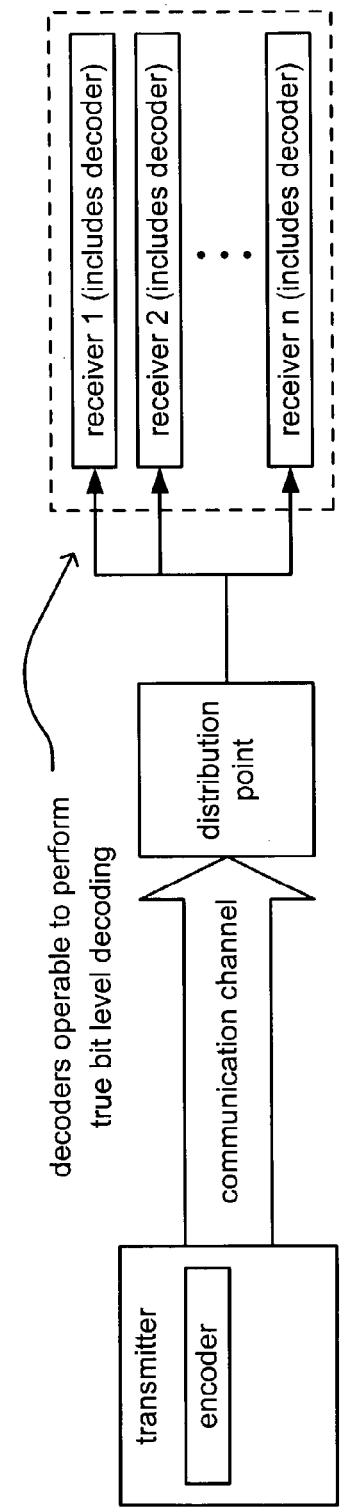
FIG. 6C is a system diagram illustrating an embodiment of a one to many communication system that is built according to the invention.

FIG. 6C is a system diagram illustrating an embodiment of a one to many communication system that is built according to the invention. A transmitter is able to communicate, via broadcast in certain embodiments, with a number of receivers, shown as receivers 1, 2, . . . , n via a uni-directional communication channel. The uni-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

A distribution point is employed within the one to many communication system to provide the appropriate communication to the receivers 1, 2, . . . , and n. In certain embodiments, the receivers 1, 2, . . . , and n each receive the same communication and individually discern which portion of the total communication is intended for themselves.

The transmitter is operable to encode information (using an encoder) that is to be transmitted to the receivers 1, 2, . . . , and n; each of the receivers 1, 2, . . . , and n is operable to decode the transmitted signal (using a decoder).

The decoder of any of the receivers may be implemented to perform decoding on a true bit level basis according to the invention. The FIG. 6C shows yet another of the many embodiments where true bit level decoding may be performed according to the invention.

Figure 7A:
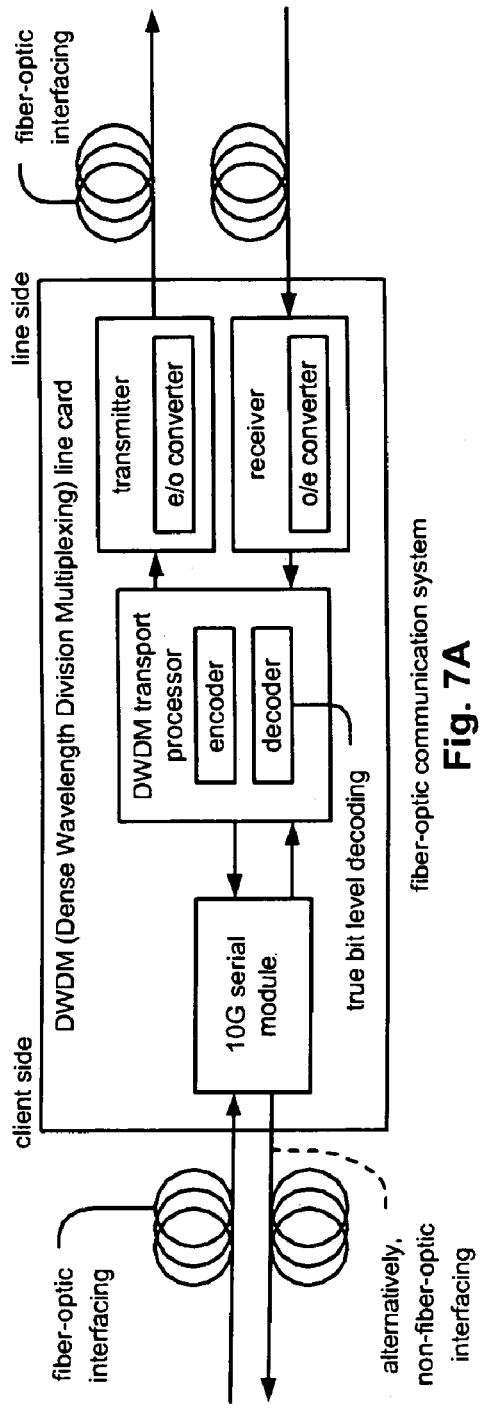
FIG. 7A is a system diagram illustrating an embodiment of a fiber-optic communication system that is built according to the invention.

FIG. 7A is a system diagram illustrating an embodiment of a fiber-optic communication system that is built according to the invention. The fiber-optic communication system is operable to support true bit level decoding. The fiber-optic communication system includes a DWDM (Dense Wavelength Division Multiplexing (in the context of fiber optic communications) line card that is interposed between a line side and a client side.

DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantage of DWDM can be summarized as follows:

The transparency of DWDM: Because DWDM is a physical layer architecture (PHY), it can transparently support both Time Division Multiplexing (TDM) and data formats such as asynchronous transfer mode (ATM), Gigabit Ethernet, ESCON, and Fibre Channel with open interfaces over a common physical layer.

The scalability of DWDM: DWDM can leverage the abundance of dark fiber in many metropolitan area and enterprise networks to quickly meet demand for capacity on point-to-point links and on spans of existing SONET/SDH rings.

The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10 G serial module. That is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides. The decoder is operable to perform decoding on a true bit level basis according to the invention. The FIG. 7A shows yet another of the many embodiments where true bit level decoding may be performed according to the invention.

Figure 7B:
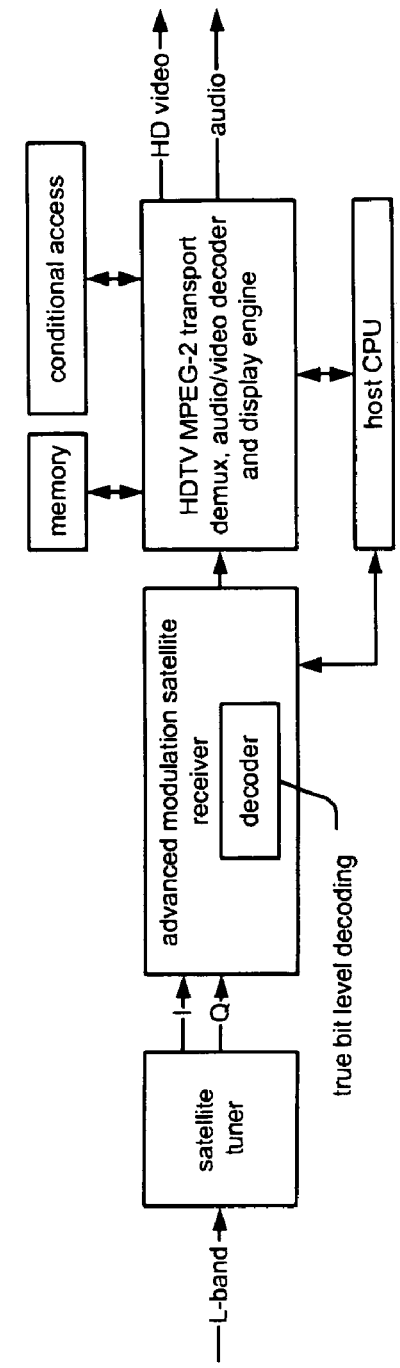
FIG. 7B is a system diagram illustrating an embodiment of a satellite receiver STB (Set Top Box) system that is built according to the invention.

FIG. 7B is a system diagram illustrating an embodiment of a satellite receiver STB (Set Top Box) system that is built according to the invention. The satellite receiver STB system includes an advanced modulation satellite receiver that is implemented in an all digital architecture. The satellite receiver STB system includes a satellite tuner that receives a signal via the L-band. The satellite tuner extracts I,Q (in-phase and quadrature) components from a signal received from the L-band and provides them to the advanced modulation satellite receiver. The advanced modulation satellite receiver includes an embodiment of the decoder. The decoder is operable to perform decoding on a true bit level basis according to the invention.

The advanced modulation satellite receiver communicatively couples to an HDTV MPEG-2 (Motion Picture Experts Group 2 (Standard—Compressed Video at 4-9 Mbps)) transport de-mux, audio/video decoder and display engine. The advanced modulation satellite receiver and the HDTV MPEG-2 transport de-mux, audio/video decoder and display engine communicatively couple to a host CPU (Central Processing Unit). The HDTV MPEG-2 transport de-mux, audio/video decoder and display engine also communicatively couples to a memory module and a conditional access functional block. The HDTV MPEG-2 transport de-mux, audio/video decoder and display engine provides HD video and audio output that may be provided to an HDTV display.

The advanced modulation satellite receiver is a single-chip digital satellite receiver supporting the decoder that is operable to support decoding on a true bit level basis according to the invention. The advanced modulation satellite receiver is operable to receive communication provided to it from a transmitter device that includes an encoder as well.

Figure 8:
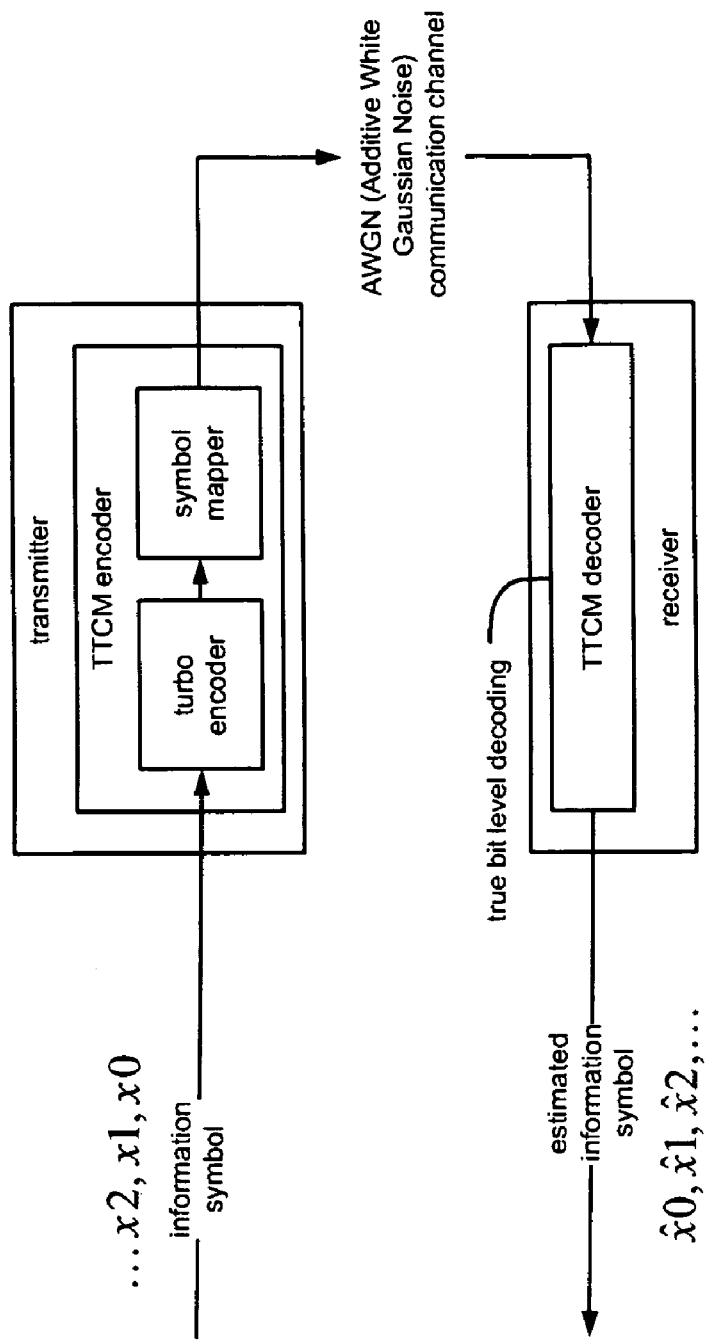
FIG. 8 is a system diagram illustrating an embodiment of a TTCM (Turbo Trellis Coded Modulation) communication system that is built according to the invention.

FIG. 8 is a system diagram illustrating an embodiment of a TTCM (Turbo Trellis Coded Modulation) communication system that is built according to the invention. The TTCM communication system includes a transmitter and a receiver that are communicatively coupled to one another via a communication channel that introduces AWGN (Additive White Gaussian Noise) to the signal. The communication channel may be wireline or wireless according to the invention. The AWGN communication channel may be viewed as being a relatively noisy communication channel in some embodiments.

The transmitter includes a TTCM encoder that encodes one or more information symbols and then modulates those encoded symbols. Those encoded symbol may also undergo modulation encoding to map those symbols to a constellation and an associating mapping. The transmitter then prepares this signal for transmission across the communication channel. At the other end of the communication channel, the receiver includes a TTCM decoder that receives and estimates the encoded symbols that have been transmitted across the communication channel. Further details of the operation of the various functional blocks contained within the TTCM encoder and the TTCM decoder are also described in more detail below.

Generally speaking, within the TTCM encoder, the turbo encoder performs symbol encoding and the symbol mapper maps those encoded symbols to an appropriate modulation (including a constellation and a corresponding mapping). Similarly, generally speaking within the TTCM decoder, the TTCM decoder performs calculations that are employed to perform decoding of the received symbols. The TTCM decoder is operable to perform decoding on a true bit level basis according to the invention.

It is also understood that a variety of means of modulation, transmission, receipt, and demodulation may be performed to generate the analog signals to be transmitted across the communication channel without departing from the scope and spirit thereof. Each and any such means may be practiced according to the invention while performing the TTCM encoding/decoding described herein.

Figure 9:
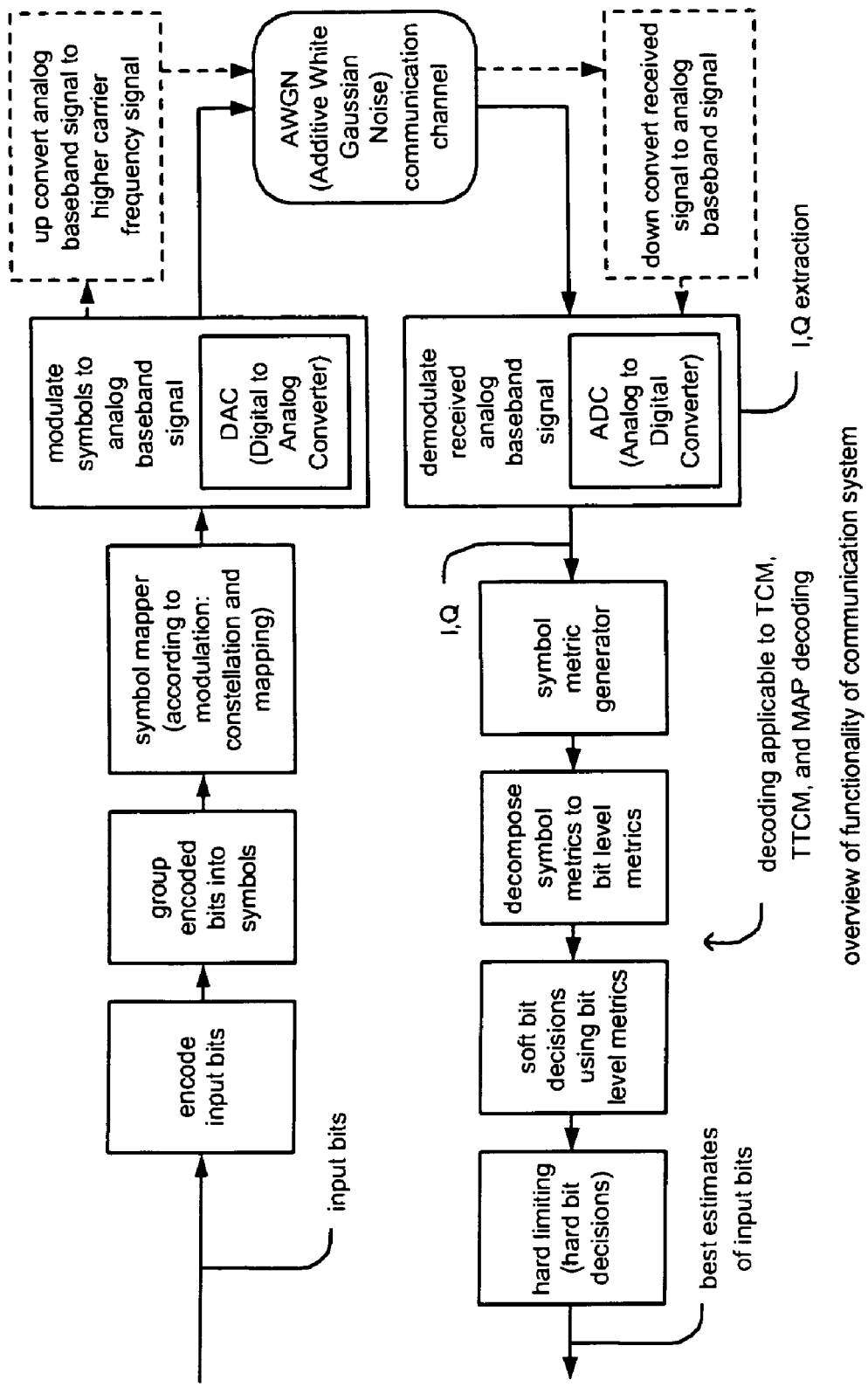
FIG. 9 is a diagram illustrating an embodiment of an overview of functionality of a communication system that is built according to the invention.

FIG. 9 is a diagram illustrating an embodiment of an overview of functionality of a communication system that is built according to the invention. The functionality described within this embodiment may be viewed as being performed within a variety of the various communication system embodiments described within this specification.

Inputs bits are initially provided to a transmitter side of a communication channel. The input bits are initially encoded thereby generating encoded input bits. This encoding may be performed according to TTCM. These encoded bits are then grouped into symbols. These symbols, comprised of the encoded bits that are appropriately grouped, are provided to a symbol mapper that maps the symbols according to a modulation that includes a constellation and a corresponding mapping; this may be viewed as undergoing modulation encoding. At this point, the symbols may be viewed as being a digital baseband signal. These symbols are then modulated to generate an analog baseband signal whose frequency is that of baseband and whose magnitude and phase components vary at that baseband frequency. This may be performed using a DAC (Digital to Analog Converter). This analog baseband signal may then be provided to a communication channel. The communication channel may be viewed as being an AWGN (Additive White Gaussian Noise) communication channel.

In some embodiments, the analog baseband signal may undergo some up converting. For example, the analog baseband signal may be up converted to a higher carrier frequency for transmission on the communication channel. This up conversion may also involve transforming the analog baseband signal up to intermediate frequency before being transformed up to the higher carrier frequency at which the signal is transmitted across the communication channel.

The transmitted signal is then received at a receiver end of the communication channel. Initially, the received signal that has been transmitted may undergo some down converting to transform the received signal to an analog baseband signal. This may also include some transformation to an intermediate frequency before converting the signal down to an analog baseband signal. Alternatively, the conversion may be performed directly to the analog baseband signal.

The received analog baseband signal is then demodulated to generate a digital baseband signal. This may be performed using an ADC (Analog to Digital Converter). This may be viewed as performing the I,Q (In-phase, Quadrature) component extraction of the various symbols within the analog baseband signal. These I,Q components are then provided to a metric generator that calculated metrics for the symbols within the received digital baseband signal.

These symbol metrics are then decomposed to bit level metrics. Theses bit level metrics may be viewed as those metrics that may be used to assist in any iterative decoding that is to be performed on a true bit level basis. Soft bit decisions are then made using these bit level metrics. Finally, hard limiting is performed on the soft bit decisions. This may be viewed as making hard bit decisions using the soft bit decisions generated previously. These hard bit decisions may be viewed as being the best estimates of the input bits that had been provided at the transmitter side of the communication system.

Again, it is noted that this overview of the functionality of a communication system may be viewed as being supported within the context of many of the various embodiments described in this specification. The true bit level decoding may be supported in each of the various embodiments described above. Below, several embodiments are described that show how this bit level decoding may be implemented.

As also indicated above, it is known that the iterative turbo decoding involves updating two real sequences during every iteration of the iterative decoding. These two sequences may be viewed as being be viewed as being forward metrics (alphas) and backward metrics (betas) within the context of TCM (Trellis Coded Modulation) decoding as well as TTCM (Turbo Trellis Coded Modulation) decoding. These alphas and betas may be represented as follows: ($\alpha_0$(m), $\alpha_1$(m), ..., $\alpha_{n-1}$(m)) and ($\beta_0$(m), $\beta_1$(m), ..., $\beta_{n-1}$(m)). The updating performed within this iterative decoding is performed using the a posteriori probability and the branch metrics. When performing TTCM decoding, a symbol metric will typically involve more than one information bit (e.g., a plurality of information bits). Therefore, the calculation of the forward metric $\alpha_1$(m) and the backward metric $\beta_1$(m) involves more than one computing cycle to calculate all of the possible values of these various information bits of the symbol. This computing may be performed using various cycles of min* or max* processing. However, using this approach is implemented in a manner that costs a lot of transistors (which may be viewed as occupying a great deal of real estate within an integrated circuit that performs the decoding).

The invention presents a method to decompose these symbol metrics to bit metrics that are then used in the decoding processing. The number of transistors that would be required to perform decoding processing is greatly reduced by performing the decoding on a bit level. Using this bit level decoding, the metrics involving in performing the decoding processing, namely the forward metrics (alphas) $\alpha_1$(m) and the backward metrics (betas) $\beta_1$(m) are then represented as bit metrics.

Figure 10A:
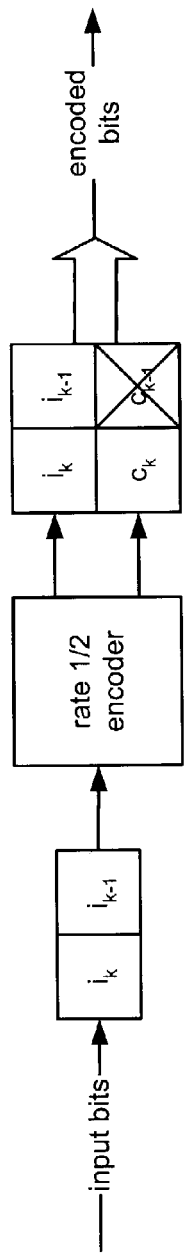
FIG. 10A is a diagram illustrating an embodiment of a rate 1/2 encoder that employs puncturing according to the invention.

FIG. 10A is a diagram illustrating an embodiment of a rate 1/2 encoder that employs puncturing according to the invention. To support this decoding processing on a bit level basis, a trellis encoder is initially constructed using a rate 1/2 encoder. More specifically, a rate 2/3 trellis encoder can be constructed by puncturing a rate 1/2 encoder. Input bits $i_k i_{k-1}$ are provided to the rate 1/2 encoder. When the first input bit, $i_{k-1}$, is provided to the rate 1/2 encoder, the encoded bits, $i_k$ and $c_k$, are generated. The output bit $i_k$ may be viewed as being the input bit itself, and the output bit $c_k$ may be viewed as being a redundancy or coded bit. When the second input bit, $i_k$, is provided to the rate 1/2 encoder, the encoded bits, $i_{k-1}$ and $c_{k-1}$, are generated. The output bit $i_{k-1}$ may be viewed as being the input bit itself, and the output bit $c_{k-1}$ may be viewed as being a redundancy or coded bit.

However, during this second coding iteration, the output bit $c_{k-1}$ is punctured, or thrown away. These remaining bits, $i_k$, $c_k$, and $i_{k-1}$, may be viewed as encoded bits. These remaining bits, $i_k$, $c_k$, and $i_{k-1}$, may then be grouped to form a symbol. Overall, the operation of this rate 1/2 encoder that employs puncturing, when receiving the successive input bits $i_k i_{k-1}$ and outputting the encoded bits $i_k c_k i_{k-1}$ may be viewed as being a rate 2/3 encoder. The input bits $i_k i_{k-1}$ may be viewed as being an input symbol and the encoded bits $i_k c_k i_{k-1}$ may be viewed as being an output symbol.

In a coded modulation scheme, a signal value, such as I,Q (In-phase, Quadrature) component values of a signal received from a communication channel, may contain information corresponding to more than one information bit, one information bit, or no information bits. That is to say, the symbol may include information corresponding to more than one information bit. The invention presents a solution that allows a bit metric to be obtained from a signal value with more than one information bit according to bit level decoding thereby allowing the discrimination of the individual information bits within the symbol. In this specification, bit level decoding is presented that may be performed within a variety of embodiments including performing bit level MAP (maximum a posteriori probability) decoding where the maximum end result value is used to select the appropriate value.

Next, the selection of an appropriate code is selected that will support the bit level decoding according to the invention. An example code having a code rate of 1/2 and having 8 states is used to illustrate the functionality of the invention; however, the invention is also extendable to different code having other code rate as well as those employing trellises having different numbers of states.

In an illustrative example, a code having a code rate of 1/2 is initially sought. To find the rate 1/2 base code, some design criteria are required.

A first design criterion is to obey Ungerboeck's rule for TCM (Trellis Coded Modulation). This rule states, "All the transitions that diverge from a common state or reemerge into a same state must be assigned with signals from one subset at the first level of set partitioning."

A second design criterion is that the interleaving gain of the turbo code, which depends on the effective minimum distance $d_2$ (for convolutional code this is the weight of the output when two bits are input) of the final trellis, and the number of the nearest neighbor $N_2$ with respect to the effective minimum distance $d_2$. The criterion is that $d_2$ should be as large as possible but $N_2$ should be as small as possible. The rate 2/3 code that is selected for a symbol decoder has a maximum $d_2$=5 among all rate 2/3 and 8 state RSC (Reed-Solomon Code). In addition, this embodiment also includes a minimal $N_2$=1.

Such a rate 1/2 recursive encoder may be represented by two binary polynomials. One is feed forward polynomial, and one is feedback polynomial. For example, if the feed forward polynomial is f(D)=1+D and the feedback polynomial is b(D)=1+D+$D^3$, then such a rate 1/2 encoder may be represented as shown within the FIG. 10B.

Figure 10B:
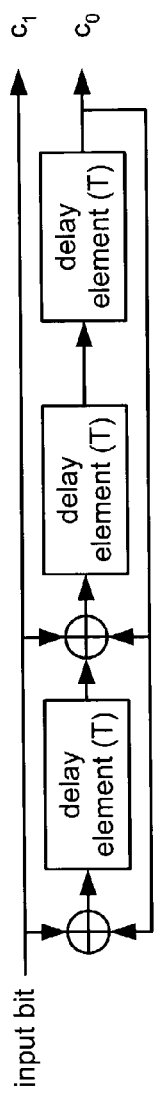
FIG. 10B is a diagram illustrating an embodiment of a rate 1/2 encoder (3,13) that is built according to the invention.

FIG. 10B is a diagram illustrating an embodiment of a rate 1/2 encoder (3,13) that is built according to the invention. When an input bit is provided to the encoder, 2 bits are output. One of the output bits $c_1$ is representative of exactly the input bit, and the other of the output bits $c_0$ is a code bit (sometimes referred to as a parity bit or a redundancy bit). This represents one example of a convolutional encoder that may be selected in the design process of a code that supports bit level decoding.

Figure 10C:
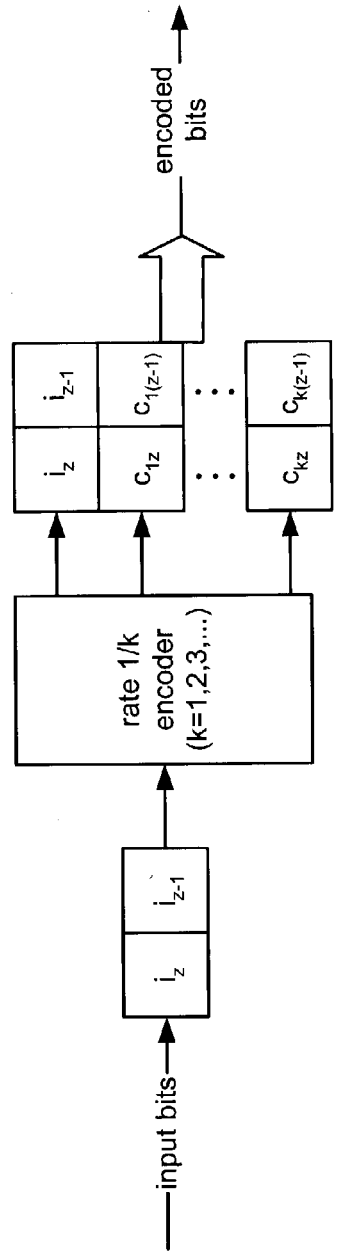
FIG. 10C is a diagram illustrating an embodiment of a rate 1/k encoder that is built according to the invention.

FIG. 10C is a diagram illustrating an embodiment of a rate 1/k encoder that is built according to the invention. In general, a rate 1/k encoder (a rate 1/k convolutional encoder, where k=1, 2, 3, ... and so on) may be employed when designing a code that supports bit level decoding. The code bits that are output from the encoder may be punctured, or selected to form encoded symbols according to the invention. It is noted that any number of encoders may be employed that operate by receiving a single bit as input.

In this specification, octal numbers are used to present these polynomials (e.g., the feed forward polynomial and the feedback polynomial). In the embodiment of interest, f=3 and b=13. A search is then made for all possible encoders with a degree of the feed forward polynomial and a degree of the feed back polynomial that is not greater than 3. Among all such encoders, there are 56 that have an effective minimum distance $d_2 \geq 3$. There are 2 such encoders with $d_2$=5 and 17 such encoders with $d_2$=4. However, most of these encoders do not satisfy Ungerboeck's rule as stated above.

FIG. 11 is a diagram illustrating a list of possible encoders that satisfy Ungerboeck's rule and a minimum distance of $d_2 \geq 3$ according to the invention. The order of the feed forward polynomial (in octal) and the order of the feedback polynomial (in octal) are shown as a function of the effective minimum distance $d_2$ and the number of the nearest neighbor $N_2$. In addition, the other weights, when appropriate, with 2 bit input sequences and the number of the sequence are also shown.

Based on the list shown within the FIG. 11 and the rule of minimum effective distance $d_2$, the encoders (11,13) and encoder (17,15) should be the best. After performing a search among all possible signal constellations (for corresponding modulations) may then be performed. The encoder with the best signal constellation that is found if the rate 1/2 (11,13) encoder.

Such a rate 1/2 recursive encoder may be represented by two binary polynomials. One is a feed forward polynomial $f(D)=1+D^3$ and the other one is a feedback polynomial of $b(D)=1+D+D^3$. Such a rate 1/2 encoder (11,13) may be represented by the circuit shown within the FIG. 12A.

FIG. 12A is a diagram illustrating an embodiment of a rate 1/2 encoder (11,13) that is built according to the invention. When an input bit is provided to the encoder, 2 bits are output. One of the output bits $c_1$ is representative of exactly the input bit, and the other of the output bits $c_0$ is a code bit (again, sometimes referred to as a parity bit or a redundancy bit). This design represents the best rate 1/2 convolutional encoder that is selected in the design process of a code that supports bit level decoding.

In addition, from this encoder circuit, it can be concludes that, when the state is fixed, the redundancy bits are different for the two different input bits. This property is then used in the calculation of the bit metrics as is described in more detail below. The trellis of this encoder is shown below in the FIG. 12B.

FIG. 12B is a diagram illustrating an embodiment of a trellis of the rate 1/2 encoder (11,13), shown in the FIG. 12A, according to the invention. This trellis is an 8 state trellis.

The operation of this 8 state trellis, with the mapping shown, may then be described as follows. After looking at these examples, state transitions from the other states will also be understood.

When the encoder is in the state 0=000, and when a 0 bit input is provided, then the state of the encoder will transition from the input state 0=000 to the output state 0=000. This may be viewed as the state of the encoder transitioning along the $1^{st}$ possible branch of the trellis extending from the input state 0=000; this branch may be viewed as being indexed by the 0 bit input. That is to say: when starting from the input state 0=000, and when receiving as input the bit 0, the encoder will transition to output state 0=000, and a 2 bit, coded output symbol is generated by the encoder having a value of 0=00.

Looking at another example: when the encoder is in the state 0=000, and when a 1 bit input is provided, then the state of the encoder will transition from the input state 0=000 to the output state 2=010. This may be viewed as the state of the encoder transitioning along the $2^{nd}$ possible branch of the trellis extending from the input state 0=000; this branch may be viewed as being indexed by the 1 bit input. That is to say: when starting from the input state 0=000, and when receiving as input the bit 1, the encoder will transition to output state 2=010, and a 2 bit, coded output symbol is generated by the encoder having a value of 3=11.

Looking at another example: when the encoder is in the state 1=001, and when a 1 bit input is provided, then the state of the encoder will transition from the input state 1=001 to the output state 0=000. This may be viewed as the state of the encoder transitioning along the $1^{st}$ possible branch of the trellis extending from the input state 1=001; this branch may be viewed as being indexed by the 1 bit input. That is to say: when starting from the input state 1=001, and when receiving as input the bit 1, the encoder will transition to output state 0=000, and a 2 bit, coded output symbol is generated by the encoder having a value of 3=11.

Looking at another example: when the encoder is in the state 1=001, and when a 0 bit input is provided, then the state of the encoder will transition from the input state 1=001 to the output state 2=010. This may be viewed as the state of the encoder transitioning along the $2^{nd}$ possible branch of the trellis extending from the input state 1=001; this branch may be viewed as being indexed by the 0 bit input. That is to say: when starting from the input state 1=001, and when receiving as input the bit 0, the encoder will transition to output state 2=010, and a 2 bit, coded output symbol is generated by the encoder having a value of 0=00.

The state transitions of this trellis, along the other various braches of the trellis may be understood in reference to these example state transitions.

Figure 13:
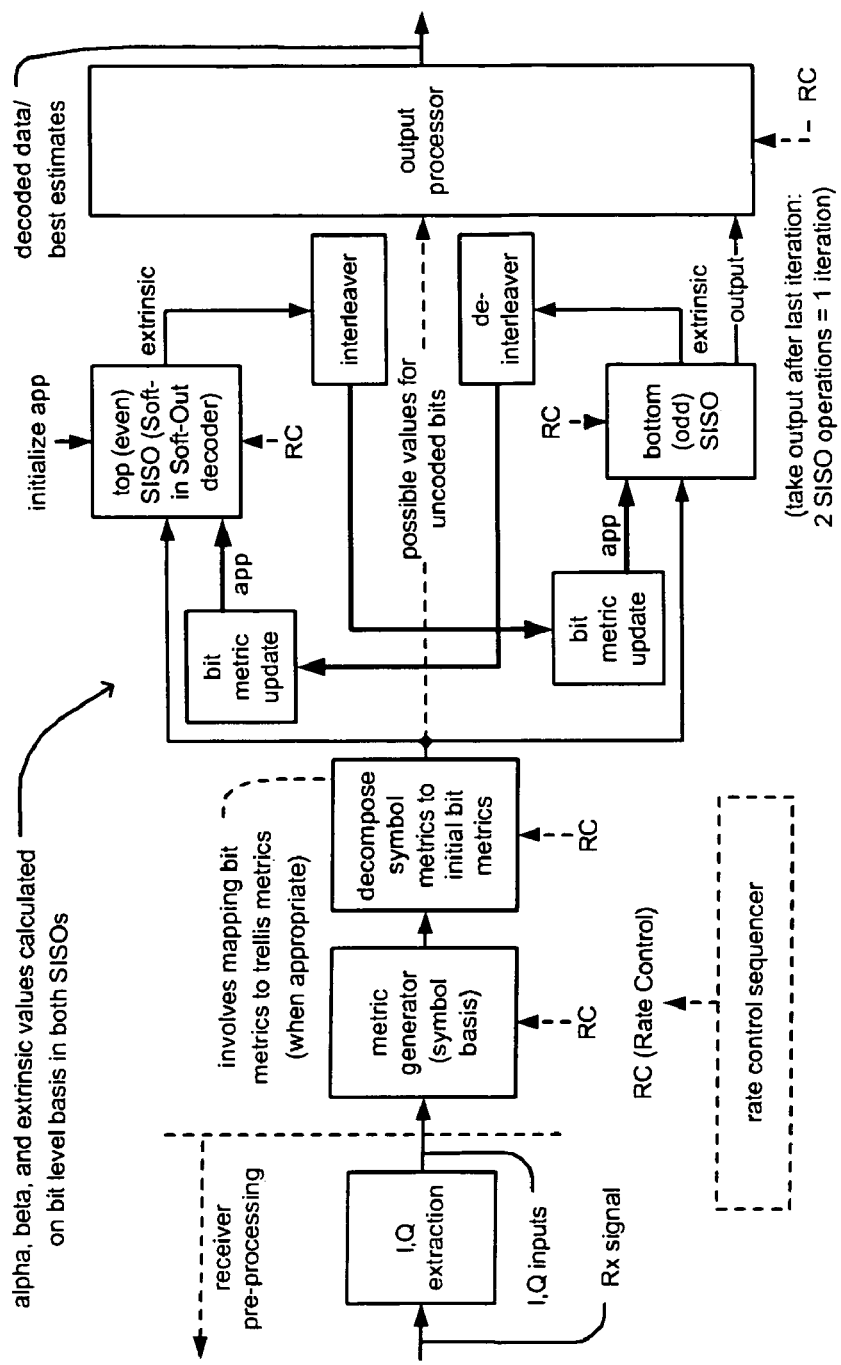
FIG. 13 is a system diagram illustrating an embodiment of a TTCM (Turbo Trellis Coded Modulation) decoder system that is built according to the invention.

FIG. 13 is a system diagram illustrating an embodiment of a TTCM (Turbo Trellis Coded Modulation) decoder system that is built according to the invention. A received signal (shown as Rx signal) is provided to an I,Q extraction functional block that extracts the I,Q (In-phase, Quadrature) components from the received signal that are mapped according to a RC (Rate Control) as determined by a rate control sequencer. This may be viewed as being receiver pre-processing. The I,Q inputs are then mapped according to the modulation's appropriate constellation and mapping. Then, the mapped I,Q is passed to a metric generator that also receives the RC input from the rate control sequencer. The metric generator generates the appropriate metrics that are measured from the received I,Q to the constellation points within the modulation's appropriate constellation and mapping; the metrics are indexed by the mapping of the constellation points within the modulation; these metrics may be viewed as being the scaled Euclidian distances from the location of the actual received symbol to the expected constellation point locations within the modulation. The processing performed by the metric generator is performed on a symbol basis.

After the symbol metrics are calculated by the metric generator, these symbol metrics are output and provided to a decompose symbol metrics to bit metrics functional block that decomposes the symbol metrics into the initial bit metrics for each symbol of the signal. That is to say, the initial values of the metrics for each of the individual bits of the bits of the received symbol are decomposed from the symbol metrics.

Continuing on with the decoding process and functionality, theses initial bit level metrics that are calculated by the decompose symbol metrics to bit metrics functional block are then provided to a top (even) SISO (Soft-In Soft-Out decoder) and simultaneously to a bottom (odd) SISO. Each of these SISOs and calculates forward metrics (alphas) and backward metrics (betas), and extrinsic values according to the trellis employed (such as the trellis shown in the FIG. 12B). These alphas, betas, and extrinsics are then all calculated for each of the individual bits of the symbols that are to be decoded. These calculations of alphas, betas, and extrinsics are all based on the trellis and according to the RC provided by the RC input from the rate control sequencer. Again, these alphas, betas, and extrinsics may all be calculated on a bit level basis. These values may be calculated (directly and indirectly) using the bit metrics decomposed from the symbol metrics; these calculations may also be performed using min* or max* processing without departing from the scope and spirit of the invention.

Starting with the top SISO, after the extrinsic values have been calculated, they are passed to an interleaver. Afterwards these values are passed to a bit metric update functional block. It is noted here that the bit metrics are updated each iteration of the iterative decoding. In contradistinction, the prior art approaches of performing iterative decoding typically use the same symbol metric during each of the iterations of the iterative decoding. After the bit metric values have been updated, then these values are passed to the bottom SISO as APP (a priori probability) information. Similarly, after extrinsic values have been calculated within the bottom SISO, they are passed to a de-interleaver whose output is then passed to another corresponding bit metric update functional block. The output from this bit metric update functional block is then passed back to the top SISO as APP information. It is noted that a single decoding iteration, within the iterative decoding process of the TTCM decoder system consists of performing two SISO operations; that is to say, the iterative decoding process must pass through both the top (even) SISO and through the bottom (odd) SISO.

After a significant level of confidence has been achieved and a solution is being converged upon, or after a predetermined number of decoding iterations have been performed, then the output from the bottom (odd) SISO may then be passed as output to an output processor. The final output from the bottom (odd) SISO may be viewed as being soft bit decisions. That is to say, the operation of the SISOs may generally be referred to as calculating soft bit decisions of the individual bits of the symbols contained within a signal received by the TTCM decoder system. The output processor uses these soft bit decisions to generate hard bit decisions for the input bits that have been encoded at an encoder end of a communication system.

Moreover, there may be situations where one or more uncoded bits u may have been used to generate the symbols that are provided to the TTCM decoder system. The TTCM decoder system is also operable to accommodate the decoding of those uncoded bits u, when appropriate.

Figure 14:
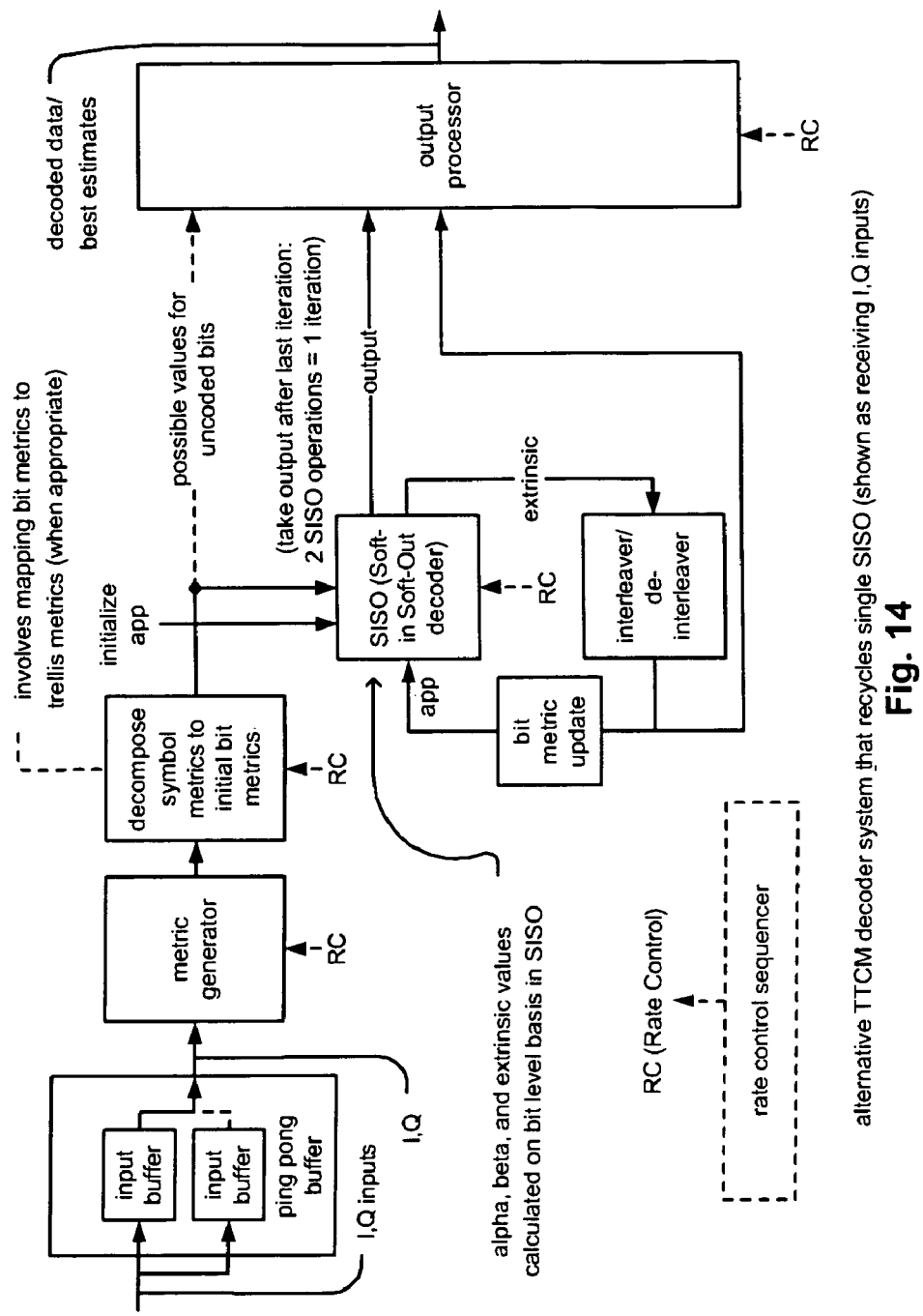
FIG. 14 is a system diagram illustrating an embodiment of an alternative TTCM decoder system that recycles a single SISO according to the invention (shown as receiving I,Q inputs).

FIG. 14 is a system diagram illustrating an embodiment of an alternative TTCM decoder system that recycles a single SISO according to the invention (shown as receiving I,Q inputs). This embodiment may be viewed as a variant of the TTCM decoder system described above that employs two separate SISOs (a top SISO and bottom SISO).

The alternative TTCM decoder system is shown as receiving as input the I,Q from a received signal. It is noted that receiver pre-processing may also be performed in this embodiment as with the other embodiment of a TTCM decoder system described above. For example, an I,Q extraction functional block may also be employed to extract these I,Q inputs within this embodiment. If desired in some embodiments, a ping pong buffer, employing two input buffers, may be employed for efficient buffering of the I,Q inputs. The I,Q inputs are then passed to the metric generator. The functionality of the metric generator may be viewed as being similar to that of the metric generator within the other embodiment of the TTCM decoder system described above.

Also similar to the embodiment described above, after the symbol metrics are calculated by the metric generator, these symbol metrics are output and provided to a decompose symbol metrics to initial bit metrics functional block that decomposes the symbol metrics into the initial values of the bit metrics for each symbol of the signal. That is to say, the initial values of the metrics for each of the individual bits of the bits of the received symbol are decomposed from the symbol metrics.

Continuing on with the decoding process and functionality, theses now bit level metrics that are calculated by the decompose symbol metrics to bit metrics functional block are then provided to a single SISO; the information necessary to perform decoding of any possible uncoded bits (when appropriate) is passed to the output processor. The SISO calculates forward metrics (alphas), backward metrics (betas), and extrinsic values according to the trellis employed and provides them to a functional block that is operable to perform both interleaving and de-interleaving (depending upon which SISO operation is being performed—either the first SISO operation of the single SISO or the second SISO operation of the single SISO). The output of the interleaver/de-interleaver functional block is passed first to an update bit metric functional block and then back to the SISO as APP. Again, it is noted that the values of alphas, betas, and extrinsic values are calculated on a bit level basis within the single SISO of this embodiment. The bit metric values are updated during every iteration of the iterative decoding.

Similar to the embodiment of TTCM decoder system described above, it is again noted that a single decoding iteration, within the iterative decoding process of the alternative TTCM decoder system consists of performing two SISO operations; that is to say, the iterative decoding process must pass through both the SISO once (when the SISO performs the top SISO functionality when referenced to the TTCM decoder system described above) and through the SISO again (when the SISO performs the bottom SISO functionality when referenced to the TTCM decoder system described above).

After a significant level of confidence for the soft bit decisions within the SISO have been achieved and a solution is being converged upon, or after a predetermined number of decoding iterations have been performed, then the soft bit decisions are output from the SISO and passed as output to the output processor. The output processor uses these soft bit decisions to generate hard bit decisions and to provide decoded output data. It is also noted that APP initialization may be performed within this embodiment as well as the other embodiment of TTCM decoder system described above.

Figure 15:
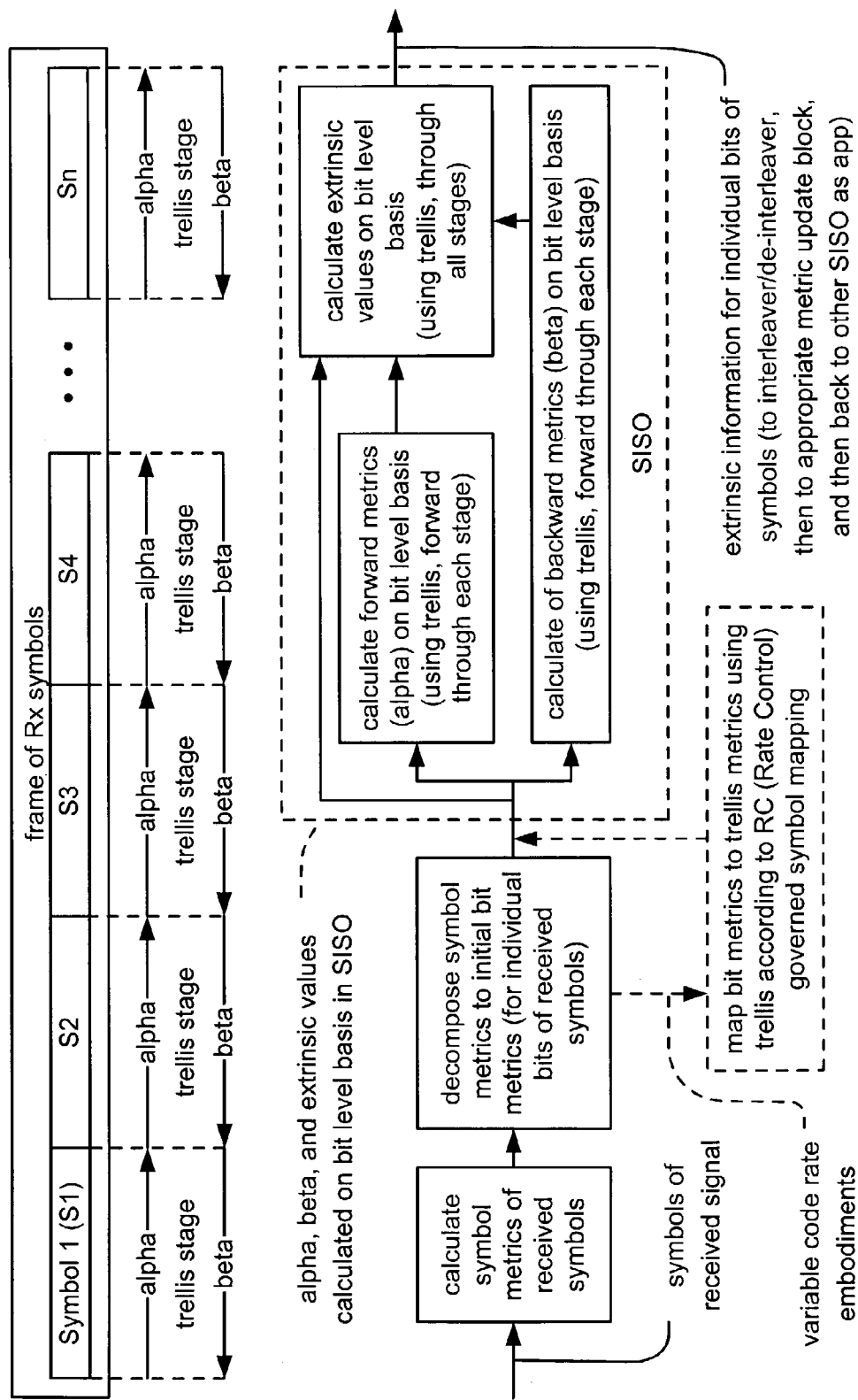
FIG. 15 is a diagram illustrating an embodiment of true bit level decoding functionality according to the invention.

FIG. 15 is a diagram illustrating an embodiment of true bit level decoding functionality according to the invention. This embodiment may be viewed as an embodiment of SISO calculations and operations that are performed according to the invention. For each stage (or each symbol) within a frame of received symbols (or sequence of received symbols), the forward metrics (alphas), the backward metrics (betas), and the extrinsic values are calculated on a bit level basis. The extrinsics value of a stage is a function of the alphas, betas, bit metrics, and APPs of that particular trellis stage.

Symbol metrics are initially calculated for the received symbols of a frame of received symbols (shown as Symbol 1 (S1), S2, S3, S4, . . . , and Sn). These symbol metrics are then decomposed to the initial bit metrics values that are representative of the individual bits of the received symbols.

In some embodiments, these bit metrics are then mapped according to the trellis employed and according to the RCs of the appropriate rate control sequence that corresponds to this received frame of symbols. In this embodiment, these trellis mapped bit metrics (that may be referred to as trellis metrics at this point) are provided to a SISO.

The SISO employs these bit level metrics to calculate the alphas and the betas on a bit level basis. The alphas, betas, and bit metrics are then used to calculate the extrinsic values (or extrinsic information) that are provided back to the other SISO through an appropriate, corresponding bit metric update functional block and then through the other interleaver or de-interleaver (or interleaver/de-interleaver) as appropriate in the particular situation. It is noted that the values of metrics, alphas, betas, and extrinsics are all used to perform the TTCM decoding of the information bits that have been encoded by a TTCM encoder on an encoder end of a communication channel.

Figure 16:
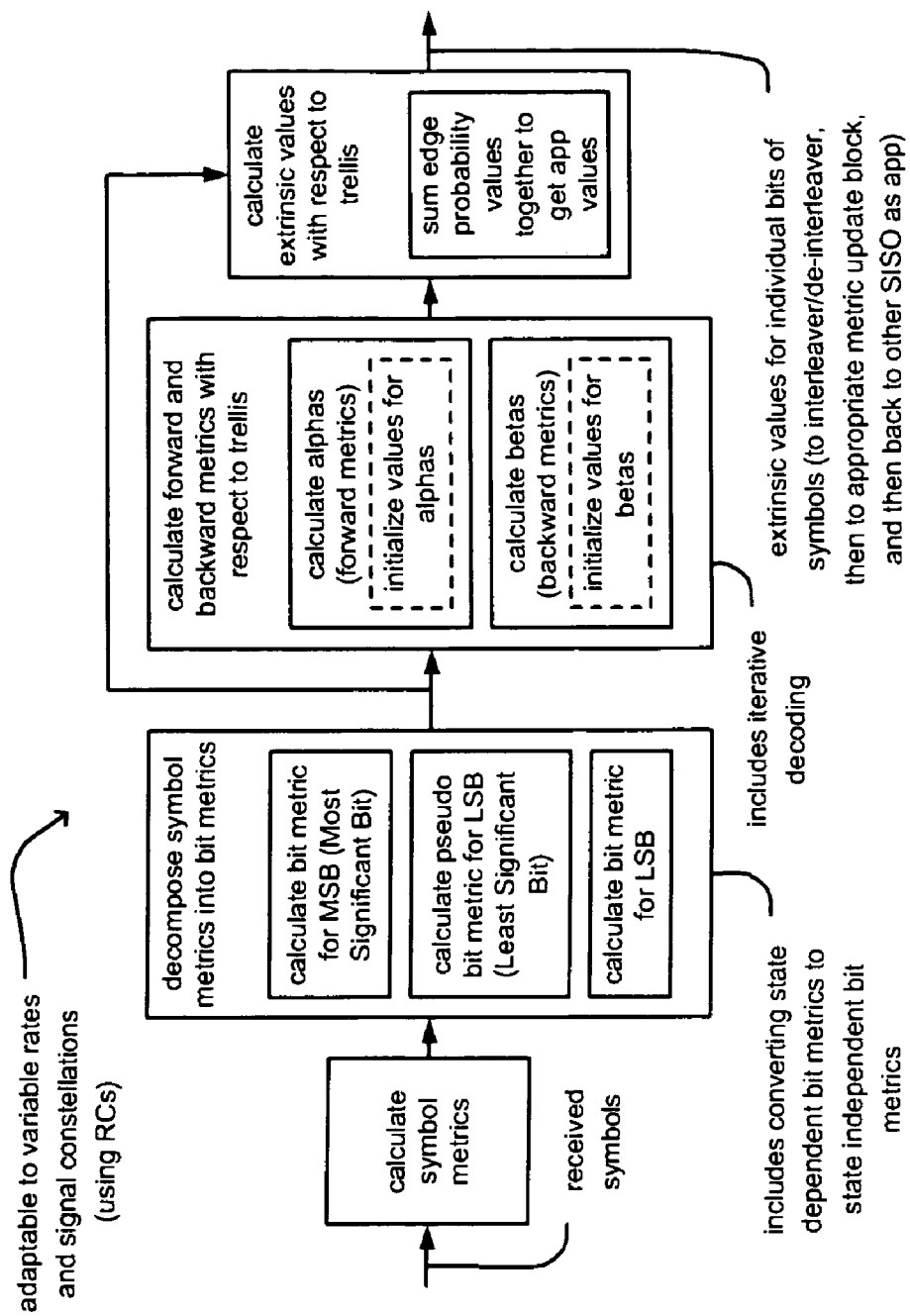
FIG. 16 is a diagram illustrating another embodiment of true bit level decoding functionality according to the invention.

FIG. 16 is a diagram illustrating another embodiment of true bit level decoding functionality according to the invention. This embodiment is shown as receiving symbols that undergo the bit level decoding functionality described herein. Symbol metrics for these received symbols are initially calculated. Afterwards, these symbol metrics are decomposed to generate bit metrics for the individual bits of the received symbols.

This decomposition of the symbol metrics into the bit metrics involves calculating a pseudo bit metric for an LSB (Least Significant Bit) for at least one bit of a received symbol. In addition, the decomposition of the symbol metrics into the bit metrics may involve calculating a bit metric for an LSB for at least one bit of a received symbol as well as calculating a bit metric for an MSB (Most Significant Bit) for at least one bit of a received symbol.

The pseudo metric for the LSB as well as the bit metric for the LSB and the bit metric for the MSB may also be viewed as involving converting the bit metrics to state independent bit metrics. These bit metrics are then provided for use in calculating the forward metrics (alphas) and backward metrics (betas) that are employed when performing iterative decoding of the received symbols; a trellis is employed to calculate these alphas and betas according to the TTCM code employed. This may also involve initialing values for both the alphas and betas to commence the iterative decoding processing.

The bit metrics as well as the alphas and betas that are calculated with respect to the trellis employed in the iterative decoding are employed to calculate extrinsic values with respect to the trellis as well. These extrinsic values that correspond to the individual bits of the symbols are then employed as APP for subsequent iterations of the iterative decoding. This may involve passing the extrinsic values first through a corresponding bit metric update functional block and then through a de-interleaver back to another SISO, or first through a corresponding bit metric update functional block and then through an interleaver/de-interleaver back to the same SISO (depending on the embodiment that is implemented).

It is also noted that the functionality described within this embodiment is also adaptable to accommodate variable rates and signal constellation as directed by the various RCs (that may be arranged in a rate control sequence) and that may be provided by a rate control sequencer.

The functionality of this embodiment may also be described with respect to it being implemented to perform MAP (maximum a posteriori probability) decoding. It is also noted that this bit level decoding functionality is also extendable to TCM (Trellis Coded Modulation) decoding and TTCM (Turbo Trellis Coded Modulation) decoding as well without departing from the scope and spirit of the invention. An approach for MAP decoding is described below.

This example embodiment is based on a rate 1/2 trellis encoder that operates using a systematic code. For this encoder, the following definitions are provided:

1. $S^n(m,i)$: the next state after inputting i to the encoder with the state m;
2. $S^p(m,i)$: the previous state such that with the input i, the next state is m;
3. $r(m,i)$: the redundancy bit by inputting i to the encoder with the state m; from the trellis of the rate 1/2 encoder, the following relationship may be made:

$$r(m,i^c)=r(m,i)^c$$

It is noted here that c denoted complement: if the value is 0, it goes to 1; if the value is 1, it goes to 0.

4. Let $R_0, R_1, \ldots, R_{N-1}$ be a received signal. Then for any modulation signal Y, the probability $P(R_k|Y)$ may be calculated.

For example, for a 8 PSK modulation signal Y, the probability $P(R_k|\text{map}(d_l, d_{l+1}, r(S_l, d_{l+1})))$ may then be calculated and known. It is noted that the map denoted in this probability is associated with the symbol mapper, and not the MAP decoding approach. In addition, these 3 bits ($d_l$, $d_{l+1}$, $r(S_l, d_{l+1})$) may be implemented as the 3 bits of an 8 PSK symbol, and the bit $r(S_l, d_{l+1})$ may be viewed as being a redundancy bit given state $S_l$ and input $d_{l+1}$. Therefore, the received 3 bit symbol at time k may be represented as ($d_{2k}$, $d_{2k+1}$, $r_k$).

When performing the TTCM decoding, it is necessary to determine which branch of the trellis has been actually selected. To do this, the joint probability $E_l(m,i)$ is employed. This value $E_l(m,i)$ represents the joint probability of the input=i at time=l, the state=m, and the received block of symbols=R (where $R_0^{N-1}$ includes all of the symbols of block size N) may be expressed as follows:

$$E_l(m,i)=P(S_{l-1}=m,d_l=i,R_0^{N-1})$$

Within MAP (maximum a posteriori probability) decoding, the goal is to get the maximum value of $E_l(m,i)$.

Borrowing upon this relationship, then the a posteriori probability (represented as a conditional probability $P(d_l=i|R_0^{N-1})$) of the input bit $d_l$ may be represented as follows:

$$P(d_l=i|R_0^{N-1}) = \frac{P(d_l=i, R_0^{N-1})}{P(R_0^{N-1})} = H_0 \sum_m E_l(m, i)$$

This conditional probability $P(d_l=i|R_0^{N-1})$ is representative of the probability that conditional probability the input bit is i at time t=l. The numerator $$P(d_l=i, R_0^{N-1}) \text{ of } \frac{P(d_l=i, R_0^{N-1})}{P(R_0^{N-1})}$$

is representative of the joint probability of both mapping. The denominator $$P(R_0^{N-1}) \text{ of } \frac{P(d_l=i, R_0^{N-1})}{P(R_0^{N-1})}$$

is representative of the probability for this sequence of symbols being the particular sequence of $R_0^{N-1}$. The value $H_0$ is a constant that is used to scale the summed value $$\sum_m E_l(m, i)$$

thereby converting it to a probability (such that all of the terms $E_l(m,i)$ sum to 1.0 when summed across all the m).

To compute the value of $E_l(m,i)$, the following notation is employed.

1. $I_k(i)=P(d_k=i)$ (APP(a priori probability));
2. $M_k(i,j,r)=P(R_k|d_{2k}=i, d_{2k+1}=j, r_k=r)$ (symbol metric);

The bit level metrics are now defined; they may be viewed as being decomposed from symbol metrics.

3. $bM_{2k}(m,i)=P(R_k|S_{2k-1}=m, d_{2k}=i)$ (bit metric for MSB or even bit) this may be viewed as being the probability that a received symbol is valued $R_k$ at a state $2k-1=m$ and input $d_{2k}=i$;
4. $pbM_{2k+1}(m,i)=P(R_k|S_{2k}=m, d_{2k+1}=i)$ (pseudo bit metric for LSB or even bit);
5. $bM_{2k+1}(m,i)=P(d_{2k+1}=i|S_{2k}=m,R_k)/P(d_{2k-1}=i)$ (bit metric for LSB);

The forward metric (alpha) and backward metric (beta) bit level metrics are now defined.

6. $A_{2k}(m)=P(S_{2k-1}=m, R_0^{k-1})$;
7. $A_{2k+1}(m)=P(S_{2k}=m, R_0^k)$;

8. $B_{2k}, (m) = P(R_{k+1}^{N-1} | S_{2k} = m, R_k)$;

9. $B_{2k+1}, (m) = P(R_{k+1}^{N-1} | S_{2k+1} = m, R_k)$.

The definitions of 6. and 7. above are representative of the forward metrics (alphas) with respect to the trellis employed, and the definitions of 8. and 9. above are representative of the backward metrics (betas) with respect to the trellis employed. These are the actual values. It is also noted that the processing of these values may be implemented within the logarithmic domain, as it is much easier to implement in hardware. In the logarithmic domain, multiplication may be implemented as addition, and division may be implemented as subtraction.

Next, an embodiment of the decomposition of the symbol metrics into the bit metrics is illustrated (this illustration is still within the context of MAP (maximum a posteriori probability) decoding.

Firstly, the decomposition of the symbol metric to a bit metric for the MSB of a received symbol is shown below. This involves calculation of a bit metric of the MSB based on the symbol metric that corresponds to the received symbol that includes the MSB.

$$bM_{2k}(m, i) = P(R_k | S_{2k-1} = m, d_{2k} = i) \quad \text{(MSB bit metric)}$$
$$= \sum_{j=0}^{1} P(R_k, d_{2k+1} = j | S_{2k-1} = m, d_{2k} = i)$$
$$= \sum_{j=0}^{1} P(d_{2k+1} = j) P(R_k | S_{2k-1} = m, d_{2k} = i, d_{2k+1} = j)$$
$$= \sum_{j=0}^{1} I_{2k+1}(j) M_k(i, j, r(S^n(m, i), j))$$

Secondly, the decomposition of the symbol metric to a pseudo bit metric for the LSB of a received symbol is shown below. This involves calculation of a pseudo bit metric of the LSB based on the symbol metric that corresponds to the received symbol that includes the LSB.

$$pbM_{2k+1}(m, i) = P(R_k | S_{2k} = m, d_{2k+1} = i) \quad \text{(LSB pseudo bit metric)}$$
$$= \sum_{j=0}^{1} P(R_k, d_{2k} = j | S_{2k} = m, d_{2k+1} = i)$$
$$= \sum_{j=0}^{1} P(d_{2k} = j) P(R_k | S_{2k} = m, d_{2k} = j, d_{2k+1} = i)$$
$$= \sum_{j=0}^{1} I_{2k}(j) M_k(i, j, r(m, i))$$

Thirdly, the decomposition of the symbol metric to a bit metric for the LSB of a received symbol is shown below. This involves calculation of a bit metric of the LSB based on the symbol metric that corresponds to the received symbol that includes the LSB.

$$bM_{2k+1}(m, i) = \frac{P(d_{2k+1} = i | S_{2k} = m, R_k)}{P(d_{2k+1} = i)}$$ (LSB bit metric)

$$= \frac{P(d_{2k+1} = i, R_k | S_{2k} = m)}{I_{2k+1}(i) P(R_k | S_{2k} = m)}$$

$$= \frac{P(d_{2k+1} = i, R_k | S_{2k} = m)}{I_{2k+1}(i)[P(d_{2k+1} = 0, R_k | S_{2k} = m) + P(d_{2k+1} = 1, R_k | S_{2k} = m)]}$$

$$= \frac{bPm_{2k+1}(m, i)}{I_{2k+1}(0) bPm_{2k+1}(m, 0) + I_{2k+1}(1) bPm_{2k+1}(m, 1)}$$

These 3 equations represent the calculations that may be performed to calculated the bit metric for the MSB, the pseudo bit metric for the LSB, and the bit metric for the LSB. This allows for the decomposition of the symbol metrics to true bit metrics that may be used within the true bit level decoding according to the invention. In this example embodiment described here, this allows for a true bit level MAP (maximum a posteriori probability) decoding as opposed to the symbol level MAP decoding performed in the prior art. It is also noted that these equations still include information pertaining to the state of the trellis. Below, state independent metrics are employed; these state independent metrics are decomposed from the state dependent metrics.

Based on the equations for the pseudo bit metric for the LSB and the bit metric for the LSB, the following redundant relationship may be made:

$$bM_{2k+1}(m,i) = I_{2k+1}(i) M_k(i,i,r(S^n(m,i),i)) + I_{2k+1}(i^c) M_k(i, i^c, r(S^n(m,i),i)^c)$$

This will allow for a reduction in the number of calculations that need to be performed when performing MAP decoding.

According to the above equations, it is found that only 4 (four) possible different values of $bM_{2k+1}(m,i), m=0, \ldots, 7$ and $i=0,1$. Were no redundancy in the terms of the various equations found, then all 16 possible values would need to be calculated. This results in a reduction of 16 possible value to a total of only 4 possible values to be calculated: a reduction by a factor of 4. These 4 possible values of $bM_{2k+1}(m,i)$ are shown as follows:

$1^{st}$ possible value: $I_{2k+1}(0) M_k(0,0,0) + I_{2k+1}(1) M_k(0,1,1)$
$2^{nd}$ possible value: $I_{2k+1}(0) M_k(0,0,1) + I_{2k+1}(1) M_k(0,1,0)$
$3^{rd}$ possible value: $I_{2k+1}(1) M_k(1,1,0) + I_{2k+1}(0) M_k(1,0,1)$
$4^{th}$ possible value: $I_{2k+1}(1) M_k(1,1,1) + I_{2k+1}(0) M_k(1,0,0)$ All 4 of these possible values of $bM_{2k+1}(m,i)$ may be calculated and then distributed to the appropriate 16 values.

Another transformation may then be made to decompose state independent metrics from the state dependent metrics. Given the following relationship:

$$bM_{2k}(m,i) = bM_{2k+1}(m',i) \text{ if } r(S^n(m,i),i) = r(S^n(m',i),i).$$

Using this relationship, state independent metrics $sibM_{2k}(i,r)$ may be defined as follows:

$$sibM_{2k}(i,r) = I_{2k+1}(i) M_k(i,i,r) + I_{2k+1}(i^c) M_k(i,i^c,i^c)$$

Therefore, the relationship between the bit metric and the state independent metric may be represented as follows:

$$bM_{2k}(m,i) = sibM_{2k}(i, r(S^n(m,i),i))$$

From here forward, the calculations of the bit metrics and pseudo bit metrics are all performed using state independent metrics.

It is also noted that the redundancy bit r is nevertheless still a function of the state according to the code indirectly. In addition, the bit metric is a function of the redundancy bit r implicitly and the input bit i explicitly. As a reminder, the redundancy bit r is a function of the state and the input bit i. Therefore, the bit metric is no longer a function of the state directly; it is implicitly a function of the state.

A comparison of the reduction in computations that must be performed (when decoding a code generated using a rate 1/2 trellis) may be made as follows:

When using the state dependent bit metrics: 16 different values would need to be calculated for the MSB, 16 different values would need to be calculated for the LSB, and 16 values for the redundancy bit.

When using the state independent bit metrics: 4 different values would need to be calculated for the MSB, 4 different values would need to be calculated for the LSB, and 4 values for the redundancy bit.

The use of the state independent bit metrics greatly reduces the number of calculations that must be made for each information bit. This reduction is made possible based on the properties of the trellis employed by the code.

Additional simplification may similarly may performed to calculate the bit metric for the LSB, $bM_{2k+1}(i,r)$, using the pseudo bit metric for the LSB, $pbM_{2k+1}(i,r)$, as an intermediary step.

This may be performed by defining the pseudo bit metric for the LSB, $pbM_{2k+1}(i,r)$, as follows:

$$pbM_{2k+1}(i,r) = I_{2k}(0) M_k(0,i,r) + I_{2k}(1) M_k(1,i,r).$$

Based on this, the following relationship may be made:

$$pbM_{2k+1}(m,i) = pbM_{2k+1}(i,r(m,i))$$

It then follows that the equation used to calculate the bit metric for the LSB, $bM_{2k+1}(i,r)$, may be expressed in terms of the pseudo bit metric for the LSB, $pbM_{2k+1}(i,r)$. In other words, the bit metric for the LSB, $bM_{2k+1}(i,r)$, may be calculated as a function of the pseudo bit metric for the LSB, $pbM_{2k+1}(i,r)$, as follows:

$$bM_{2k+1}(i, r) = \frac{pbM_{2k+1}(i, r)}{I_{2k+1}(i) pbM_{2k+1}(i, r) + I_{2k+1}(i^c) pbM_{2k+1}(i^c, r^c)},$$

since $r(m, 0) = r(m, 1)^c$.

In addition, when considering the denominator of the equation used to calculated the bit metric for the MSB, $bM_{2k}(i,r)$, (that is described further above) with the denominator of the equation that expresses the bit metric for the LSB, $bM_{2k+1}(i,$ r), as a function of the pseudo bit metric for the LSB, $pbM_{2k+1}(i,r)$, (that is described just above), some additional reductions may be made.

$$I_{2k+1}(i)pbM_{2k+1}(i,r)+I_{2k+1}(i^c)pbM_{2k+1}(i^c,r^c)$$

$$=I_{2k+1}(i)I_{2k}(0)M_k(0,i,r)+I_{2k}(1)M_k(1,i,r))$$

$$+I_{2k+1}(i^c)(I_{2k}(0)M_k(0,i^c,r^c)+I_{2k}(1)M_k(1,i^c,r^c))$$

$$=I_{2k}(0)[I_{2k+1}(i)M_k(0,i,r)+I_{2k+1}(i^c)M_k(0,i^c,r^c)]$$

$$+I_{2k}(1)[I_{2k+1}(i)M_k(1,i,r)+I_{2k+1}(i^c)M_k(1,i^c,r^c)]$$

$$=I_{2k}(i)bM_{2k}(i,r)+I_{2k+1}(i^c)bM_{2k}(i^c,r^c)$$

Borrowing upon this relationship, the equation for the bit metric of the LSB may be expressed as follows:

$$bM_{2k+1}(i,r) = \frac{I_{2k}(0)M_k(0,i,r)+I_{2k}(1)M_k(1,i,r)}{I_{2k}(i)bM_{2k}(i,r)+I_{2k+1}(i^c)bM_{2k}(i^c,r^c)}$$

This shows how the bit metric for the LSB may be calculated using the symbol metric, $M_{2k}(i,j,r)$, and the bit metric for the MSB, $bM_{2k+1}(i,r)$.

Referring again to the FIG. 16, these calculation operations made above may be viewed as being performed within the functional block that decomposes symbol metrics into bit metrics. Continuing on with the example embodiment of performing MAP (maximum a posteriori probability) decoding, the calculation of the forward and backward metrics with respect to the trellis (employed by the code) is performed.

The forward metrics (alphas), $A_k(m)$, and the backward metrics (alphas), $B_k(m)$, are then calculated as described below. While the examples shown here are dealing with real numbers (and not in the logarithmic domain), it is noted that.

Initially, the initial values for the alphas defined as follows:
1. $A_0(m_0)=1$ (this is the first alpha); and
2. $A_0(m)=0$ if $m_0$ is the initial state and $m \ne m_0$ (these are all of the other alphas).

Now, once the alphas are initialized, the iterative processing may be performed forward through the frame. Each subsequent alpha value is based on the previous alpha value. For example, a subsequent alpha, $A_{2k+1}(m)$, is a function of a previous alpha, $A_{2k}(m)$.

$$A_{2k+1}(m) = P(S_{2k}=m, R_0^k) = \sum_{i=0}^{I} P(S_{2k}=m, d_{2k}=i, R_0^k)$$

$$= \sum_{i=0}^{1} P(S_{2k-1}=S^p(m,i), d_{2k}=i, R_0^{k-1}, R_k)$$

$$= \sum_{i=0}^{1} P(S_{2k-1}=S^p(m,i), R_0^{k-1})P(d_{2k}=i, R_k|S_{2k-1}=S^p(m,i))$$

$$= \sum_{i=0}^{1} A_{2k}(S^p(m,i))I_{2k}(i)bM_{2k}(S^p(m,i),i)$$

$$= \sum_{i=0}^{1} A_{2k}(S^p(m,i))I_{2k}(i)bM_{2k}(i,r(m,i))$$

Analogously, within the next iteration, the subsequent alpha, $A_{2k+2}(m)$, is a function of this previous alpha, $A_{2k+1}(m)$.

$$A_{2k+2}(m) = P(S_{2k+1}=m, R_0^k)$$

$$= \sum_{i=0}^{1} P(S_{2k+1}=m, d_{2k+1}=i, R_0^k)$$

$$= \sum_{i=0}^{1} P(S_{2k}=S^p(m,i), d_{2k+1}=i, R_0^k, R_{k+1})$$

$$= \sum_{i=0}^{1} P(S_{2k}=S^p(m,i), R_0^k)P(d_{2k+1}=i, R_0^k|S_{2k}=S^p(m,i))$$

$$= \sum_{i=0}^{1} A_{2k+1}(S^p(m,i))I_{2k+1}(i)bM_{2k+1}(S^p(m,i),i)$$

$$= \sum_{i=0}^{1} A_{2k+1}(S^p(m,i))I_{2k+1}(i)bM_{2k+1}(i, r(S^p(m,i),i))$$

Continuing on with the calculations of the betas: initially, the initial values for the betas defined as follows:
1. $B_{N-1}(m_{N-1})=1$ (this is the last beta); and
2. $B_{N-1}(m)=0$ if $m_{N-1}$ is the final state and $m \ne m_{N-1}$ (these are all of the other betas).

Now, once the betas are initialized, the iterative processing may be performed backward through the frame. Each earlier beta value is based on the later beta value. For example, an earlier beta, $B_{2k}(m)$, is a function of a later beta, $B_{2k+1}(m)$.

$$B_{2k}(m) = P(R_{k+1}^{N-1}|S_{2k}=m, R_k)$$

$$= \sum_{i=0}^{1} P(R_{k+1}^{N-1}, d_{2k+1}=i|S_{2k}=m, R_k)$$

$$= \sum_{i=0}^{1} P(d_{2k+1}=i|S_{2k}=m, R_k)P(R_{k+1}^{N-1}|S_{2k}=m, d_{2k+1}=i, R_k)$$

$$= \sum_{i=0}^{1} I_{2k+1}(i)bM_{2k+1}(m,i)P(R_{k+1}^{N-1}|S_{2k+1}=S^n(m,i))$$

$$= \sum_{i=0}^{1} I_{2k+1}(i)bM_{2k+1}(m,i)B_{2k+1}(S^n(m,i))$$

$$= \sum_{i=0}^{1} I_{2k+1}(i)bM_{2k+1}(i,r(m,i))B_{2k+1}(S^n(m,i))$$

Analogously, within the previous iteration, the earlier beta, $B_{2k+1}(m)$, is a function of this later beta, $B_{2k+2}(m)$.

$$B_{2k+1}(m) = P(R_{k+1}^{N-1} \mid S_{2k+1} = m)$$

$$= \sum_{i=0}^{1} P(R_{k+1}^{N-1}, d_{2k+2} = i \mid S_{2k+1} = m)$$

$$= \sum_{i=0}^{1} P(d_{2k+2} = i, R_{k+1} \mid S_{2k+1} = m) P(R_{k+2}^{N-1} \mid S_{2k+1} = m, d_{2k+2} = i, R_{k+1})$$

$$= \sum_{i=0}^{1} P(d_{2k+2} = i, R_{k+1} \mid S_{2k+1} = m) P(R_{k+2}^{N-1} \mid S_{2k+2} = S^n(m, i), R_{k+1})$$

$$= \sum_{i=0}^{1} I_{2k+2}(i) b M_{2k+2}(m, i) B_{2k+2}(S^n(m, i))$$

$$= \sum_{i=0}^{1} I_{2k+2}(i) b M_{2k+2}(i, r(S^n(m, i), i)) B_{2k+2}(S^n(m, i))$$

Next, once the alphas and betas have been calculated, the extrinsic values may be calculated using them. This may be viewed as calculating the probability that a particular branch (edge) was actually selected within the trellis. Once all of the extrinsic values, $E_s$, are calculated for all of the states, m, and all of the inputs, i, then these values are summed together and are used to generate 2 a posteriori probability values that are representative, respectively, of the probabilities that an information input bit is equal to one or zero (e.g., i=1 and i=0). Of these two possible values, the maximum value is selected according to the MAP (maximum a posteriori probability) decoding approach.

As a brief review of the processing described above, the a posteriori probability (scaled by $H_0$) is calculated as follows:

$$P(d_l = i \mid R_0^{N-1}) = \frac{P(d_l = i, R_0^{N-1})}{P(R_0^{N-1})} = H_0 \sum_m E_l(m, i)$$

The iterative processing of the terms, $E_l(m,i)$, may be described as follows:

$$E_{2k}(m) = P(S_{2k-1} = m, d_{2k} = i, R_0^{N-1})$$

$$= P(S_{2k-1} = m, R_1^{k-1}) P(d_{2k} = i, R_k, R_{k+1}^{N-1} \mid S_{2k-1} = m, R_0^{k-1})$$

$$= A_{2k}(m) P(d_{2k} = i, R_k \mid S_{2k-1} = m) P(R_{k+1}^{N-1} \mid S_{2k-1} = m, d_{2k} = i, R_0^k)$$

$$= A_{2k}(m) I_{2k}(i) b M_{2k}(m, i) P(R_{k+1}^{N-1} \mid S_{2k} = S^n(m, i), R_k)$$

$$= A_{2k}(m) I_{2k}(i) b M_{2k}(i, r(S^n(m, i), i)) B_{2k}(S^n(m, i))$$

Again, the iterative decoding processing is operable to calculate a current value using a previous value. In this embodiment, a subsequent value, $E_{2k+1}(m,i)$, is a function of an earlier value, $E_{2k}(m,i)$.

$$E_{2k+1}(m) = P(S_{2k} = m, d_{2k+1} = i, R_0^{N-1})$$

$$= P(S_{2k} = m, R_0^k) P(d_{2k+1} = i, R_k, R_{k+1}^{N-1} \mid S_{2k} = m, R_0^k)$$

$$= A_{2k+1}(m) P(d_{2k+1} = i, R_k \mid S_{2k} = m, R_k) P(R_{k+1}^{N-1} \mid S_{2k} = m, d_{2k+1} = i, R_0^k)$$

$$= A_{2k+1}(m) I_{2k+1}(i) b M_{2k+1}(m, i) P(R_{k+1}^{N-1} \mid S_{2k+1} = S^n(m, i))$$

$$= A_{2k+1}(m) I_{2k+1}(i) b M_{2k+1}(i, r(m, i)) B_{2k+1}(S^n(m, i))$$

It is again noted that the specific implementation described in this embodiment is for MAP (maximum a posteriori probability) decoding of a rate 1/2 trellis TTCM. For another rate code, the appropriate decoding equations may be found using a similar approach. A performance analysis of this rate 1/2 trellis TTCM is described below.

Figure 17:
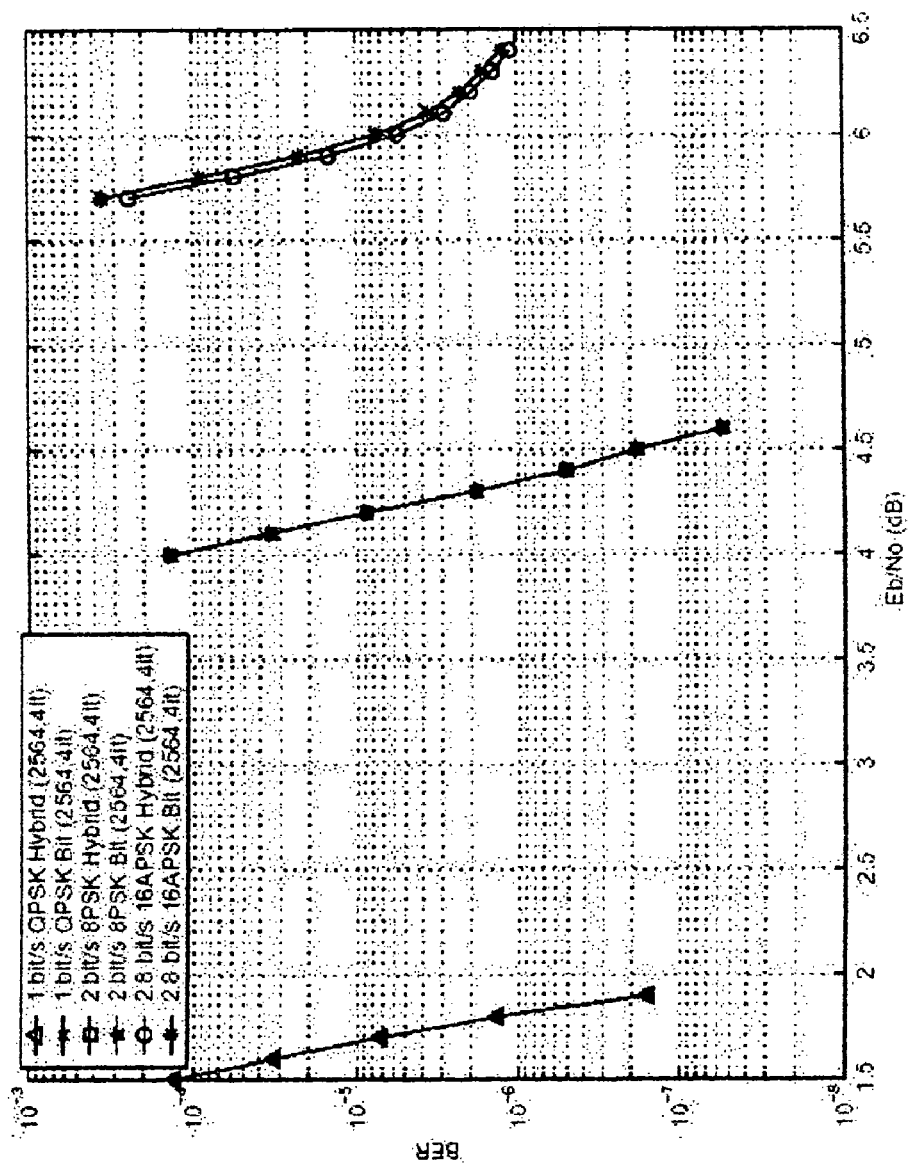
FIG. 17 is a diagram illustrating an embodiment of performance of TTCM (Turbo Trellis Coded Modulation) according to the invention.

FIG. 17 is a diagram illustrating an embodiment of performance of TTCM (Turbo Trellis Coded Modulation) code according to the invention. These performance curves are described in the context of BER (Bit Error Rate) versus $E_b/N_o$ (ratio of energy per bit $E_b$ to the Spectral Noise Density $N_o$). This term $E_b/N_o$ is the measure of SNR (Signal to Noise Ratio) for a digital communication system.

These performance curves show 3 different modulation encoding approaches: QPSK (Quadrature Phase Shift Key) modulation, 8 PSK (8 Phase Shift Key) modulation, and 16 APSK (16 Asymmetric Phase Shift Keying) modulation. For each of the QPSK, 8 PSK, and 16 APSK modulations, a hybrid decoding approach and a bit level decoding approach are compared. The hybrid decoding approach may be viewed as an approach that performs decoding using symbol level decoding in addition to comes degree of bit level decoding.

For the QPSK and the 8 PSK modulations, there is no degradation in performance. For example, for the QPSK modulation (for both the hybrid decoding approach and the bit level decoding approach) a minimum $E_b/N_o$ of approximately 1.5 dB is achieved at a BER of approximately $10^{-5}$. in addition, for the 8 PSK modulation (for both the hybrid decoding approach and the bit level decoding approach) a minimum $E_b/N_o$ of approximately 4.2 dB is achieved at a BER of approximately $10^{-5}$. For each of these QPSK and 8

PSK modulations, no discernible performance degradation is seen when performing decoding using the bit level decoding according to the invention.

For the 16 APSK modulation, the bit level decoding, when compared to the hybrid decoding approach, incurs a performance degradation of approximately 0.05 dB. However, such small performance degradation may be completely tolerable in some embodiments and applications.

Several of the next embodiments show how bit level decoding may be performed that does not perform calculation of symbol metrics, as an intermediate step, using the I,Q components of a received symbol. In contradistinction, several of these embodiments are able to perform direct calculation of the bit metrics for use in performing bit level decoding according to the invention.

It is noted here that several of the exemplary embodiments illustrate how these decoding calculations may be performed in the logarithmic domain where multiplications may be reduced to additions and divisions may be reduced to subtractions.

Figure 18:
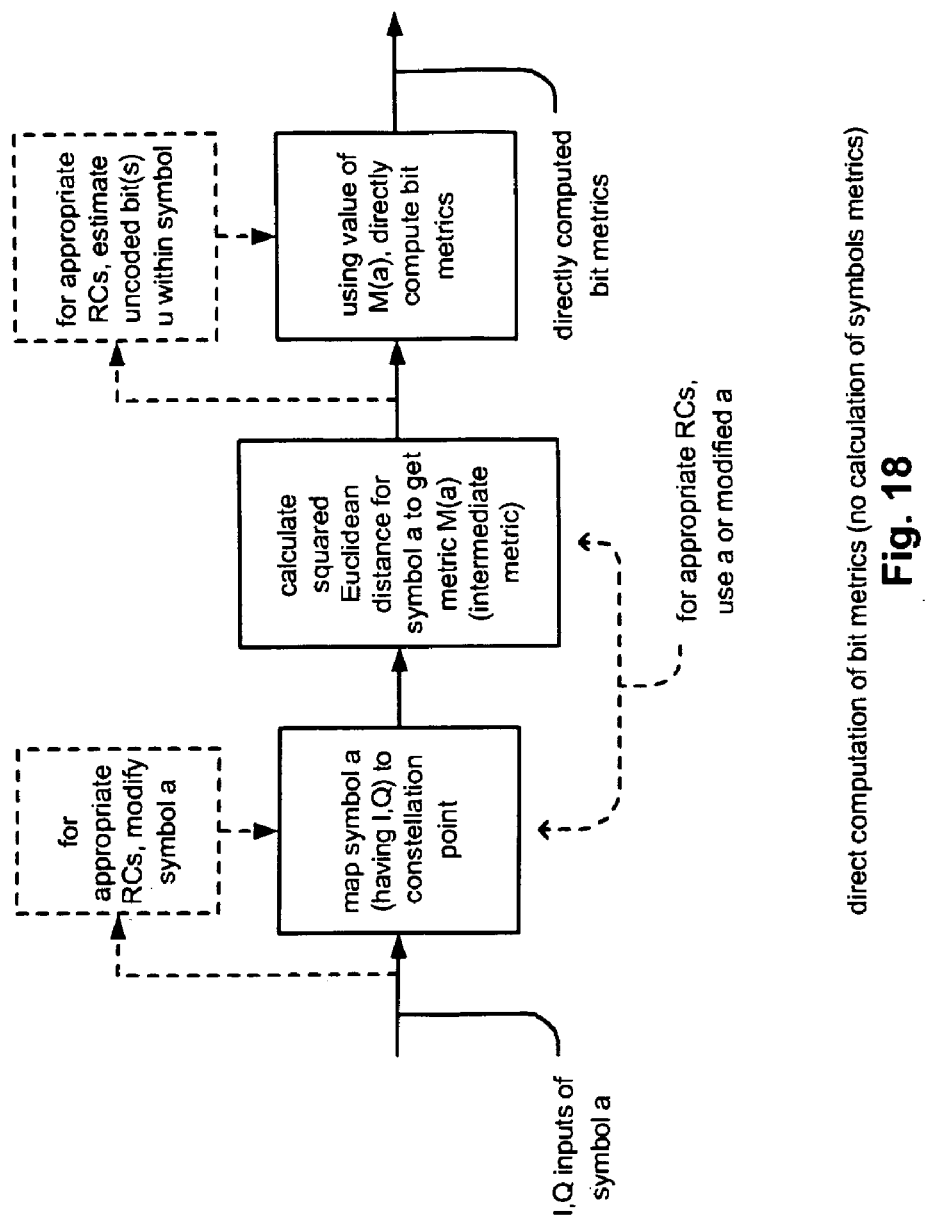
FIG. 18 is a diagram illustrating an embodiment of direct computation of bit metrics (that involve no calculation of symbol metrics) according to the invention.

FIG. 18 is a diagram illustrating an embodiment of direct computation of bit metrics (that involve no calculation of symbol metrics) according to the invention. This embodiment is shown as receiving the I,Q inputs of a received symbol a. In some embodiments, the symbol a is modified to ã (or modified a) for the appropriate RCs (as is described with respect to one embodiment below).

The symbol a is then mapped to a constellation point depending on the modulation employed. For example, for an 8 PSK modulation, the symbol a is mapped to a constellation point in the 8 PSK constellation.

Then, the squared Euclidean distance for the symbol a is calculated to get an intermediate metric M(a).

This squared Euclidean distance for the symbol a may be calculated as follows:

$$\text{squared Euclidean distance} = (I_R - I_{coeff})^2 + (Q_R - Q_{coeff})^2$$

The I,Q components of the received symbol a are shown as: $I_R, Q_R$.

The I,Q constellation coefficients for the modulation are shown as: $I_{coeff}, Q_{coeff}$.

The scaling of the distance by $$\left(\frac{1}{2\sigma^2}\right)$$

(where sigma ($\sigma$) is the standard deviation of the normalized noise of the received symbol) accommodates for the normalized noise of the received symbol in determining this distance to generate a scaled squared Euclidean distance as follows:

$$\text{scaled squared Euclidean distance} = \left(\frac{1}{2\sigma^2}\right)((I_R - I_{coeff})^2 + (Q_R - Q_{coeff})^2)$$

It is noted that this intermediate metric M(a) is not a symbol metric in the traditional sense. This intermediate metric M(a) is a metric that is employed to perform direct calculation of the bit metrics without having to calculate all of the corresponding symbol metrics for all of the possible constellation points within a modulation.

It is noted that the mapping of the symbol a to the appropriate constellation point and the calculation of the squared Euclidean distance may involve employing ã (or the modified a) as appropriately directed based on the RC associated with the symbol. In addition, for the appropriate RCs, an estimation of any uncoded bit(s) u may also be performed for the symbol. Then, using the intermediate metric M(a), the bit metrics are directly calculated.

To illustrate in even more detail the functionality of the direct calculation of the bit metrics, an example embodiment employing a rate 2/3 TTCM code is described below. A received symbol (a 3 bit symbol in the rate 2/3 TTCM code embodiment) is mapped to an appropriate constellation point. A communication receiver receives a signal (I,Q) which corresponds the received signal with its corresponding noise. Given a 3 bit symbol a=(i,j,r) this symbol is then mapped to a constellation signal and then the squared Euclidean distance is computed to get the intermediate metric M(a) for the symbol a. Again, the calculation of this intermediate metric M(a) depends on the RC that corresponds to that symbol.

When the RC is 0, 2, 5, 6, 7, 8, the symbol a is modified to be ã (or modified a) as follows:

$$\tilde{a} = \begin{cases} a, & RC = 0 \\ (i, j), & RC = 2 \\ (j, r), & RC = 5 \\ (i, j), & RC = 6 \\ (r), & RC = 7 \\ (i, j), & RC = 8 \end{cases}$$

Clearly, this modification of the symbol a to be ã (or modified a) some degree of bit re-arrangement/re-ordering and/or puncturing (discarding of one or more of the bits of the symbol a) may be performed.

Figure 19:
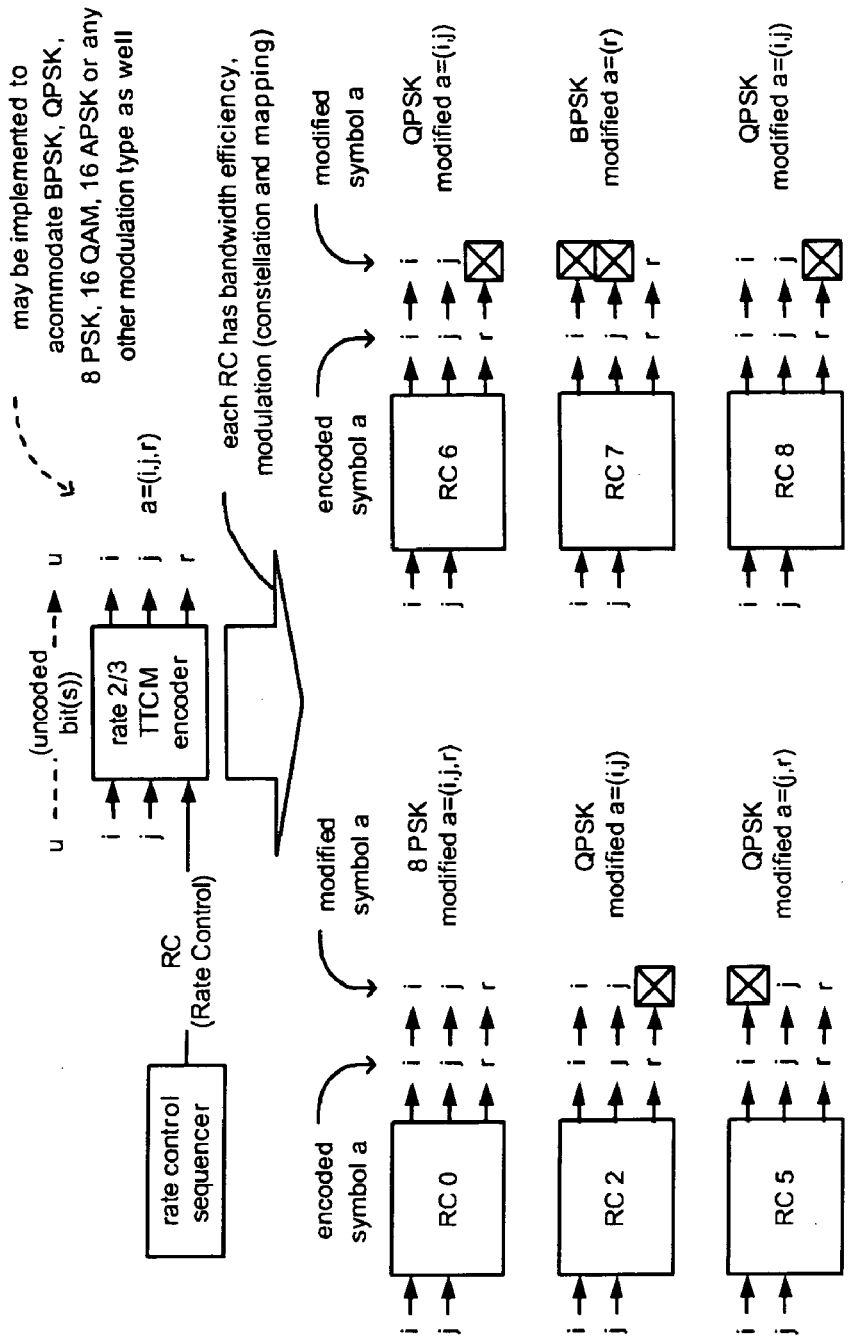
FIG. 19 is a diagram illustrating an embodiment of modification of symbols of a rate 2/3 TTCM based on RCs (Rate Controls) according to the invention.

FIG. 19 is a diagram illustrating an embodiment of modification of symbols of a rate 2/3 TTCM based on RCs (Rate Controls) according to the invention. The modification of the symbol a to be ã (or modified a) may be better understood when considering a rate 2/3 TTCM encoder that receives as input 2 information bits (i,j), and outputs 3 encoded bits that may be viewed as the 3 bit symbol a=(i,j,r); in addition, one or more uncoded bit(s) u may be employed in the rate 2/3 TTCM encoder as well. Depending on the RC (received from a rate control sequencer), the symbol a output by the encoder may be modified to be ã (or modified a).

Looking at some specific examples, when the encoder operates at the RC 0, 2 information bits (i,j) are provided to the encoder, the symbol a=(i,j,r) is then generated and is then provided to a bit level decoder (e.g., via a communication channel), and the received symbol a is then unmodified and mapped to according to an 8 PSK modulation governed by RC 0 (e.g., an 8 PSK shaped constellation and a mapping associated with the RC 0).

However, when the encoder operates at the RC 2, 2 information bits (i,j) are provided to the encoder, the unmodified symbol a=(i,j,r) is then modified to be a 2 bit symbol ã=(i,j). This 2 bit symbol ã=(i,j) is then provided to a bit level decoder and mapped to according to a QPSK modulation governed by RC 2 (e.g., a QPSK shaped constellation and a mapping associated with the RC 2).

For a BPSK example, when the encoder operates at the RC 7, 2 information bits (i,j) are provided to the encoder, the unmodified symbol a=(i,j,r) is then modified to be a 1 bit symbol (or simply to 1 bit) ã=(r). This 1 bit symbol ã=(r) is then provided to a bit level decoder and mapped to according to a BPSK modulation governed by RC 7 (e.g., a BPSK shaped constellation (e.g., 2 points on an axis) and a mapping associated with the RC 7).

The modification of the symbol a to be ã (or modified a) is similarly performed as appropriately shown within the FIG. 19.

Figure 20:
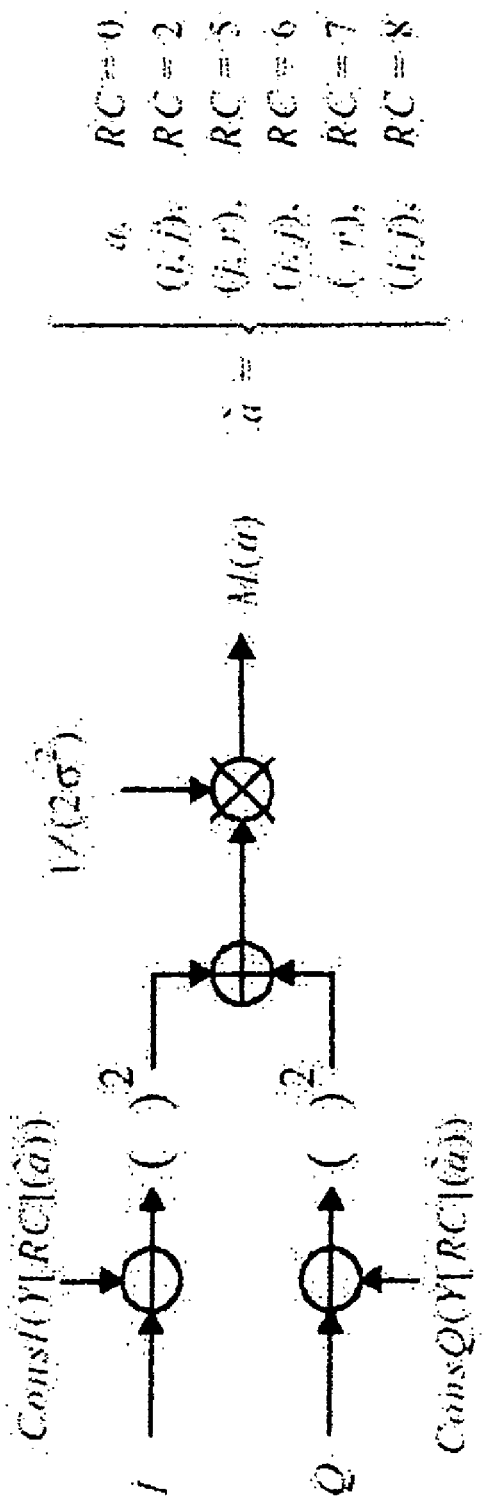
FIG. 20 is a diagram illustrating an embodiment of intermediate metric M(a) calculation for RCs: 0, 2, 6, 8 and RCs: 5, 7 with a=ã according to the invention. This embodiment shows how the calculation of the FIG. 21 is a diagram illustrating another embodiment of modification of symbols of a rate 2/3 TTCM based on RCs (Rate Controls) according to the invention.

FIG. 20 is a diagram illustrating an embodiment of intermediate metric M(a) calculation for RCs: 0, 2, 6, 8 and RCs: 5, 7 with a=ã according to the invention. This embodiment shows how the calculation of the intermediate metric M(a) may be performed. The signal mapping Y that is governed by a corresponding RC may be represented as Y[RC].

In addition, the I,Q values of the constellation mapping is represented in this embodiment as ConsI( ) and ConsQ( ). Then the intermediate metric M(a) for RC=0, 2, 6, 8 and RC=5, 7 with a=ã (of a being modified to be ã) can be computed as follows:

The difference between the I,Q values and the I,Q values of the constellation mapping (e.g., ConsI( ) and ConsQ( )) are squared and summed together. This values is then scaled by $$\left(\frac{1}{2\sigma^2}\right)$$

(where sigma ($\sigma$) is the standard deviation of the normalized noise) to accommodate for the normalized noise of the received symbol in determining this intermediate metric M(a).

It is also noted that for the RCs 5 and 7, the determination of the intermediate metric M(a) may be handled a little bit differently. This is based on the fact that the format of the modified symbol ã is known in advance. Specifically, for RC 5: ã=(0,j,r), and for RC 7: ã=(0,0,r). When the modified symbol ã is not in this format (e.g., when a≠ã), then the intermediate metric M(a) may be set directly to be a MAX value (or a maximum value of a metric) thereby indicating that this is highly unlikely to be the proper value (e.g., set M(a)=MAX). This may provide for some degree of efficiency in terms of the fact that the intermediate metric M(a) need not be calculated when this situation arises.

Figure 21:
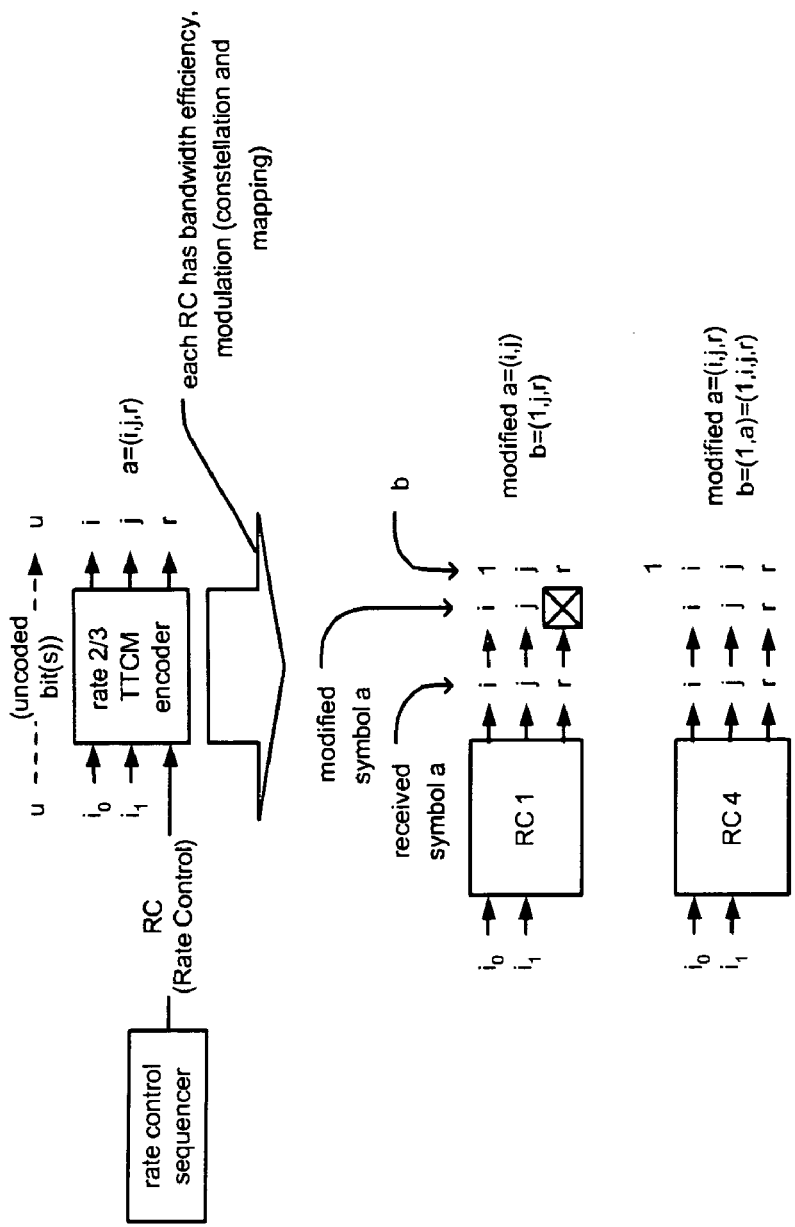

FIG. 21 is a diagram illustrating another embodiment of modification of symbols of a rate 2/3 TTCM based on RCs (Rate Controls) according to the invention. This embodiment illustrates the two examples of the RC 1 and RC 4

When the encoder operates at the RC 1, 2 information bits ($i_0 i_1$) are provided to the encoder, the unmodified symbol a=(i,j,r) is then modified to be a 2 bit symbol ã=(i,j) and another value is also generated b=(1,i,j). These 2 values are then employed to calculate the corresponding 2 values for m(x) (e.g., m(ã) where x=ã and m(b) where x=b). These two resultant values then undergo min* processing (or max* processing if desired in alternative embodiments) to generate the intermediate metric M(a) (e.g., M(a)=min*(m(ã),m(b))).

When the encoder operates at the RC 4, 2 information bits ($i_0 i_1$) are provided to the encoder, the unmodified symbol a=(i,j,r) remains unmodified and another value is also generated b=(1,a)=(1,i,j,r). These 2 values are then employed to calculate the corresponding 2 values for m(x) (e.g., m(ã) where x=ã and m(b) where x=b). These two resultant values then undergo min* processing (or max* processing if desired in alternative embodiments) to generate the intermediate metric M(a) (e.g., M(a)=min*(m(ã),m(b))).

Figure 22:
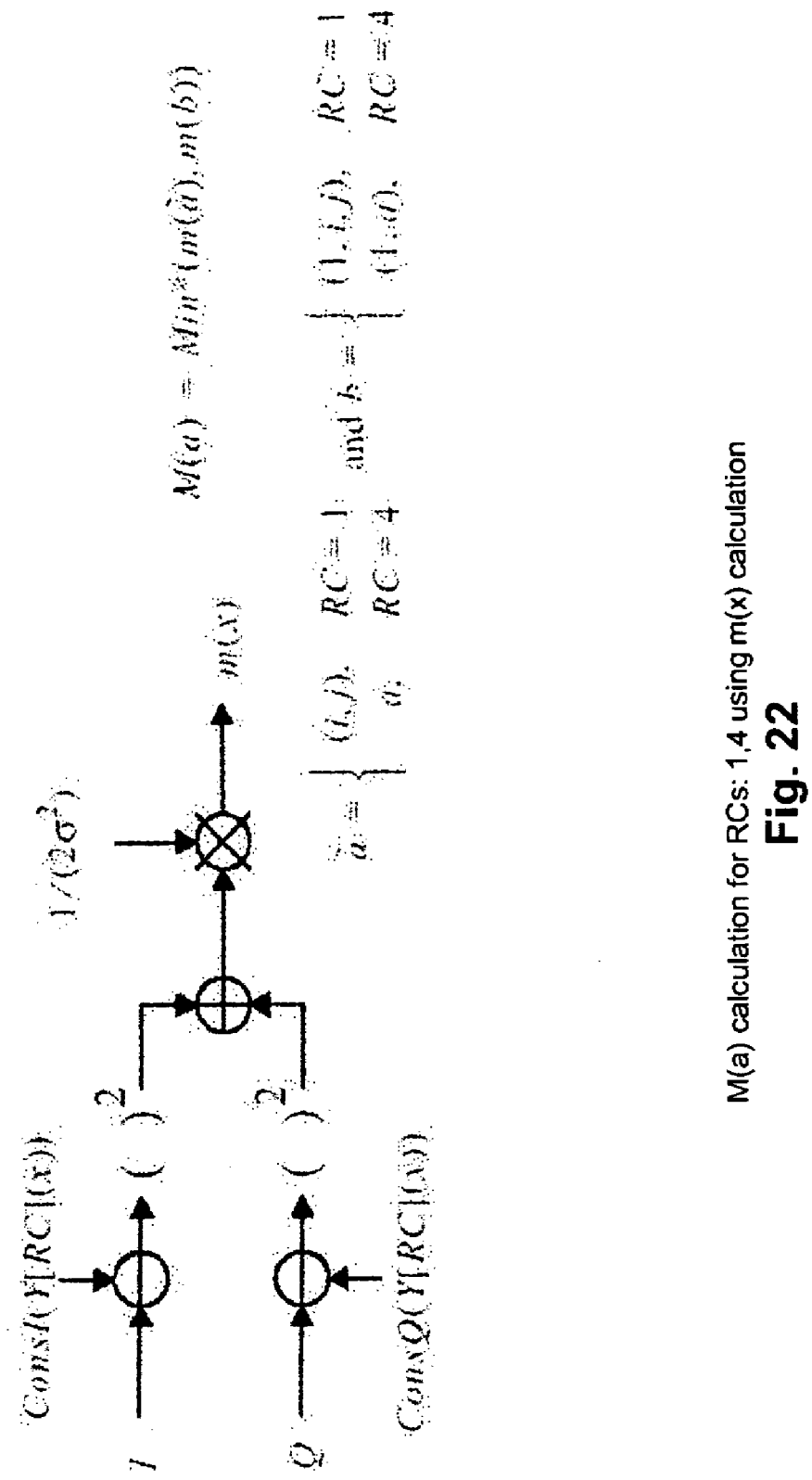
FIG. 22 is a diagram illustrating an embodiment of intermediate metric M(a) calculation for RCs: 1, 4 using m(x) calculation according to the invention.

FIG. 22 is a diagram illustrating an embodiment of intermediate metric M(a) calculation for RCs: 1,4 using m(x) calculation according to the invention. For the RCs 1 and 4, the symbol a is modified to be ã (or modified a) and the additional value b is generated as follows:

RC 1: ã=(i,j) and b=(1,i,j)

RC 4: ã=(a)=(i,j,r) and b=(1,a)=(1,i,j,r)

This embodiment shows how the calculation of the intermediate metric M(a) may be performed for these RCs. Again, the signal mapping Y that is governed by a corresponding RC may be represented as Y[RC].

In addition, the I,Q values of the constellation mapping is represented in this embodiment as ConsI( ) and ConsQ( ). Then the intermediate metric M(a) for RC=0, 2, 6, 8 and RC=5, 7 with a=ã (of a being modified to be ã) can be computed as follows:

The difference between the I,Q values and the I,Q values of the constellation mapping (e.g., ConsI( ) and ConsQ( )) are squared and summed together. This values is then scaled by $$\left(\frac{1}{2\sigma^2}\right)$$

(where sigma ($\sigma$) is the standard deviation of the normalized noise) to accommodate for the normalized noise of the received symbol in determining the 2 values for m(x) (e.g., m(ã) where x=ã and m(b) where x=b). Again, these two resultant values then undergo min* processing (or max* processing if desired in alternative embodiments) to generate the intermediate metric M(a) (e.g., M(a)=min*(m(ã),m(b))).

A brief review of the min* and max* processing operations is provided here.

For example, min* processing includes determining a minimum value from among two values (e.g., shown as min (A,B) in min* processing) as well as determining a logarithmic correction factor (e.g., shown as $\ln(1+e^{-|A-B|})$) in min* processing) in selecting the smaller metric. In addition, it is also noted that max* processing may alternatively be performed. The max* processing operation also includes a logarithmic correction in selecting the larger metric. It is noted that the various embodiments of the invention may be implemented using the max* operations in lieu of the min* operation when preferred in a given implementation.

The min* processing, when operating on inputs A and B, may be expressed as follows:

$$\min^*(A,B)=\min(A,B)-\ln(1+e^{-|A-B|})$$

The max* processing, when operating on inputs A and B, may be expressed as follows:

$$\max^*(A,B)=\max(A,B)+\ln(1+e^{-|A-B|})$$

In the particular embodiment described above, the values of m(ã) and m(b) undergo min* processing. Clearly, max* processing could be sued in an alternative embodiment. The min* processing of these values may be represented as follows:

$$\min^*(m(\tilde{a}),m(b))=\min(m(\tilde{a}),m(b))-\ln(1+e^{-|m(\tilde{a})-m(b)|})$$

After the intermediate metric M(a) has been calculated above for the appropriate RC (this includes calculating any uncoded bits as necessary) and using the appropriate approach (that may include modifying symbol a to be ã (or modified a) as well as employing m(ã) and m(b)), the bit metrics are calculated using the corresponding intermediate metric M(a).

Therefore, with the value M(a), the appropriate bit metrics may then calculated. The complement of a binary symbol i is defined as follows:

$$i^c = \begin{cases} 1, & i = 0 \\ 0, & i = 1 \end{cases}$$

FIG. 23A is a diagram illustrating an embodiment of calculation of the natural log (ln) bit metric for an MSB (Most Significant Bit) according to the invention. This embodiment shows how APP information value for a binary bit i, prior $P_{2k+1}(i)$, and the APP value of the complement of the binary bit i (e.g., $i^c$), prior$P_{2k+1}(i^c)$, are employed to calculate the natural log (ln) of the bit metric for the MSB of a symbol, bMetric$_{2k}(i,r)$ (also shown as bM$_{2k}(i,r)$ above in some of the other embodiments). As a reminder, a redundant bit or parity bit is represented as r, with its complement being represented as $r^c$. In addition, the metric, M(i,i,r), and a corresponding complementary metric, M(i,$i^c$,$r^c$), are also employed.

The APP information value, prior$P_{2k+1}(i)$, is summed with the metric, M(i,i,r). In addition, complementary APP information value, prior$P_{2k+1}(i^c)$, is summed with the corresponding complementary metric, M(i,$i^c$,$r^c$). These two resultant values undergo min* processing to generate the value of the natural log (ln) of the bit metric for the MSB of a symbol, bMetric$_{2k}(i,r)$.

FIG. 23B is a diagram illustrating an embodiment of calculation of the natural log (ln) bit metric for an LSB (Least Significant Bit) according to the invention. The APP information value for a binary symbol being value 0, prior$P_{2k}(0)$, and the APP information value for a binary symbol being value 1, prior$P_{2k}(1)$, are employed in addition to the APP information value for a binary bit i, prior$P_{2k}(i)$, and the APP value of the complement of the binary bit i (e.g., $i^c$), prior$P_{2k}(i^c)$. Various metrics are employed, based on the values of binary bit i (and its complementary value $i^c$) as well as values of binary bit r (and its complementary value $r^c$); these metrics are shown as the metric value for when the MSB is equal to 0, M(0,i,r), and the metric value for when the MSB is equal to 1, M(1,i,r), as well as the MSB bit metric bMetric$_{2k}(i,r)$, and the complementary value of the MSB bit metric bMetric$_{2k}(i^c,r^c)$.

As can be seen in this embodiment, prior$P_{2k}(0)$ and M(0,i,r) are summed together to form first result. In addition, prior$P_{2k}(1)$ and M(1,i,r) are summed together to form a second result. This first result and this second result undergo min* processing to generate a first min* result.

Simultaneously, bMetric$_{2k}(i,r)$ and prior$P_{2k}(i)$ are summed together to form third result. In addition, bMetric$_{2k}(i^c,r^c)$ and prior$P_{2k}(i^c)$ are summed together to form a fourth result. This third result and this fourth result undergo min* processing to generate a second min* result.

The second min* result is subtracted from the first min* result to generate the value of the natural log (ln) of the bit metric for the LSB of a symbol, bMetric$_{2k+1}(i,r)$.

As described above with respect to some of the other embodiments, the bit metric for the LSB, bMetric$_{2k+1}(i,r)$, is calculated using the bit metric for the MSB, bMetric$_{2k}(i,r)$.

Figure 24:
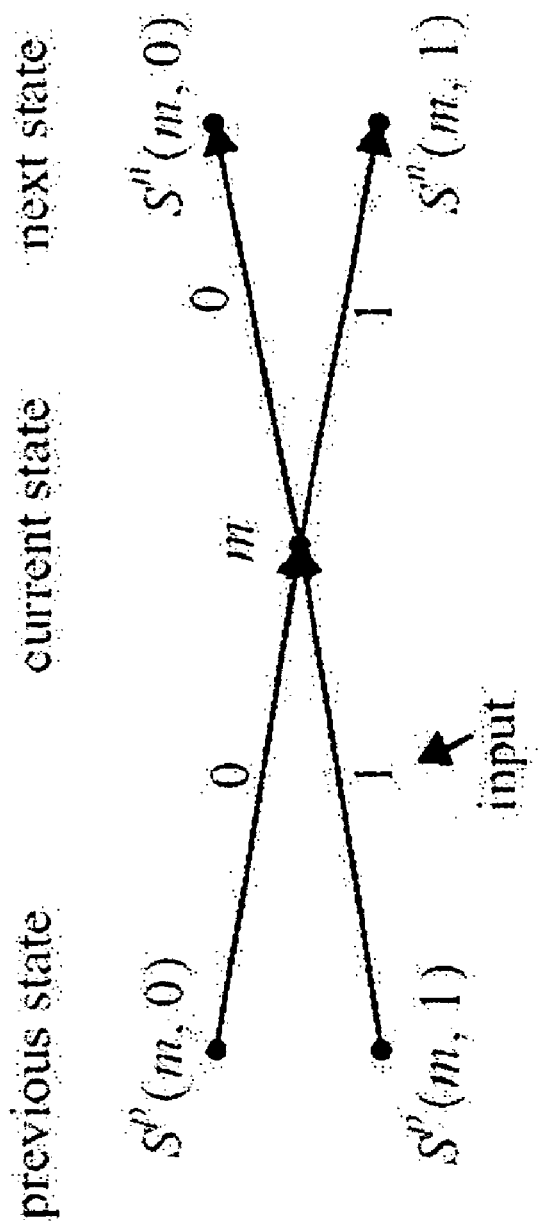
FIG. 24 is a diagram illustrating an embodiment of state transitions for a rate 1/2 trellis encoder according to the invention.

FIG. 24 is a diagram illustrating an embodiment of state transitions for a rate 1/2 trellis encoder according to the invention. Using the bit metrics bMetric$_j(i,r)$ (for both the LSB and the MSB of the symbol), the forward metric (alpha=$\alpha$) and the backward metric (beta=$\beta$) calculations may then be performed. Various possible embodiments of how this is performed are described below.

In the FIG. 24, the previous state, $S^p(m,i)$, and the next state, $S^n(m,i)$, is defined for a rate 1/2 encoder with state m and input information bit i.

For example, when the rate 1/2 encoder is in a previous state m such that the encoder receives as input the information bit i=0, the previous state may be represented as state $S^p(m,0)$, and the next state may be represented as, $S^n(m,0)$. Similarly, when the rate 1/2 encoder is in a previous state m such that the encoder receives as input the information bit i=1, the previous state may be represented as state $S^p(m,1)$, and the next state may be represented as, $S^n(m,1)$.

Before performing the iterative decoding to calculate the actual values of the forward metrics (alpha=$\alpha$), they may be initialized as follows:

Using this approach that employs min* processing, the initial values for the forward metrics (alpha=$\alpha$) defined as follows:

1. $\alpha_0(0)$=0 (this is the first alpha); and
2. $\alpha_0(m)$=MAX if $m_0$ is the initial state and $m \neq m_0$ (these are all of the other alphas). This value is set to MAX, or the maximum value possible for the metric.

Figure 25A:
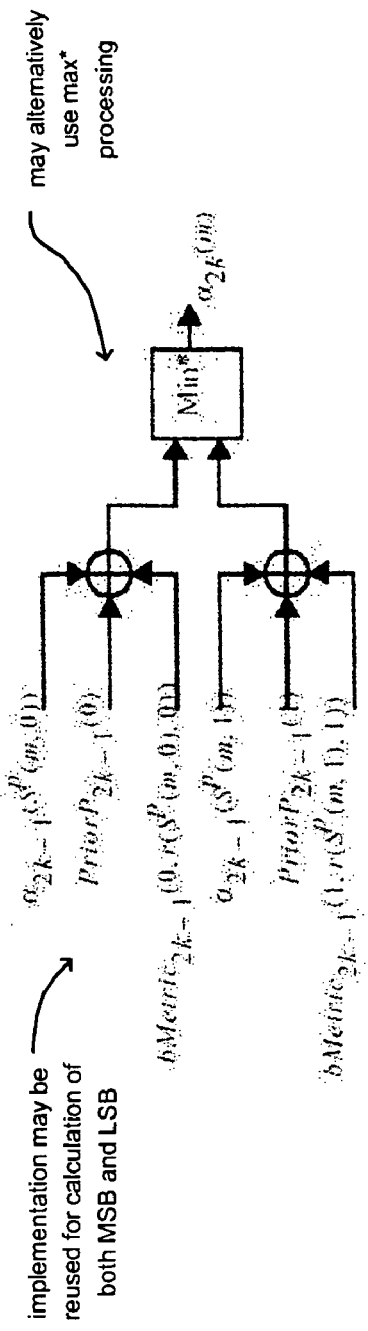
FIG. 25A is a diagram illustrating an embodiment of bit level calculation of the natural log (ln) of forward metric (alpha) for an MSB (Most Significant Bit) according to the invention.

FIG. 25A is a diagram illustrating an embodiment of bit level calculation of the natural log (ln) of forward metric (alpha) for an MSB (Most Significant Bit) according to the invention.

In this embodiment, several values are employed that correspond to an input of information bit i=0:

1. $\alpha_{2k-1}(S^p(M,0))$: the previous alpha value corresponding to the previous state of $S^p(m,0)$ and corresponding to i=0.
2. prior$P_{2k-1}(0)$: the APP value of the previous MSB corresponding to i=0.
3. bMetric$_{2k-1}(0,r(S^p(m,0)),0)$: the bit metric of the previous symbol corresponding to the previous state of $S^p(m,0)$ and corresponding to i=0.

These 3 values are all summed together to generate a first result.

In addition, several other values are employed that correspond to an input of information bit i=1:

1. $\alpha_{2k-1}(S^p(m,1))$: the previous alpha value corresponding to the previous state of $S^p(m,1)$ and corresponding to i=1.
2. prior$P_{2k-1}(1)$: the APP value of the previous MSB corresponding to i=1.
3. bMetric$_{2k-1}(1,r(S^p(m,1)1)$: the bit metric of the previous symbol corresponding to the previous state of $S^p(m,1)$ and corresponding to i=1.

These 3 values are all summed together to generate a second result.

The first result and the second result undergo min* processing to generate the alpha value for the current MSB (again, using the values of the previous MSB) for state m, shown as $\alpha_{2k}(m)$.

This embodiment that is employed to calculate the forward metric (alpha=$\alpha$) may be reused to perform the calculation of both the MSB and the LSB without departing from the scope and spirit of the invention. For example, if a serial is implemented, then the information for the MSB may first be calculated, and then the same hardware implementation may be used to calculate such information for the LSB as described below. Alternatively, two separate portions of hardware may also be implemented without departing from the scope and spirit of the invention.

Figure 25B:
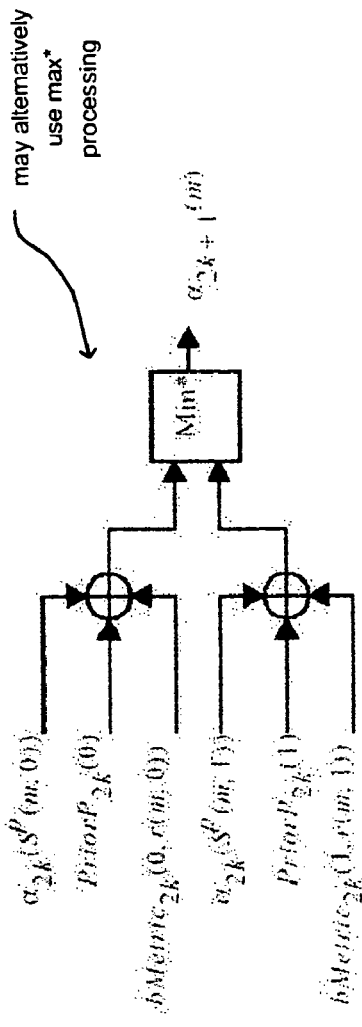
FIG. 25B is a diagram illustrating an embodiment of bit level calculation of the natural log (ln) of forward metric (alpha) for an LSB (Least Significant Bit) according to the invention.

FIG. 25B is a diagram illustrating an embodiment of bit level calculation of the natural log (ln) of forward metric (alpha) for an LSB (Least Significant Bit) according to the invention.

In this embodiment, several values are employed that correspond to an input of information bit i=0:

1. $\alpha_{2k}(S^p(m,0))$: the previous alpha value corresponding to the previous state of $S^p(m,0)$ and corresponding to i=0.

2. priorP$_{2k}$(0): the APP value of the previous LSB corresponding to i=0.

3. bMetric$_{2k}$(0,r(m,0)): the bit metric of the previous LSB corresponding to i=0.

These 3 values are all summed together to generate a first result.

In addition, several other values are employed that correspond to an input of information bit i=1:

1. $\alpha_{2k}(S^p(m,1))$: the previous alpha value corresponding to the previous state of $S^p(m,1)$ and corresponding to i=1.

2. priorP$_{2k}$(1): the APP value of the previous LSB corresponding to i=1.

3. bMetric$_{2k}$(1,r(m,1)): the bit metric of the previous LSB corresponding to i=1.

These 3 values are all summed together to generate a second result.

The first result and the second result undergo min* processing to generate the alpha value for the current LSB (again, using the values of the previous LSB) for state m, shown as $\alpha_{2k+1}(m)$.

Using this approach that employs min* processing, the initial values for the backward metrics (beta=$\beta$) defined as follows:

1. $\beta_{n-1}(0)=0$ (this is the last beta); and
2. $\beta_{n-1}(m)=$MAX if $m_0$ is the initial state and $m \neq m_0$ (these are all of the other betas). This value is set to MAX, or the maximum value possible for the metric. In addition, n is indicative of the bit-block size.

Figure 26A:
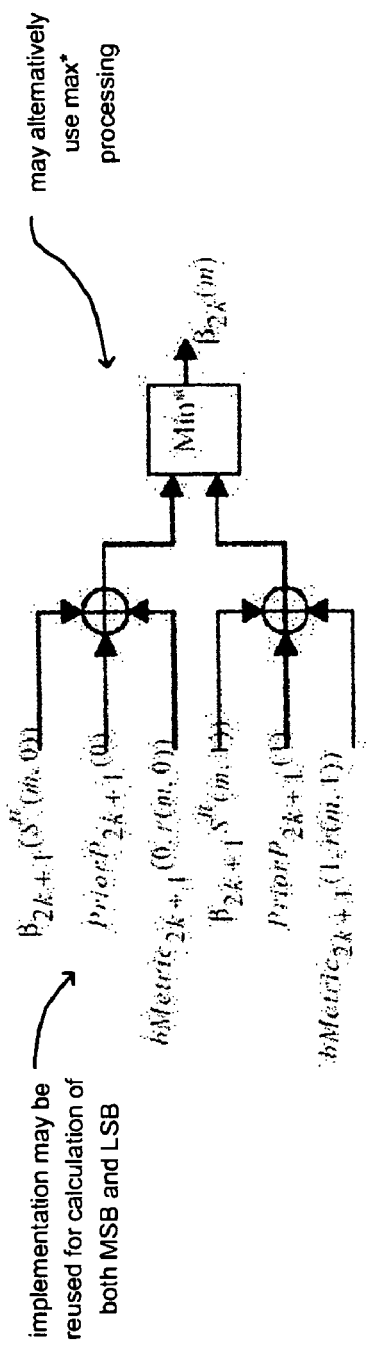
FIG. 26A is a diagram illustrating an embodiment of bit level calculation of the natural log (ln) of backward metric (beta) for an MSB (Most Significant Bit), according to the invention.

FIG. 26A is a diagram illustrating an embodiment of bit level calculation of the natural log (ln) of backward metric (beta) for an MSB (Most Significant Bit) according to the invention.

In this embodiment, several values are employed that correspond to an input of information bit i=0:

1. $\beta_{2k+1}(S''(m,0))$: the next beta value corresponding to the next state of $S''(m,0)$ and corresponding to i=0.

2. priorP$_{2k+1}$(0): the APP value of the next MSB corresponding to i=0.

3. bMetric$_{2k+1}$(0,r(m,0)): the bit metric of the next MSB corresponding to i=0.

These 3 values are all summed together to generate a first result.

In addition, several other values are employed that correspond to an input of information bit i=1:

1. $\beta_{2k+1}(S''(m,1))$: the next beta value corresponding to the next state of $S''(m,1)$ and corresponding to i=1.

2. priorP$_{2k+1}$(1): the APP value of the next MSB corresponding to i=1.

3. bMetric$_{2k+1}$(1,r(m,1)): the bit metric of the next MSB corresponding to i=1.

These 3 values are all summed together to generate a second result.

The first result and the second result undergo min* processing to generate the beta value for the current MSB for state m, shown as $\beta_{2k}(m)$.

As with the embodiments described above that are employed to calculate the forward metric (alpha=$\alpha$), this embodiment that is used to calculate backward metric (beta=$\beta$) may be reused to perform the calculation of both the MSB and the LSB without departing from the scope and spirit of the invention. For example, if a serial is implemented, then the information for the MSB may first be calculated, and then the same hardware implementation may be used to calculate such information for the LSB as described below. Alternatively, two separate portions of hardware may also be implemented without departing from the scope and spirit of the invention.

Figure 26B:
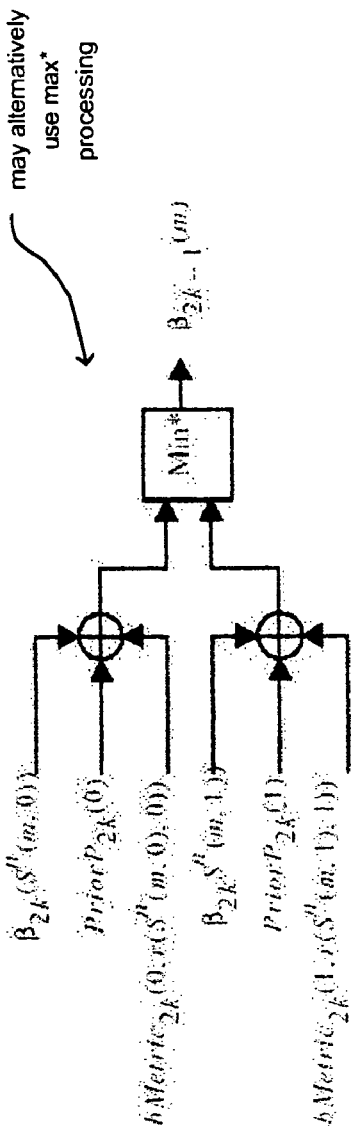
FIG. 26B is a diagram illustrating an embodiment of bit level calculation of the natural log (ln) of backward metric (beta) for an LSB (Least Significant Bit) according to the invention.

FIG. 26B is a diagram illustrating an embodiment of bit level calculation of the natural log (ln) of backward metric (beta) for an LSB (Least Significant Bit) according to the invention.

In this embodiment, several values are employed that correspond to an input of information bit i=0:

1. $\beta_{2k}(S''(m,0))$: the next beta value corresponding to the next state of $S''(m,0)$ and corresponding to i=0.

2. priorP$_{2k}$(0): the APP value of the next LSB corresponding to i=0.

3. bMetric$_{2k}$(0,r(S''(m,0))0): the bit metric of the next LSB corresponding to the next state of $S''(m,0)$ and corresponding to i=0.

These 3 values are all summed together to generate a first result.

In addition, several other values are employed that correspond to an input of information bit i=1:

1. $\beta_{2k}(S''(m,1))$: the next beta value corresponding to the next state of $S''(m,1)$ and corresponding to i=1.

2. priorP$_{2k}$(1): the APP value of the next LSB corresponding to i=1.

3. bMetric$_{2k}$(1,r(S''(m,1),1): the bit metric of the next LSB corresponding to the next state of $S''(m,1)$ and corresponding to i=1.

These 3 values are all summed together to generate a second result.

The first result and the second result undergo min* processing to generate the beta value for the current LSB for state m, shown as $\beta_{2k-1}(m)$.

Finally, once the forward metrics (alpha=$\alpha$) and the backward metrics (beta=$\beta$) have been calculated for the bit-block of size n, the extrinsic values for the MSB (shown as Extrinsic$_{2k}$(i)) and the LSB (shown as Extrinsic$_{2k+1}$(i)) of the received symbols are calculated.

Figure 27:
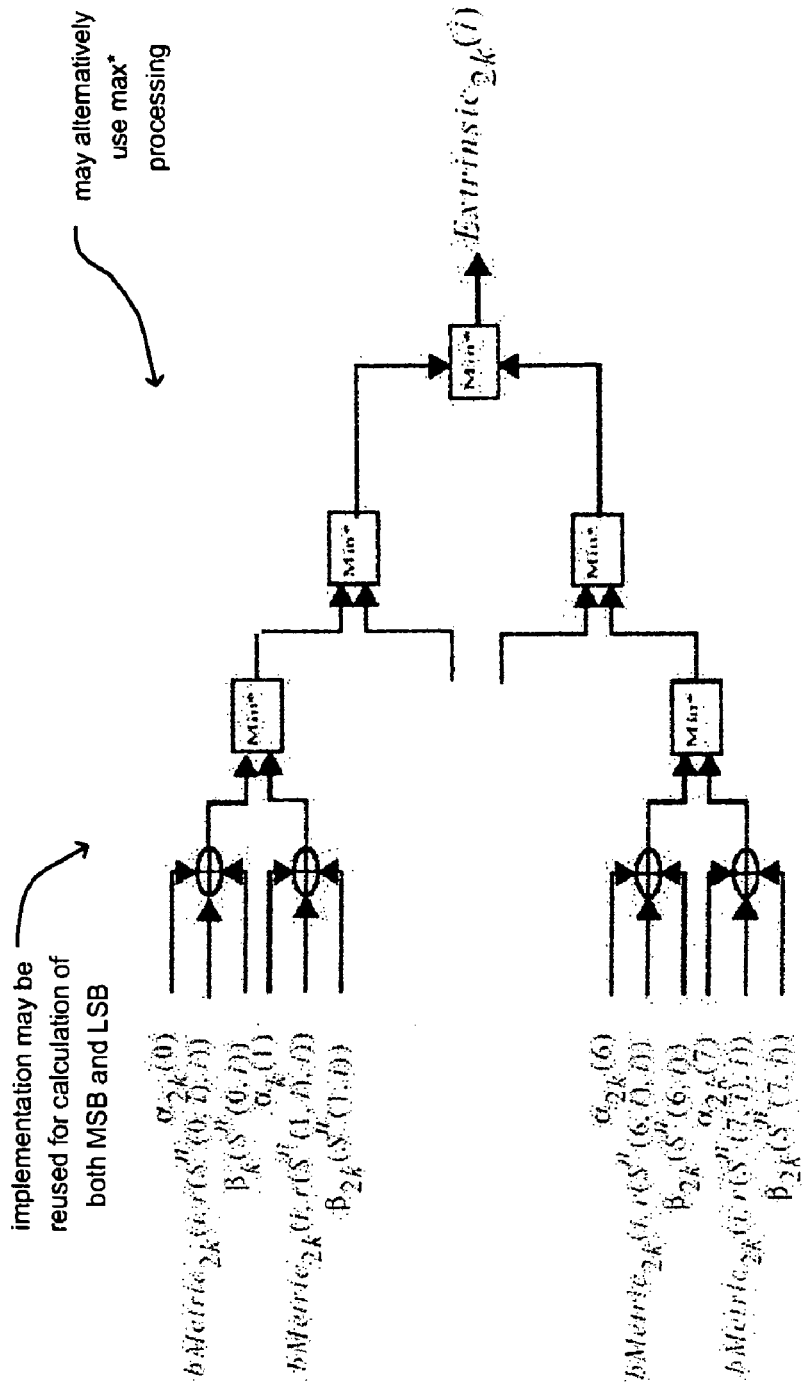
FIG. 27 is a diagram illustrating an embodiment of bit level calculation of the natural log (ln) of extrinsic value for an MSB (Most Significant Bit) according to the invention.

FIG. 27 is a diagram illustrating an embodiment of bit level calculation of the natural log (ln) of extrinsic value for an MSB (Most Significant Bit) according to the invention.

Firstly, three values are employed that correspond to when state m=0:

1. $\alpha_{2k}(0)$: the alpha value corresponding to the MSB when state m=0.

2. bMetric$_{2k}$(1,r(S''(0,i),i): the bit metric of the next MSB corresponding to the next state of $S''(0,i)$, or when state m=0, and corresponding to input information bit i.

3. $\beta_{2k}(S''(0,i))$: the beta value of the next MSB corresponding to the next state of $S''(0,i)$, or when state m=0, and corresponding to input information bit i.

These 3 values are all summed together to generate a first result.

Secondly, three values are employed that correspond to when state m=1:

1. $\alpha_{2k}(1)$: the alpha value corresponding to the MSB when state m=1.

2. bMetric$_{2k}$(i,r(S''(1,i),i): the bit metric of the next MSB corresponding to the next state of $S''(1,i)$, or when state m=1, and corresponding to input information bit i.

3. $\beta_{2k}(S''(1,i))$: the beta value of the next MSB corresponding to the next state of $S''(1,i)$, or when state m=1, and corresponding to input information bit i.

These 3 values are all summed together to generate a second result.

The first result and the second result undergo min* processing to generate a first min* result.

Calculations similar to those described above are also analogously performed for the various other intermediate state, e.g., for states m=2, 3, 4, 5, 6, 7. For example, the calculations for the states m=6 (m=110 in binary) and m=7 (m=111 in binary) are illustrated explicitly in this embodiment, and the other intermediary states are depicted as a vertical ellipsis ( . . . ).

Successive pairs of two summing results undergo min* processing to generate intermediate min* results. Subsequent min* processing then operates on successive pairs of two of the intermediate min* processing results until a final min* processing operation outputs the extrinsic values for the MSB (shown as $\text{Extrinsic}_{2k}(i)$).

As with the embodiments described above that are employed to calculate the forward metric (alpha=$\alpha$) and the backward metric (beta=$\beta$), this embodiment that is used to calculate the extrinsic value for the MSB, $\text{Extrinsic}_{2k}(i)$, may also be employed to perform the calculation of the extrinsic value for the LSB, $\text{Extrinsic}_{2k+1}(i)$, without departing from the scope and spirit of the invention. For example, if a serial is implemented, then the information for the MSB may first be calculated, and then the same hardware implementation may be used to calculate such information for the LSB as described below. Alternatively, two separate portions of hardware may also be implemented without departing from the scope and spirit of the invention.

Figure 28:
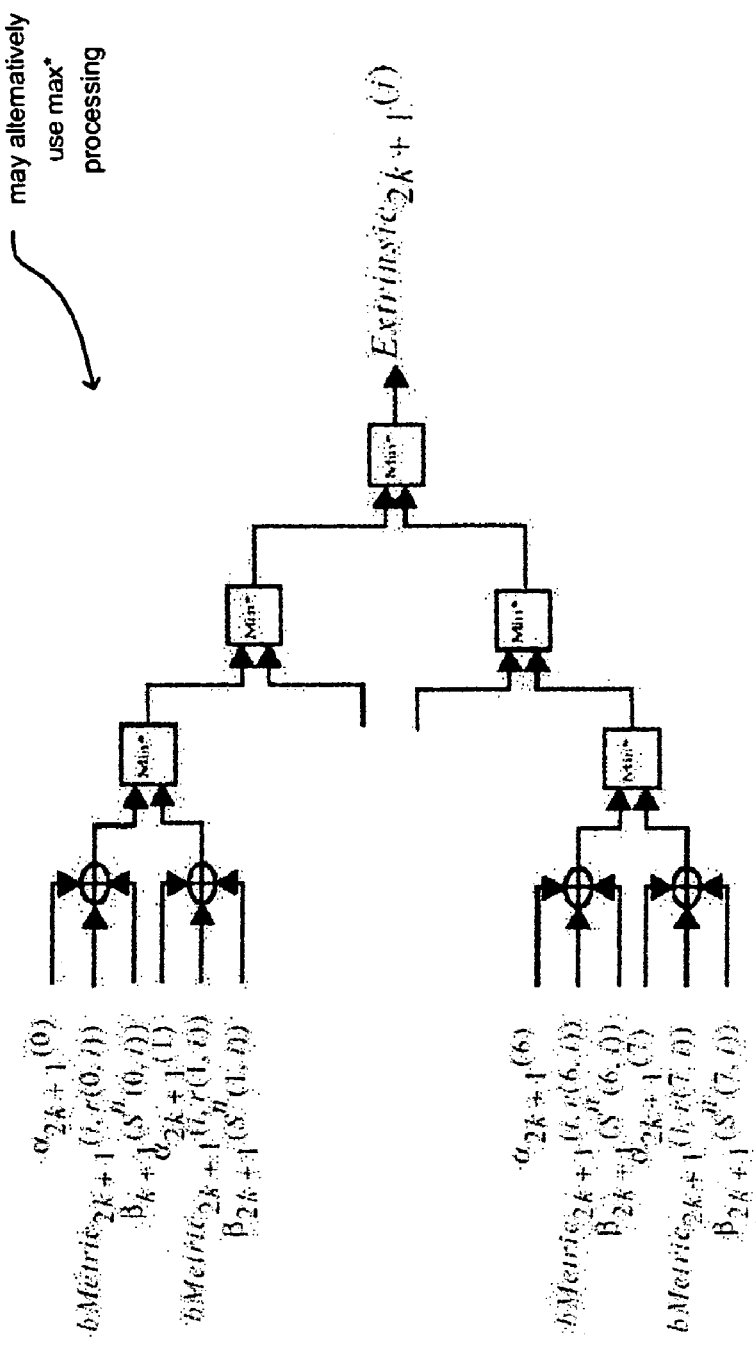
FIG. 28 is a diagram illustrating an embodiment of bit level calculation of the natural log (ln) of extrinsic value for an LSB (Least Significant Bit) according to the invention.

FIG. 28 is a diagram illustrating an embodiment of bit level calculation of the natural log (ln) of extrinsic value for an LSB (Least Significant Bit) according to the invention.

Firstly, three values are employed that correspond to when state m=0:

1. $\alpha_{2k+1}(0)$: the alpha value corresponding to the LSB when state m=0.

2. $\text{bMetric}_{2k+1}(i,r(0,i))$: the bit metric of the next LSB corresponding to when state m=0, and corresponding to input information bit i.

3. $\beta_{2k+1}(S''(0,i))$: the beta value of the next LSB corresponding to the next state of $S''(0,i)$, or when state m=0, and corresponding to input information bit i.

These 3 values are all summed together to generate a first result.

Secondly, three values are employed that correspond to when state m=1:

1. $\alpha_{2k+1}(1)$: the alpha value corresponding to the LSB when state m=1.

2. $\text{bMetric}_{2k+1}(i,r(1,i))$: the bit metric of the next LSB corresponding to when state m=1, and corresponding to input information bit i.

3. $\beta_{2k+1}(S''(1,i))$: the beta value of the next LSB corresponding to the next state of $S''(1,i)$, or when state m=1, and corresponding to input information bit i.

These 3 values are all summed together to generate a second result.

The first result and the second result undergo min* processing to generate a first min* result.

Calculations similar to those described above are also analogously performed for the various other intermediate state, e.g., for states m=2, 3, 4, 5, 6, 7. For example, the calculations for the states m=6 (m=110 in binary) and m=7 (m=111 in binary) are illustrated explicitly in this embodiment, and the other intermediary states are depicted as a vertical ellipsis ( . . . ).

Successive pairs of two summing results undergo min* processing to generate intermediate min* results. Subsequent min* processing then operates on successive pairs of two of the intermediate min* processing results until a final min* processing operation outputs the extrinsic values for the LSB (shown as $\text{Extrinsic}_{2k+1}(i)$).

It is noted that while several of the previous embodiments described above employ min* processing, alternative embodiments could also implemented that employ max* processing without departing from the scope and spirit of the invention. Clearly, any decision making criteria would then need to be modified so as to deal with the resultant of such max* processing as opposed to min* processing. In addition, several of the various embodiments (such as the embodiments that calculate the extrinsic values for the MSB ($\text{Extrinsic}_{2k}(i)$) and the LSB ($\text{Extrinsic}_{2k+1}(i)$) may be implemented using a single stage design as described in "Single stage implementation of min*, max*, min and/or max to perform state metric calculation in SISO decoder," Ser. No. 10/335,702, which has been incorporated by reference above.

Figure 29:
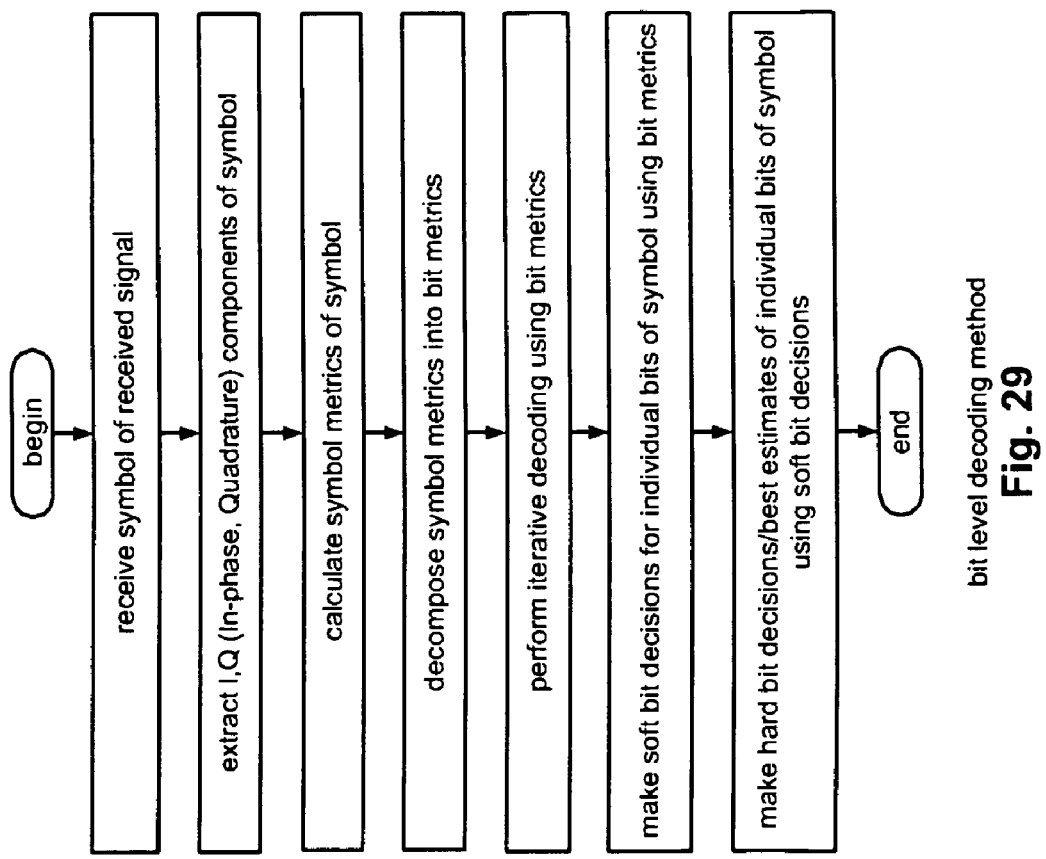
FIG. 29, FIG. 30, and FIG. 31 are flowcharts illustrating embodiments of bit level decoding methods that are performed according to the invention.
Figure 30:
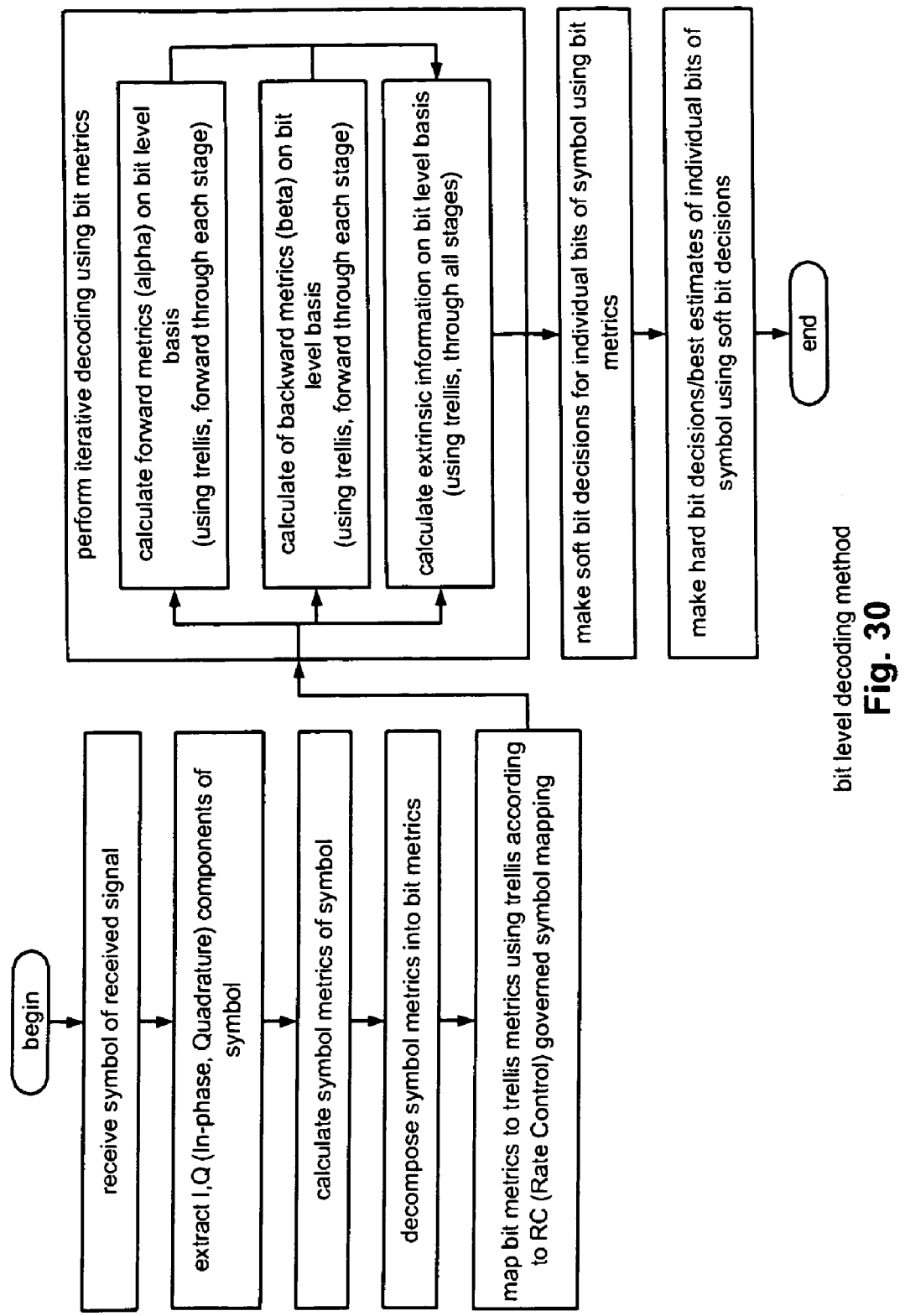
Figure 31:
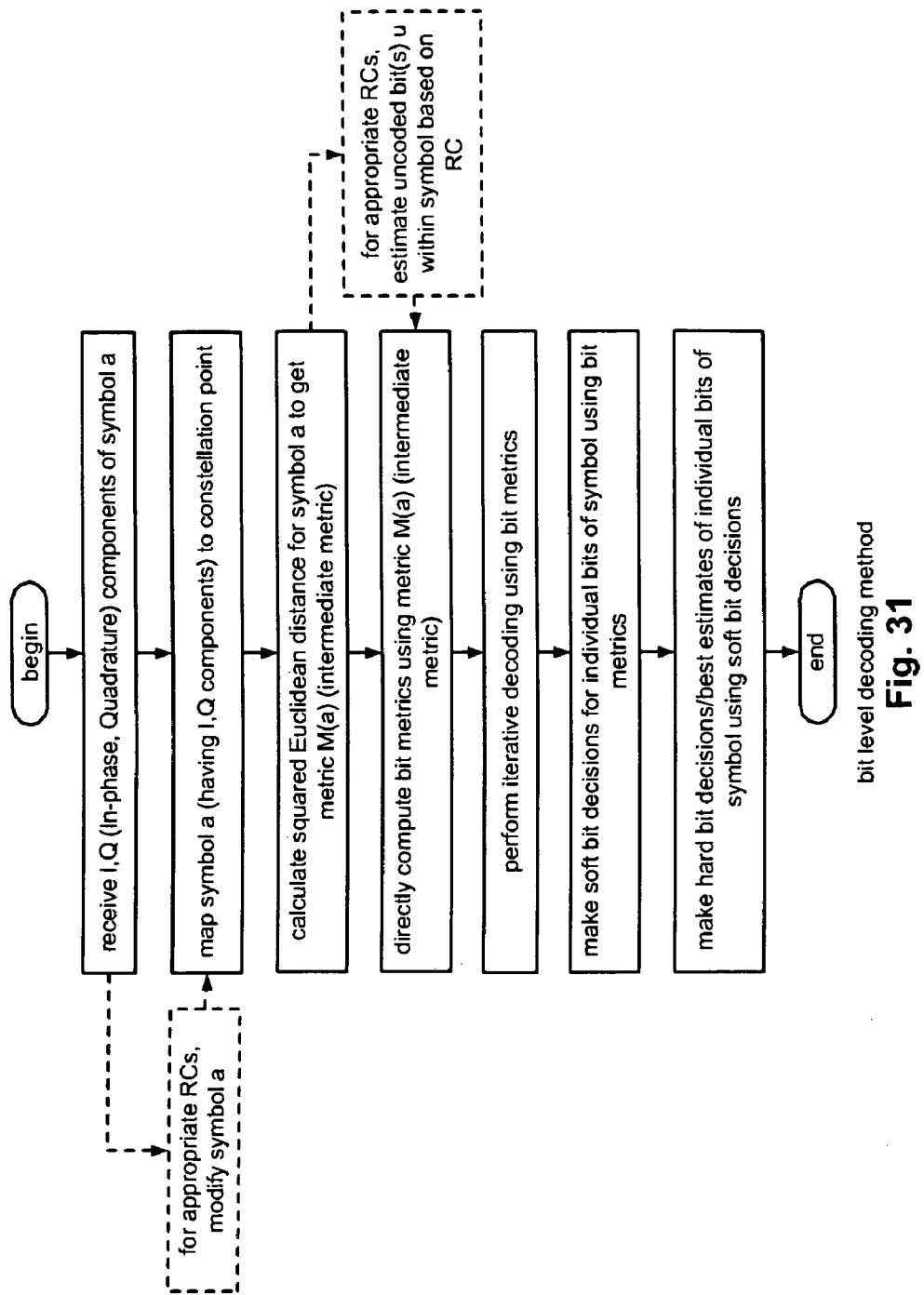

FIG. 29, FIG. 30, and FIG. 31 are flowcharts illustrating embodiments of bit level decoding methods that are performed according to the invention.

Referring to the FIG. 29, the method involves receiving a symbol of a received signal. Then, the method involves extracting the I,Q (In-phase, Quadrature) components of symbol. Then, the method performs calculate of the symbol metrics of the symbol. The method then decomposes the symbol metrics into bit metrics using any one of the approaches described within this specification.

The method then performs iterative decoding using these now available bit metrics. These bit metrics correspond to the individual bits of the symbol, which may include an MSB and an LSB.

Then, the method involves making soft bit decisions for those individual bits of the symbols using the corresponding bit metrics. Ultimately, the method involves making hard bit decisions/best estimates of individual bits of symbol using soft bit decisions.

Referring to the FIG. 30, the method involves receiving a symbol of a received signal. Then, the method involves extracting the I,Q (In-phase, Quadrature) components of symbol. Then, the method performs calculate of the symbol metrics of the symbol. The method then decomposes the symbol metrics into bit metrics using any one of the approaches described within this specification.

Then, the method involves mapping the bit metrics to trellis metrics using a trellis employed by the code according to RC (Rate Control) governed symbol mapping. The method then performs iterative decoding using these now available bit metrics. Again, as within other embodiments, these bit metrics correspond to the individual bits of the symbol, which may include an MSB and an LSB.

This iterative decoding involves calculating the forward metrics (alpha=$\alpha$), the backward metrics (beta=$\beta$) and the extrinsic values (Extrinsic) on a bit level basis for the individual bits of the symbols. Specifically, this involves calculation of the forward metrics (alpha) on bit level basis (using the trellis, forward through each stage). This also involves calculation of the backward metrics (beta) on bit level basis (using the trellis, forward through each stage). Using the information of the forward metrics (alpha) and the backward metrics (beta), as well as the appropriately trellis mapped bit metrics, the method also involves calculation of extrinsic information on bit level basis (using the trellis, through all stages).

Then, the method involves making soft bit decisions for those individual bits of the symbols using the corresponding bit metrics. Ultimately, the method involves making hard bit decisions/best estimates of individual bits of symbol using soft bit decisions.

Referring to the FIG. 31, the method involves receiving the I,Q (In-phase, Quadrature) components of symbol a. In some embodiments employing variable rate, the method also involves modifying the symbol a for those appropriate RCs.

The method then maps the symbol a (having I,Q components) to constellation point (this may be performed using the modified symbol a). The method then calculates the squared Euclidean distance for symbol a to get metric M(a) (intermediate metric).

In some embodiments employing variable rate, the method also involves estimating the uncoded bit(s) u within symbol based on RC for those appropriate RCs. The method then involves directly computing bit metrics using the appropriate metric M(a) (intermediate metric).

The method then involves performing iterative decoding using these now available bit metrics that have been directly computed. Then, the method involves making soft bit decisions for those individual bits of the symbols using the corresponding bit metrics. Ultimately, the method involves making hard bit decisions/best estimates of individual bits of symbol using soft bit decisions.

It is also noted that the methods described here within the FIG. 29, FIG. 30, and FIG. 31 may be performed within the appropriate embodiments described within this specification.

In view of the above detailed description of the invention and associated drawings, other modifications and variations will now become apparent. It should also be apparent that such other modifications and variations may be effected without departing from the spirit and scope of the invention.

What is claimed is:

1. A bit level decoding method, comprising:
   receiving a signal that includes a symbol having a plurality of bits;
   extracting I,Q (In-phase, Quadrature) components of the symbol;
   calculating a plurality of symbol metrics for the symbol using the I,Q components;
   decomposing the plurality of symbol metrics into a plurality of bit metrics;
   wherein the plurality of bit metrics is representative of the individual bits of the plurality of bits of the symbol;
   performing iterative decoding using the plurality of bit metrics;
   wherein the plurality of bit metrics is updated during each iteration of the iterative decoding for use in a current decoding iteration, such that each respective bit metric of the plurality of bit metrics is updated using extrinsic information corresponding to that respective bit from a previous decoding iteration;
   making soft bit decisions that correspond to the individual bits of the plurality of bits of the symbol; and
   making hard bit decisions, based on the soft bit decisions, that correspond to best estimates of bit values of the individual bits of the plurality of bits of the symbol; and
   wherein:
   the signal is a variable code rate signal whose code rate varies on a symbol by symbol basis;
   the symbol within the signal is encoded according to a first RC (Rate Control);
   at least one additional symbol within the signal is encoded according to a second RC;
   the first RC includes a first modulation having a first constellation and a first mapping; and
   the second RC includes a second modulation having a second constellation and a second mapping.

2. The method of claim 1, wherein the signal is coded using at least one of TCM (Trellis Coded Modulation) and TTCM (Turbo Trellis Coded Modulation).

3. The method of claim 1, wherein
   the signal is coded using TTCM (Turbo Trellis Coded Modulation); and
   the performing iterative decoding using the plurality of bit metrics is performed using a top SISO (Soft-In Soft-Out decoder), a bottom SISO, an interleaver, and a de-interleaver.

4. The method of claim 1, wherein
   the signal is coded using TTCM (Turbo Trellis Coded Modulation); and
   the performing iterative decoding using the plurality of bit metrics is performed using one SISO (Soft-In Soft-Out decoder) and an interleaver/de-interleaver.

5. The method of claim 1, wherein the iterative decoding includes performing MAP (maximum a posteriori probability) decoding.

6. The method of claim 1, wherein:
   the decomposing the plurality of symbol metrics into the plurality of bit metrics involves calculating a pseudo bit metric for an LSB (Least Significant Bit) of the plurality of bits;
   the decomposing the plurality of symbol metrics into the plurality of bit metrics involves calculating a bit metric for the LSB of the plurality of bits; and
   the decomposing the plurality of symbol metrics into the plurality of bit metrics involves calculating a bit metric for an MSB (Most Significant Bit) of the plurality of bits.

7. The method of claim 1, wherein:
   the plurality of bit metrics is a plurality of state dependent bit metrics; and
   the decomposing the plurality of symbol metrics into the plurality of bit metrics involves converting the plurality of state dependent bit metrics to a plurality of state independent bit metrics.

8. The method of claim 1, wherein the signal is received from an AWGN (Additive White Gaussian Noise) communication channel.

9. The method of claim 1, wherein:
   the signal includes a plurality of symbols arranged in a frame; and
   the signal is a variable code rate signal whose code rate varies on a symbol by symbol basis within the frame.

10. The method of claim 1, wherein:
    the method is performed within an HDTV (High Definition Television) set top box receiver.

11. The method of claim 1, wherein:
    the method is performed within a DWDM (Dense Wavelength Division Multiplexing) line card that is coupled to a fiber-optic communication channel.

12. The method of claim 1, wherein at least one of the first modulation and the second modulation is at least one of a BPSK (Binary Phase Shift Key) modulation, a QPSK (Quadrature Phase Shift Key) modulation, an 8 PSK (8 Phase Shift Key) modulation, a 16 QAM (Quadrature Amplitude Modulation) modulation, and a 16 APSK (Asymmetric Phase Shift Keying) modulation.

13. The method of claim 1, wherein:
    the first modulation is a QPSK (Quadrature Phase Shift Key) modulation having a QPSK constellation and the first mapping; and
    the second modulation is a QPSK modulation having a QPSK constellation and the second mapping.

14. The method of claim 1, wherein:
the method is performed within a decoder; and
the decoder is implemented within at least one of a satellite communication system, an HDTV (High Definition Television) communication system, a cellular communication system, a microwave communication system, a point-to-point communication system, and a TTCM (Turbo Trellis Coded Modulation) communication system.

15. The method of claim 1, wherein the iterative decoding further comprises calculating a plurality of forward metrics (alphas) and a plurality of backward metrics (betas) using the plurality of bit metrics; and
wherein each alpha and each beta corresponds to one individual bit of the plurality of bits of the symbol.

16. The method of claim 15, wherein the iterative decoding further comprises calculating a plurality of extrinsic values using the plurality of bit metrics, the plurality of forward metrics (alphas), and the plurality of backward metrics (betas); and
wherein each extrinsic value of the plurality of extrinsic values corresponds to one individual bit of the plurality of bits of the symbol.

17. The method of claim 16, wherein the plurality of extrinsic values that are calculated during a first iteration of the iterative decoding are employed as APP (a priori probability) during a second iteration of the iterative decoding.

18. The method of claim 1, further comprising mapping the plurality of bit metrics to a plurality of trellis metrics according to the first RC and the second RC.

19. The method of claim 18, wherein the plurality of trellis metrics are mapped according to an 8 state trellis of a rate 1/2 encoder.

20. The method of claim 19, wherein the rate 1/2 encoder is a convolutional encoder.

21. A bit level decoding method, comprising:
receiving a signal that includes a symbol having a plurality of bits;
extracting I,Q (In-phase, Quadrature) components of the symbol;
calculating a plurality of symbol metrics for the symbol using the I,Q components;
decomposing the plurality of symbol metrics into a plurality of bit metrics;
wherein the plurality of bit metrics is representative of the individual bits of the plurality of bits of the symbol;
performing iterative decoding using the plurality of bit metrics;
wherein the plurality of bit metrics is updated during each iteration of the iterative decoding for use in a current decoding iteration, such that each respective bit metric of the plurality of bit metrics is updated using extrinsic information corresponding to that respective bit from a previous decoding iteration;
making soft bit decisions that correspond to the individual bits of the plurality of bits of the symbol; and
making hard bit decisions, based on the soft bit decisions, that correspond to best estimates of bit values of the individual bits of the plurality of bits of the symbol;
and wherein:
the signal is a variable code rate signal whose code rate varies on a symbol by symbol basis;
the symbol within the signal is encoded according to a first RC (Rate Control);
at least one additional symbol within the signal is encoded according to a second RC;
the iterative decoding further comprises calculating a plurality of forward metrics (alphas) and a plurality of backward metrics (betas) using the plurality of bit metrics;
each alpha and each beta corresponds to one individual bit of the plurality of bits of the symbol;
the iterative decoding further comprises calculating a plurality of extrinsic values using the plurality of bit metrics, the plurality of forward metrics (alphas), and the plurality of backward metrics (betas);
each extrinsic value of the plurality of extrinsic values corresponds to one individual bit of the plurality of bits of the symbol;
the plurality of extrinsic values that are calculated during a first iteration of the iterative decoding are employed as APP (a priori probability) during a second iteration of the iterative decoding;
the first RC includes a first modulation having a first constellation and a first mapping; and
the second RC includes a second modulation having a second constellation and a second mapping.

22. The method of claim 21, wherein the iterative decoding includes performing MAP (maximum a posteriori probability) decoding.

23. The method of claim 21, wherein:
the decomposing the plurality of symbol metrics into the plurality of bit metrics involves calculating a pseudo bit metric for an LSB (Least Significant Bit) of the plurality of bits;
the decomposing the plurality of symbol metrics into the plurality of bit metrics involves calculating a bit metric for the LSB of the plurality of bits; and
the decomposing the plurality of symbol metrics into the plurality of bit metrics involves calculating a bit metric for an MSB (Most Significant Bit) of the plurality of bits.

24. The method of claim 21, wherein:
the plurality of bit metrics is a plurality of state dependent bit metrics; and
the decomposing the plurality of symbol metrics into the plurality of bit metrics involves converting the plurality of state dependent bit metrics to a plurality of state independent bit metrics.

25. The method of claim 21, further comprising mapping the plurality of bit metrics to a plurality of trellis metrics according to the first RC and the second RC; and wherein:
the plurality of trellis metrics are mapped according to an 8 state trellis of a rate 1/2 encoder; and
the rate 1/2 encoder is a convolutional encoder.

26. The method of claim 21, wherein:
at least one of the first modulation and the second modulation is at least one of a BPSK (Binary Phase Shift Key) modulation, a QPSK (Quadrature Phase Shift Key) modulation, an 8 PSK (8 Phase Shift Key) modulation, a 16 QAM (Quadrature Amplitude Modulation) modulation, and a 16 APSK (Asymmetric Phase Shift Keying) modulation.

27. The method of claim 21, wherein:
the first modulation is a QPSK (Quadrature Phase Shift Key) modulation having a QPSK constellation and the first mapping; and
the second modulation is a QPSK modulation having a QPSK constellation and the second mapping.

28. The method of claim 21, wherein:
the method is performed within a decoder; and
the decoder is implemented within at least one of a satellite communication system, an HDTV (High Definition Television) communication system, a cellular communication system, a microwave communication system, a point-to-point communication system, and a TTCM (Turbo Trellis Coded Modulation) communication system.

29. The method of claim 21, wherein
the signal is coded using TTCM (Turbo Trellis Coded Modulation); and
the performing iterative decoding using the plurality of bit metrics is performed using a top SISO (Soft-In Soft-Out decoder), a bottom SISO, an interleaver, and a de-interleaver.

30. The method of claim 21, wherein
the signal is coded using TTCM (Turbo Trellis Coded Modulation); and
the performing iterative decoding using the plurality of bit metrics is performed using one SISO (Soft-In Soft-Out decoder) and an interleaver/de-interleaver.

31. A bit level decoding method, comprising:
receiving a signal that includes a symbol having a plurality of bits;
extracting I,Q (In-phase, Quadrature) components of the symbol;
mapping the symbol to a constellation point;
calculating a squared Euclidean distance for the symbol thereby generating an intermediate metric of the symbol;
directly calculating a plurality of bit metrics, using the intermediate metric;
wherein the plurality of bit metrics is representative of the individual bits of the plurality of bits of the symbol;
performing iterative decoding using the plurality of bit metrics;
wherein the plurality of bit metrics is updated during each iteration of the iterative decoding for use in a current decoding iteration, such that each respective bit metric of the plurality of bit metrics is updated using extrinsic information corresponding to that respective bit from a previous decoding iteration;
making soft bit decisions, using the plurality of bit metrics, that correspond to the individual bits of the plurality of bits of the symbol; and
making hard bit decisions, based on the soft bit decisions, that correspond to best estimates of bit values of the individual bits of the plurality of bits of the symbol; and wherein:
the signal is a variable code rate signal whose code rate varies on a symbol by symbol basis;
the symbol within the signal is encoded according to a first RC (Rate Control);
at least one additional symbol within the signal is encoded according to a second RC;
the first RC includes a first modulation having a first constellation and a first mapping; and
the second RC includes a second modulation having a second constellation and a second mapping.

32. The method of claim 31, wherein the plurality of bit metrics is calculated using min* processing.

33. The method of claim 31, wherein the signal is coded using at least one of TCM (Trellis Coded Modulation) and TTCM (Turbo Trellis Coded Modulation).

34. The method of claim 31, wherein
the signal is coded using TTCM (Turbo Trellis Coded Modulation); and
the performing iterative decoding using the plurality of bit metrics is performed using a top SISO (Soft-In Soft-Out decoder), a bottom SISO, an interleaver, and a de-interleaver.

35. The method of claim 31, wherein
the signal is coded using TTCM (Turbo Trellis Coded Modulation); and
the performing iterative decoding using the plurality of bit metrics is performed using one SISO (Soft-In Soft-Out decoder) and an interleaver/de-interleaver.

36. The method of claim 31, wherein the iterative decoding includes performing MAP (maximum a posteriori probability) decoding.

37. The method of claim 31, wherein:
the decomposing the plurality of symbol metrics into the plurality of bit metrics involves calculating a pseudo bit metric for an LSB (Least Significant Bit) of the plurality of bits;
the decomposing the plurality of symbol metrics into the plurality of bit metrics involves calculating a bit metric for the LSB of the plurality of bits; and
the decomposing the plurality of symbol metrics into the plurality of bit metrics involves calculating a bit metric for an MSB (Most Significant Bit) of the plurality of bits.

38. The method of claim 31, wherein:
the plurality of bit metrics is a plurality of state dependent bit metrics; and
the decomposing the plurality of symbol metrics into the plurality of bit metrics involves converting the plurality of state dependent bit metrics to a plurality of state independent bit metrics.

39. The method of claim 31, wherein the signal is received from an AWGN (Additive White Gaussian Noise) communication channel.

40. The method of claim 31, wherein:
the signal includes a plurality of symbols arranged in a frame; and
the signal is a variable code rate signal whose code rate varies on a symbol by symbol basis within the frame.

41. The method of claim 31, wherein:
the method is performed within an HDTV (High Definition Television) set top box receiver.

42. The method of claim 31, wherein:
the method is performed within a DWDM (Dense Wavelength Division Multiplexing) line card that is coupled to a fiber-optic communication channel.

43. The method of claim 31, wherein at least one of the first modulation and the second modulation is at least one of a BPSK (Binary Phase Shift Key) modulation, a QPSK (Quadrature Phase Shift Key) modulation, an 8 PSK (8 Phase Shift Key) modulation, a 16 QAM (Quadrature Amplitude Modulation) modulation, and a 16 APSK (Asymmetric Phase Shift Keying) modulation.

44. The method of claim 31, wherein:
the first modulation is a QPSK (Quadrature Phase Shift Key) modulation having a QPSK constellation and the first mapping; and
the second modulation is a QPSK modulation having a QPSK constellation and the second mapping.

45. The method of claim 31, wherein:
the method is performed within a decoder; and
the decoder is implemented within at least one of a satellite communication system, an HDTV (High Definition Television) communication system, a cellular communication system, a microwave communication system, a point-to-point communication system, and a TTCM (Turbo Trellis Coded Modulation) communication system.

46. The method of claim 31, further comprising mapping the plurality of bit metrics to a plurality of trellis metrics according to the first RC and the second RC.

47. The method of claim 46, wherein the plurality of trellis metrics are mapped according to an 8 state trellis of a rate 1/2 encoder.

48. The method of claim 47, wherein the rate 1/2 encoder is a convolutional encoder.

49. The method of claim 31, wherein the iterative decoding further comprises calculating a plurality of forward metrics (alphas) and a plurality of backward metrics (betas) using the plurality of bit metrics; and wherein each alpha and each beta corresponds to one individual bit of the plurality of bits of the symbol.

50. The method of claim 49, wherein the plurality of forward metrics (alphas) and a plurality of backward metrics (betas) are calculated using min* processing.

51. The method of claim 49, wherein the iterative decoding further comprises calculating a plurality of extrinsic values using the plurality of bit metrics, the plurality of forward metrics (alphas), and the plurality of backward metrics (betas); and wherein each extrinsic value of the plurality of extrinsic values corresponds to one individual bit of the plurality of bits of the symbol.

52. The method of claim 51, wherein the plurality of extrinsic values is calculated using min* processing.

53. The method of claim 51, wherein the plurality of extrinsic values that are calculated during a first iteration of the iterative decoding are employed as APP (a priori probability) during a second iteration of the iterative decoding.

54. A bit level decoding method, comprising:
receiving a signal that includes a symbol having a plurality of bits;
extracting I,Q (In-phase, Quadrature) components of the symbol;
mapping the symbol to a constellation point;
calculating a squared Euclidean distance for the symbol thereby generating an intermediate metric of the symbol;
directly calculating a plurality of bit metrics, using the intermediate metric;
wherein the plurality of bit metrics is representative of the individual bits of the plurality of bits of the symbol;
performing iterative decoding using the plurality of bit metrics;
wherein the plurality of bit metrics is updated during each iteration of the iterative decoding for use in a current decoding iteration, such that each respective bit metric of the plurality of bit metrics is updated using extrinsic information corresponding to that respective bit from a previous decoding iteration;
making soft bit decisions, using the plurality of bit metrics, that correspond to the individual bits of the plurality of bits of the symbol;
making hard bit decisions, based on the soft bit decisions, that correspond to best estimates of bit values of the individual bits of the plurality of bits of the symbol; and
wherein:
the signal is a variable code rate signal whose code rate varies on a symbol by symbol basis;
the symbol within the signal is encoded according to a first RC (Rate Control);
at least one additional symbol within the signal is encoded according to a second RC;
the plurality of bit metrics is calculated using min* processing;
the iterative decoding further comprises calculating a plurality of forward metrics (alphas) and a plurality of backward metrics (betas) using the plurality of bit metrics;

each alpha and each beta corresponds to one individual bit of the plurality of bits of the symbol;
the plurality of forward metrics (alphas) and a plurality of backward metrics (betas) are calculated using min* processing;
the iterative decoding further comprises calculating a plurality of extrinsic values using the plurality of bit metrics, the plurality of forward metrics (alphas), and the plurality of backward metrics (betas);
each extrinsic value of the plurality of extrinsic values corresponds to one individual bit of the plurality of bits of the symbol;
the plurality of extrinsic values is calculated using min* processing;
the first RC includes a first modulation having a first constellation and a first mapping; and
the second RC includes a second modulation having a second constellation and a second mapping.

55. The method of claim 54, wherein the plurality of extrinsic values that are calculated during a first iteration of the iterative decoding are employed as APP (a priori probability) during a second iteration of the iterative decoding.

56. The method of claim 54, wherein the signal is coded using at least one of 1CM (Trellis Coded Modulation) and TTCM (Turbo Trellis Coded Modulation).

57. The method of claim 54, wherein
the signal is coded using TTCM (Turbo Trellis Coded Modulation); and
the performing iterative decoding using the plurality of bit metrics is performed using a top SISO (Soft-In Soft-Out decoder), a bottom SISO, an interleaver, and a de-interleaver.

58. The method of claim 54, wherein
the signal is coded using TTCM (Turbo Trellis Coded Modulation); and
the performing iterative decoding using the plurality of bit metrics is performed using one SISO (Soft-In Soft-Out decoder) and an interleaver/de-interleaver.

59. The method of claim 54, wherein the iterative decoding includes performing MAP (maximum a posteriori probability) decoding.

60. The method of claim 54, wherein:
the decomposing the plurality of symbol metrics into the plurality of bit metrics involves calculating a pseudo bit metric for an LSB (Least Significant Bit) of the plurality of bits;
the decomposing the plurality of symbol metrics into the plurality of bit metrics involves calculating a bit metric for the LSB of the plurality of bits; and
the decomposing the plurality of symbol metrics into the plurality of bit metrics involves calculating a bit metric for an MSB (Most Significant Bit) of the plurality of bits.

61. The method of claim 54, wherein:
the plurality of bit metrics is a plurality of state dependent bit metrics; and
the decomposing the plurality of symbol metrics into the plurality of bit metrics involves converting the plurality of state dependent bit metrics to a plurality of state independent bit metrics.

62. The method of claim 54, wherein the signal is received from an AWGN (Additive White Gaussian Noise) communication channel.

63. The method of claim 54, wherein:
the signal includes a plurality of symbols arranged in a frame; and
the signal is a variable code rate signal whose code rate varies on a symbol by symbol basis within the frame.

64. The method of claim 54, wherein:
the method is performed within an HDTV (High Definition Television) set top box receiver.

65. The method of claim 54, wherein at least one of the first modulation and the second modulation is at least one of a BPSK (Binary Phase Shift Key) modulation, a QPSK (Quadrature Phase Shift Key) modulation, an 8 PSK (8 Phase Shift Key) modulation, a 16 QAM (Quadrature Amplitude Modulation) modulation, and a 16 APSK (Asymmetric Phase Shift Keying) modulation.

66. The method of claim 54, wherein:
the first modulation is a QPSK (Quadrature Phase Shift Key) modulation having a QPSK constellation and the first mapping; and
the second modulation is a QPSK modulation having a QPSK constellation and the second mapping.

67. The method of claim 54, wherein:
the method is performed within a decoder; and
the decoder is implemented within at least one of a satellite communication system, an HDTV (High Definition Television) communication system, a cellular communication system, a microwave communication system, a point-to-point communication system, and a TTCM (Turbo Trellis Coded Modulation) communication system.

68. The method of claim 54, further comprising mapping the plurality of bit metrics to a plurality of trellis metrics according to the first RC and the second RC.

69. The method of claim 68, wherein the plurality of trellis metrics are mapped according to an 8 state trellis of a rate 1/2 encoder.

70. The method of claim 69, wherein the rate 1/2 encoder is a convolutional encoder.

71. A bit level decoding method, comprising:
receiving a signal that includes a symbol having a plurality of bits;
extracting I,Q (In-phase, Quadrature) components of the symbol;
mapping the symbol to a constellation point;
calculating a squared Euclidean distance for the symbol thereby generating an intermediate metric of the symbol;
directly calculating a plurality of bit metrics, using the intermediate metric;
wherein the plurality of bit metrics is representative of the individual bits of the plurality of bits of the symbol;
performing iterative decoding using the plurality of bit metrics;
wherein the plurality of bit metrics is updated during each iteration of the iterative decoding for use in a current decoding iteration, such that each respective bit metric of the plurality of bit metrics is updated using extrinsic information corresponding to that respective bit from a previous decoding iteration;
making soft bit decisions, using the plurality of bit metrics, that correspond to the individual bits of the plurality of bits of the symbol;
making hard bit decisions, based on the soft bit decisions, that correspond to best estimates of bit values of the individual bits of the plurality of bits of the symbol; and
wherein:
the decomposing the plurality of symbol metrics into the plurality of bit metrics involves calculating a pseudo bit metric for an LSB (Least Significant Bit) of the plurality of bits;
the decomposing of the plurality of symbol metrics into the plurality of bit metrics involves calculating a bit metric for the LSB of the plurality of bits;
the decomposing of the plurality of symbol metrics into the plurality of bit metrics involves calculating a bit metric for an MSB (Most Significant Bit) of the plurality of bits;
the plurality of bit metrics is a plurality of state dependent bit metrics;
the decomposing the plurality of symbol metrics into the plurality of bit metrics involves converting the plurality of state dependent bit metrics to a plurality of state independent bit metrics;
the signal is a variable code rate signal whose code rate varies on a symbol by symbol basis;
the symbol within the signal is encoded according to a first RC (Rate Control);
at least one additional symbol within the signal is encoded according to a second RC;
the first RC includes a first modulation having a first constellation and a first mapping; and
the second RC includes a second modulation having a second constellation and a second mapping.

72. The method of claim 71, wherein the plurality of bit metrics is calculated using min* processing.

73. The method of claim 71, wherein the signal is coded using at least one of TCM (Trellis Coded Modulation) and TTCM (Turbo Trellis Coded Modulation).

74. The method of claim 71, wherein
the signal is coded using TTCM (Turbo Trellis Coded Modulation); and
the performing iterative decoding using the plurality of bit metrics is performed using a top SISO (Soft-In Soft-Out decoder), a bottom SISO, an interleaver, and a de-interleaver.

75. The method of claim 71, wherein
the signal is coded using TTCM (Turbo Trellis Coded Modulation); and
the performing iterative decoding using the plurality of bit metrics is performed using one SISO (Soft-In Soft-Out decoder) and an interleaver/de-interleaver.

76. The method of claim 71, wherein the iterative decoding includes performing MAP (maximum a posteriori probability) decoding.

77. The method of claim 71, wherein the signal is received from an AWGN (Additive White Gaussian Noise) communication channel.

78. The method of claim 71, wherein:
the signal includes a plurality of symbols arranged in a frame; and
the signal is a variable code rate signal whose code rate varies on a symbol by symbol basis within the frame.

79. The method of claim 71, wherein:
the method is performed within an HDTV (High Definition Television) set top box receiver.

80. The method of claim 71, wherein:
the method is performed within a DWDM (Dense Wavelength Division Multiplexing) line card that is coupled to a fiber-optic communication channel.

81. The method of claim 71, wherein at least one of the first modulation and the second modulation is at least one of a BPSK (Binary Phase Shift Key) modulation, a QPSK (Quadrature Phase Shift Key) modulation, an 8 PSK (8 Phase Shift Key) modulation, a 16 QAM (Quadrature Amplitude Modulation) modulation, and a 16 APSK (Asymmetric Phase Shift Keying) modulation.

82. The method of claim 71, wherein:
the first modulation is a QPSK (Quadrature Phase Shift Key) modulation having a QPSK constellation and the first mapping; and
the second modulation is a QPSK modulation having a QPSK constellation and the second mapping.

83. The method of claim 71, wherein:
the method is performed within a decoder; and
the decoder is implemented within at least one of a satellite communication system, an HDTV (High Definition Television) communication system, a cellular communication system, a microwave communication system, a point-to-point communication system, and a TTCM (Turbo Trellis Coded Modulation) communication system.

84. The method of claim 71, further comprising mapping the plurality of bit metrics to a plurality of trellis metrics according to the first RC and the second RC.

85. The method of claim 84, wherein:
the plurality of trellis metrics are mapped according to an 8 state trellis of a rate 1/2 encoder; and
the rate 1/2 encoder is a convolutional encoder.

86. The method of claim 71, wherein the iterative decoding further comprises calculating a plurality of forward metrics (alphas) and a plurality of backward metrics (betas) using the plurality of bit metrics; and
wherein each alpha and each beta corresponds to one individual bit of the plurality of bits of the symbol.

87. The method of claim 86, wherein the plurality of forward metrics (alphas) and a plurality of backward metrics (betas) are calculated using min* processing.

88. The method of claim 86, wherein the iterative decoding further comprises calculating a plurality of extrinsic values using the plurality of bit metrics, the plurality of forward metrics (alphas), and the plurality of backward metrics (betas); and
wherein each extrinsic value of the plurality of extrinsic values corresponds to one individual bit of the plurality of bits of the symbol.

89. The method of claim 88, wherein the plurality of extrinsic values is calculated using min* processing.

90. The method of claim 88, wherein the plurality of extrinsic values that are calculated during a first iteration of the iterative decoding are employed as APP (a priori probability) during a second iteration of the iterative decoding.

91. A bit level decoder that employs a trellis to decode a signal whose code rate varies on a symbol by symbol basis according to a rate control sequence that includes a plurality of RCs (Rate Controls) arranged in a period, the decoder comprising:
a metric generator that calculates a plurality of metrics for each symbol of the signal according to a corresponding RC of the plurality of RCs, each symbol includes a plurality of bits;
a decompose symbol metrics to initial bit metrics functional block that decomposes the plurality of symbol metrics into a plurality of bit metrics for each symbol of the signal;
wherein the plurality of bit metrics are mapped to a plurality of trellis metrics for each symbol of the signal according to the corresponding RC;
a top SISO (Soft-In Soft-Out decoder) that, based on a plurality of trellis metrics, calculates a first plurality of extrinsic values for each symbol of the signal according to the corresponding RC;
an interleaver, communicatively coupled to the top SISO, that interleaves the first plurality of extrinsic values;
a first bit metric update functional block that employs the interleaved first plurality of extrinsic values by employing first extrinsic information of a bit calculated in a previous decoding iteration to update a first bit metric of the bit for use in a current decoding iteration thereby generating a first APP (a priori probability) information, such that each respective bit metric of the plurality of bit metrics is updated using extrinsic information corresponding to that respective bit from a previous decoding iteration;
a bottom SISO that, based on the plurality of trellis metrics, calculates a second plurality of extrinsic values for each symbol of the signal according to the corresponding RC;
a de-interleaver, communicatively coupled to the bottom SISO, that de-interleaves the second plurality of extrinsic values;
a second bit metric update functional block that employs the interleaved second plurality of extrinsic values by employing second extrinsic information of the bit calculated in the previous decoding iteration to update a second bit metric of the bit for use in the current decoding iteration thereby generating a second APP (a priori probability) information, such that each respective bit metric of the plurality of bit metrics is updated using extrinsic information corresponding to that respective bit from a previous decoding iteration; and wherein:
each extrinsic value of the first plurality of extrinsic values and the second plurality of extrinsic values corresponds to one individual bit of the plurality of bits of the symbol;
the first APP information is fed back to the bottom SISO;
the second APP information is fed back to the top SISO;
the top SISO and the bottom SISO operate cooperatively to perform at least one iteration of iterative decoding to make soft bit decisions that correspond to the individual bits of the plurality of bits of each symbol of the signal;
a first RC, of the plurality of RCs, includes a first modulation having a first constellation and a first mapping; and
a second RC, of the plurality of RCs, includes a second modulation having a second constellation and a second mapping.

92. The decoder of claim 91, further comprising an output processor that makes hard bit decisions, based on the soft bit decisions, that correspond to best estimates of bit values of the individual bits of the plurality of bits of each symbol of the signal.

93. The decoder of claim 91, wherein:
the decompose symbol metrics to bit metrics functional block calculates a pseudo bit metric for an LSB (Least Significant Bit) of the plurality of bits of at least one symbol of the signal;
the decompose symbol metrics to bit metrics functional block calculates a bit metric for an LSB (Least Significant Bit) of the plurality of bits of at least one symbol of the signal; and
the decompose symbol metrics to bit metrics functional block calculates a bit metric for an MSB (Most Significant Bit) of the plurality of bits of at least one symbol of the signal.

94. The decoder of claim 91, wherein:
the plurality of bit metrics is a plurality of state dependent bit metrics; and
the decompose symbol metrics to bit metrics functional block converts the plurality of state dependent bit metrics to a plurality of state independent bit metrics.

95. The decoder of claim 91, wherein decoder recycles a single SISO to perform the functionality of both the top SISO and the bottom SISO.

96. The decoder of claim 91, wherein decoder employs an interleaver/de-interleaver to perform the functionality of both the interleaver and the de-interleaver.

97. The decoder of claim 91, wherein:
the plurality of trellis metrics are mapped according to an 8 state trellis of a rate 1/2 encoder; and
the rate 1/2 encoder is a convolutional encoder.

98. The decoder of claim 91, wherein:
the method is performed within an HDTV (High Definition Television) set top box receiver.

99. The decoder of claim 91, wherein at least one of the first modulation and the second modulation is at least one of a BPSK (Binary Phase Shift Key) modulation, a QPSK (Quadrature Phase Shift Key) modulation, an 8 PSK (8 Phase Shift Key) modulation, a 16 QAM (Quadrature Amplitude Modulation) modulation, and a 16 APSK (Asymmetric Phase Shift Keying) modulation.

100. The decoder of claim 91, wherein:
the first modulation is a QPSK (Quadrature Phase Shift Key) modulation having a QPSK constellation and the first mapping; and
the second modulation is a QPSK modulation having a QPSK constellation and the second mapping.

101. The decoder of claim 91, wherein:
the decoder is implemented within at least one of a satellite communication system, an HDTV (High Definition Television) communication system, a cellular communication system, a microwave communication system, a point-to-point communication system, and a TTCM (Turbo Trellis Coded Modulation) communication system.

102. The decoder of claim 91, wherein:
based on the plurality of trellis metrics, the top SISO calculates a plurality of forward metrics (alphas) and a plurality of backward metrics (betas) for use in calculating the first plurality of extrinsic values.

103. The decoder of claim 102, wherein:
the top SISO employs min* processing to calculate at least one of the plurality of forward metrics (alphas), the plurality of backward metrics (betas), and the first plurality of extrinsic values.

104. The decoder of claim 91, wherein:
based on the plurality of trellis metrics, the bottom SISO calculates a plurality of forward metrics (alphas) and a plurality of backward metrics (betas) for use in calculating the second plurality of extrinsic values.

105. The decoder of claim 104, wherein:
the bottom SISO employs min* processing to calculate at least one of the plurality of forward metrics (alphas), the plurality of backward metrics (betas), and the second plurality of extrinsic values.

* * * * *

UNITED STATES PATENT AND TRADEMARK OFFICE
CERTIFICATE OF CORRECTION

PATENT NO. : 7,657,822 B2
APPLICATION NO. : 10/429362
DATED : February 2, 2010
INVENTOR(S) : Ba-Zhong Shen, Kelly Brian Cameron and Hau Thien Tran It is certified that error appears in the above-identified patent and that said Letters Patent is hereby corrected as shown below:

On the Title Page, Item (54): The title should appear as follows: "True bit decoding of TTCM (Turbo Trellis Coded Modulation) of variable rates and signal constellations".

In the Specifications:
Column 1, lines 1-4: The title should appear as follows: "True bit decoding of TTCM (Turbo Trellis Coded Modulation) of variable rates and signal constellations".

Column 1, lines 9-50, should appear as follows:
"The present U.S. Utility Patent Application claims priority pursuant to 35 U.S.C. § 119(e) to the following U.S. Provisional Patent Applications that are hereby incorporated herein by reference in their entirety and made part of the present U.S. Utility Patent Application for all purposes:
1. U.S. Provisional Patent Application Serial No. 60/384,698, entitled "Variable code rate and signal constellation turbo trellis coded modulation codec," filed May 31, 2002 (05/31/2002).
2. U.S. Provisional Application Serial No. 60/427,979, "Single stage implementation of min*, max*, min and/or max to perform state metric calculation in SISO decoder," filed November 20, 2002 (11/20/2002).
3. U.S. Provisional Patent Application Serial No. 60/459,132, entitled "True bit level decoding of TTCM (Turbo Trellis Coded Modulation) of variable rates and signal constellations," filed March 31, 2003 (03/31/2003).
    The following U.S. Utility Patent Applications are hereby incorporated herein by reference in their entirety and made part of the present U.S. Utility Patent Application for all purposes:
1. U.S. Utility Application Serial No. 10/264,486, entitled "Variable code rate and signal constellation turbo trellis coded modulation codec," filed October 4, 2002 (10/04/2002), now U.S. patent no. 7,093,187 B2, issued on August 15, 2006 (08/15/2006), which claims priority pursuant to 35 U.S.C. § 119(e) to the following U.S. Provisional Patent Application: U.S. Provisional Patent Application Serial No. 60/384,698, entitled "Variable code rate and signal constellation turbo trellis coded modulation codec," filed May 31, 2002 (05/31/2002).

Signed and Sealed this
Twenty-second Day of February, 2011

David J. Kappos
*Director of the United States Patent and Trademark Office*

CERTIFICATE OF CORRECTION (continued)
U.S. Pat. No. 7,657,822 B2

2. U.S. Utility Application Serial No. 10/335,702, "Single stage implementation of min*, max*, min and/or max to perform state metric calculation in SISO decoder," filed January 2, 2003 (01/02/2003), now U.S. patent no. 7,137,059 B2, issued on November 14, 2006 (11/14/2006), which claims priority pursuant to 35 U.S.C. § 119(e) to the following U.S. Provisional Patent Application: U.S. Provisional Application Serial No. 60/427,979, "Single stage implementation of min*, max*, min and/or max to perform state metric calculation in SISO decoder," filed November 20, 2002 (11/20/2002)."

In the Claims:
Column 48, line 24, in Claim 56: replace "1CM" with --TCM--.